United States Patent
Sinclair et al.

(10) Patent No.: US 9,734,911 B2
(45) Date of Patent: Aug. 15, 2017

(54) METHOD AND SYSTEM FOR ASYNCHRONOUS DIE OPERATIONS IN A NON-VOLATILE MEMORY

(71) Applicants: Alan Welsh Sinclair, Falkirk (GB); Nicholas James Thomas, Dundee (GB); Barry Wright, Edinburgh (GB)

(72) Inventors: Alan Welsh Sinclair, Falkirk (GB); Nicholas James Thomas, Dundee (GB); Barry Wright, Edinburgh (GB)

(73) Assignee: SanDisk Technologies LLC, Plano, TX (US)

( * ) Notice: Subject to any disclaimer, the term of this patent is extended or adjusted under 35 U.S.C. 154(b) by 405 days.

(21) Appl. No.: 13/826,848

(22) Filed: Mar. 14, 2013

(65) Prior Publication Data

US 2014/0185376 A1 Jul. 3, 2014

Related U.S. Application Data

(60) Provisional application No. 61/747,646, filed on Dec. 31, 2012.

(51) Int. Cl.
*G11C 16/10* (2006.01)
*G06F 3/06* (2006.01)
(Continued)

(52) U.S. Cl.
CPC .......... *G11C 16/10* (2013.01); *G06F 3/0613* (2013.01); *G06F 3/0658* (2013.01);
(Continued)

(58) Field of Classification Search
CPC ......... G11C 11/5628; G11C 2211/5641; G06F 3/0613; G06F 3/0658; G06F 3/0688
See application file for complete search history.

(56) References Cited

U.S. PATENT DOCUMENTS 5,535,369 A 7/1996 Wells et al.
5,570,315 A 10/1996 Tanaka et al.
(Continued)

FOREIGN PATENT DOCUMENTS

EP 1 143 455 A2 10/2001
EP 1 389 755 A2 2/2004
(Continued)

OTHER PUBLICATIONS

Korean patent application KR 10-2011-0121719 (English language version), filed Nov. 2011, 24 pages.*
(Continued)

*Primary Examiner* — Yong Choe
*Assistant Examiner* — Glenn Gossage
(74) *Attorney, Agent, or Firm* — Brinks Gilson & Lione

(57) ABSTRACT

A mass storage memory system and method of operation are disclosed. The memory system includes an interface adapted to receive data from a host system, a plurality of memory die and a controller, where the controller is configured to read or write data synchronously across a plurality of die connected to different channels based on a first command, and to read or write data asynchronously and independently in different die in the same channel based on a second command. The controller may program data in a maximum unit of programming for a single memory die. The controller may be a plurality of controllers each configured to select which die of an exclusive subset of die to write data based on characteristics of the die in the subset. The plurality of die may be multi-layer, and multi-partition per layer, flash memory die.

20 Claims, 34 Drawing Sheets

(51) Int. Cl.
*G06F 12/02* (2006.01)
*G11C 11/56* (2006.01)

(52) U.S. Cl.
CPC ........ *G06F 3/0688* (2013.01); *G06F 12/0246* (2013.01); *G11C 11/5628* (2013.01); *G11C 2211/5641* (2013.01)

(56) References Cited

U.S. PATENT DOCUMENTS

| | | | |
|---|---|---|---|
| 5,630,093 | A | 5/1997 | Holzhammer et al. |
| 5,696,917 | A | 12/1997 | Mills et al. |
| 5,774,397 | A | 6/1998 | Endoh et al. |
| 5,860,124 | A | 1/1999 | Matthews et al. |
| 5,869,845 | A | 2/1999 | Vander Wagt et al. |
| 5,930,167 | A | 7/1999 | Lee et al. |
| 5,960,169 | A | 9/1999 | Styczinski |
| 6,026,465 | A * | 2/2000 | Mills et al. ............ 711/103 |
| 6,046,935 | A | 4/2000 | Takeuchi et al. |
| 6,069,827 | A | 5/2000 | Sinclair |
| 6,373,746 | B1 | 4/2002 | Takeuchi et al. |
| 6,456,528 | B1 | 9/2002 | Chen |
| 6,522,580 | B2 | 2/2003 | Chen et al. |
| 6,622,199 | B1 | 9/2003 | Spall et al. |
| 6,715,027 | B2 | 3/2004 | Kim et al. |
| 6,725,321 | B1 | 4/2004 | Sinclair et al. |
| 6,771,536 | B2 | 8/2004 | Li et al. |
| 6,781,877 | B2 | 8/2004 | Cernea et al. |
| 7,154,781 | B2 | 12/2006 | Lakhani et al. |
| 7,336,531 | B2 | 2/2008 | Roohparvar |
| 7,409,489 | B2 | 8/2008 | Sinclair |
| 7,420,867 | B2 | 9/2008 | Brox |
| 7,433,993 | B2 | 10/2008 | Sinclair |
| 7,444,462 | B2 | 10/2008 | Traister et al. |
| 7,552,280 | B1 | 6/2009 | Naamad et al. |
| 7,865,658 | B2 | 1/2011 | Lasser et al. |
| 7,903,459 | B2 | 3/2011 | Yu et al. |
| 7,930,468 | B2 | 4/2011 | Caulkins |
| 7,984,084 | B2 | 7/2011 | Sinclair |
| 7,996,642 | B1 | 8/2011 | Smith |
| 8,095,735 | B2 | 1/2012 | Brewer et al. |
| 8,209,503 | B1 | 6/2012 | Smith |
| 8,228,728 | B1 | 7/2012 | Yang et al. |
| 8,239,617 | B1 | 8/2012 | Linnell |
| 8,412,752 | B2 | 4/2013 | Dodge |
| 8,429,352 | B2 | 4/2013 | Sinclair |
| 8,473,669 | B2 | 6/2013 | Sinclair |
| 8,537,613 | B2 | 9/2013 | Sinclair et al. |
| 8,677,037 | B1 | 3/2014 | Karamcheti et al. |
| 8,689,042 | B1 | 4/2014 | Kanapathippillai et al. |
| 8,706,932 | B1 | 4/2014 | Kanapathippillai et al. |
| 8,850,091 | B1 | 9/2014 | Karamcheti et al. |
| 8,924,661 | B1 | 12/2014 | Shachar et al. |
| 9,093,132 | B2 * | 7/2015 | Kim .................... G11C 7/1063 |
| 2002/0172081 | A1 | 11/2002 | Mukaida et al. |
| 2003/0109093 | A1 | 6/2003 | Harari et al. |
| 2003/0147278 | A1 | 8/2003 | Tanaka et al. |
| 2003/0229753 | A1 | 12/2003 | Hwang |
| 2004/0030847 | A1 | 2/2004 | Tremaine |
| 2004/0073748 | A1 | 4/2004 | Rudelic |
| 2004/0260957 | A1 | 12/2004 | Jeddeloh et al. |
| 2005/0144361 | A1 | 6/2005 | Gonzalez et al. |
| 2005/0144363 | A1 | 6/2005 | Sinclair |
| 2005/0195635 | A1 | 9/2005 | Conley et al. |
| 2005/0278479 | A1 | 12/2005 | Wu et al. |
| 2006/0020744 | A1 | 1/2006 | Sinclair et al. |
| 2006/0031593 | A1 | 2/2006 | Sinclair |
| 2006/0047800 | A1 | 3/2006 | Caveney et al. |
| 2006/0161724 | A1 | 7/2006 | Bennett et al. |
| 2006/0161728 | A1 | 7/2006 | Bennett et al. |
| 2006/0184718 | A1 | 8/2006 | Sinclair et al. |
| 2006/0184719 | A1 | 8/2006 | Sinclair |
| 2006/0184720 | A1 | 8/2006 | Sinclair et al. |
| 2006/0184722 | A1 | 8/2006 | Sinclair |
| 2006/0285397 | A1 | 12/2006 | Nishihara et al. |
| 2007/0016756 | A1 | 1/2007 | Hsieh et al. |
| 2007/0030734 | A1 | 2/2007 | Sinclair et al. |
| 2007/0033323 | A1 | 2/2007 | Gorobets |
| 2007/0033325 | A1 | 2/2007 | Sinclair |
| 2007/0033329 | A1 | 2/2007 | Sinclair et al. |
| 2007/0033330 | A1 | 2/2007 | Sinclair et al. |
| 2007/0033376 | A1 | 2/2007 | Sinclair et al. |
| 2007/0033378 | A1 | 2/2007 | Sinclair et al. |
| 2007/0101096 | A1 | 5/2007 | Gorobets |
| 2007/0136555 | A1 | 6/2007 | Sinclair |
| 2007/0156998 | A1 | 7/2007 | Gorobets |
| 2007/0186032 | A1 | 8/2007 | Sinclair et al. |
| 2007/0186065 | A1 | 8/2007 | Lee et al. |
| 2007/0239928 | A1 | 10/2007 | Gera et al. |
| 2008/0034154 | A1 | 2/2008 | Lee et al. |
| 2008/0067573 | A1 | 3/2008 | Jang et al. |
| 2008/0084739 | A1 | 4/2008 | Chae et al. |
| 2008/0094952 | A1 | 4/2008 | Brondijk et al. |
| 2008/0155175 | A1 | 6/2008 | Sinclair et al. |
| 2008/0155176 | A1 | 6/2008 | Sinclair et al. |
| 2008/0155177 | A1 | 6/2008 | Sinclair et al. |
| 2008/0155178 | A1 | 6/2008 | Sinclair et al. |
| 2008/0155227 | A1 | 6/2008 | Sinclair et al. |
| 2008/0155228 | A1 | 6/2008 | Sinclair et al. |
| 2008/0307158 | A1 | 12/2008 | Sinclair |
| 2008/0307164 | A1 | 12/2008 | Sinclair |
| 2008/0307192 | A1 | 12/2008 | Sinclair et al. |
| 2008/0316815 | A1 | 12/2008 | Lin |
| 2008/0320209 | A1 | 12/2008 | Lee et al. |
| 2009/0132758 | A1 | 5/2009 | Jiang et al. |
| 2009/0157994 | A1 | 6/2009 | Hampel et al. |
| 2009/0164745 | A1 | 6/2009 | Sinclair et al. |
| 2009/0172258 | A1 | 7/2009 | Olbrich et al. |
| 2009/0172263 | A1 | 7/2009 | Olbrich et al. |
| 2009/0182791 | A1 | 7/2009 | Gorobets |
| 2009/0196102 | A1 | 8/2009 | Kim |
| 2009/0210614 | A1 | 8/2009 | Gorobets |
| 2009/0228662 | A1 | 9/2009 | Chang et al. |
| 2009/0248952 | A1 | 10/2009 | Radke et al. |
| 2009/0259799 | A1 | 10/2009 | Wong |
| 2009/0262577 | A1 | 10/2009 | Tanaka |
| 2009/0271562 | A1 | 10/2009 | Sinclair |
| 2009/0300269 | A1 | 12/2009 | Radke et al. |
| 2010/0125695 | A1 * | 5/2010 | Wu et al. .............. 711/103 |
| 2010/0146197 | A1 | 6/2010 | Gorobets |
| 2010/0153631 | A1 | 6/2010 | Moon et al. |
| 2010/0169540 | A1 | 7/2010 | Sinclair |
| 2010/0169588 | A1 * | 7/2010 | Sinclair .............. 711/160 |
| 2010/0172179 | A1 | 7/2010 | Gorobets et al. |
| 2010/0174846 | A1 | 7/2010 | Paley et al. |
| 2010/0205352 | A1 | 8/2010 | Chu et al. |
| 2010/0217926 | A1 | 8/2010 | Sinclair |
| 2010/0223423 | A1 | 9/2010 | Sinclair et al. |
| 2010/0262765 | A1 | 10/2010 | Cheon et al. |
| 2010/0274952 | A1 * | 10/2010 | Lee .................... 711/103 |
| 2011/0022778 | A1 | 1/2011 | Schibilla et al. |
| 2011/0022784 | A1 * | 1/2011 | Yano ............... G06F 12/0246 711/103 |
| 2011/0055455 | A1 | 3/2011 | Post et al. |
| 2011/0107042 | A1 | 5/2011 | Herron |
| 2011/0138100 | A1 * | 6/2011 | Sinclair .................... 711/5 |
| 2011/0145537 | A1 | 6/2011 | Feldman et al. |
| 2011/0149650 | A1 | 6/2011 | Huang et al. |
| 2011/0161621 | A1 | 6/2011 | Sinclair et al. |
| 2011/0219180 | A1 | 9/2011 | Cheon et al. |
| 2011/0252187 | A1 | 10/2011 | Segal et al. |
| 2011/0264843 | A1 | 10/2011 | Haines et al. |
| 2011/0296089 | A1 | 12/2011 | Seol et al. |
| 2012/0005405 | A1 | 1/2012 | Wu et al. |
| 2012/0017038 | A1 | 1/2012 | Gorobets et al. |
| 2012/0030409 | A1 | 2/2012 | Post et al. |
| 2012/0066443 | A1 | 3/2012 | Li et al. |
| 2012/0084489 | A1 | 4/2012 | Gorobets et al. |
| 2012/0221784 | A1 | 8/2012 | Ban |
| 2012/0246391 | A1 | 9/2012 | Meir et al. |
| 2012/0254574 | A1 | 10/2012 | Sinclair et al. |
| 2012/0260028 | A1 * | 10/2012 | Lee et al. .............. 711/103 |
| 2012/0297121 | A1 * | 11/2012 | Gorobets et al. ......... 711/103 |
| 2012/0297122 | A1 | 11/2012 | Gorobets et al. |
| 2012/0311237 | A1 | 12/2012 | Park |

(56) References Cited

U.S. PATENT DOCUMENTS

| | | | |
|---|---|---|---|
| 2013/0019051 A1* | 1/2013 | Somanache et al. | 711/103 |
| 2013/0019058 A1 | 1/2013 | Caraccio et al. | |
| 2013/0024641 A1 | 1/2013 | Talagala et al. | |
| 2013/0042067 A1 | 2/2013 | Thomas | |
| 2013/0128675 A1* | 5/2013 | Kim | G11C 7/10 365/189.05 |
| 2013/0138912 A1 | 5/2013 | Bux et al. | |
| 2013/0159601 A1* | 6/2013 | Lassa et al. | 711/103 |
| 2013/0173844 A1 | 7/2013 | Chen et al. | |
| 2013/0173874 A1 | 7/2013 | Sprouse et al. | |
| 2013/0219146 A1 | 8/2013 | Confalonieri | |
| 2014/0006898 A1 | 1/2014 | Sharon et al. | |
| 2014/0068152 A1 | 3/2014 | Sinclair | |
| 2014/0143483 A1 | 5/2014 | Meir et al. | |
| 2014/0189205 A1 | 7/2014 | Sinclair et al. | |
| 2014/0189206 A1 | 7/2014 | Sinclair et al. | |
| 2014/0189207 A1 | 7/2014 | Sinclair et al. | |
| 2014/0189208 A1 | 7/2014 | Sinclair et al. | |
| 2014/0189209 A1 | 7/2014 | Sinclair et al. | |
| 2014/0189210 A1 | 7/2014 | Sinclair et al. | |
| 2014/0223087 A1 | 8/2014 | Caraccio et al. | |
| 2014/0237169 A1 | 8/2014 | Manning | |
| 2014/0281326 A1* | 9/2014 | Van Huben | G11C 7/225 711/167 |

FOREIGN PATENT DOCUMENTS

| | | |
|---|---|---|
| EP | 1 693 759 A2 | 8/2006 |
| EP | 2 042 995 A1 | 4/2009 |
| WO | WO 2007019155 | 2/2007 |
| WO | WO 2007019217 | 2/2007 |
| WO | 2009/107426 A1 | 9/2009 |
| WO | 2012/158521 A1 | 11/2012 |
| WO | 2012/161659 A1 | 11/2012 |

OTHER PUBLICATIONS

Invitation to Pay Additional Fees and Partial International Search Report issued in international application No. PCT/US2013/077493, dated Apr. 22, 2014 (5 pages).

Notice of Allowance issued in U.S. Appl. No. 13/827,204, dated Apr. 15, 2014 (9 pages).

International Search Report and Written Opinion issued in international application No. PCT/US2013/077493, mailed Jul. 21, 2014 (25 pages).

Chang et al, "An Efficient Management Scheme for Large-Scale Flash Memory Storage Systems", dated Mar. 14-17, 2004, 7 pages, SAC '04.

U.S. Appl. No. 13/826,738 entitled, "Method and System for Managing Program Cycles in a Multi-Layer Memory", filed Mar. 14, 2013, 103 pages.

U.S. Appl. No. 13/826,944 entitled, "Method and System for Managing Block Reclaim Operations in a Multi-Layer Memory", filed Mar. 14, 2013, 103 pages.

U.S. Appl. No. 13/827,038 entitled, "Method and System for Managing Background Operations in a Multi-Layer Memory", filed Mar. 14, 2013, 101 pages.

U.S. Appl. No. 13/827,204 entitled, "Method and System for Program Scheduling in a Multi-Layer Memory", filed Mar. 14, 2013, 104 pages.

U.S. Appl. No. 13/827,351 entitled, "Multi-Layer System Having Multiple Partitions in a Layer", filed Mar. 14, 2013, 101 pages.

U.S. Appl. No. 13/827,499 entitled, "Memory System Having an Unequal Number of Memory Die", filed Mar. 14, 2013, 101 pages.

Hong et al., NAND Flash-based Disk Cache Using SLC/MLC Combined Flash Memory, 2010 *International Workshop on Storage Network Architecture and Parallel I/Os*, dated May 3, 2010, 10 pages.

International Search Report and Written Opinion issued in International Application No. PCT/US2012/029661, mailed on Oct. 29, 2012, 28 pages.

Preliminary Report on Patentability issued in International Application No. PCT/US2012/029661 dated Oct. 1, 2013, 20 pages.

Shu, F., "Notification of Deleted Data Proposal for ATA8-ACS2", Microsoft Corporation, dated Apr. 21, 2007, printed from the Internet at http://www.t13.org/documents/UploadedDocuments//docs2007/e0715r0-Notification_for_Deleted_Data_Proposal_for_ATA-ACS2.doc on Feb. 22, 2008, 4 pages.

Shu, F., "Solid State Drive Identify Proposal for ATA8-ACS", Microsoft Corporation, dated Apr. 21, 2007, printed from the Internet at http://www.t13.org/documents/UploadedDocuments//docs2007/e07153r0-Solid_State_Drive_Identify_Proposal.doc on Feb. 22, 2008, 4 pages.

Office Action in related application for U.S. Appl. No. 13/826,944 mailed Sep. 9, 2015, 23 pgs.

Office Action in related application for U.S. Appl. No. 13/827,038 mailed Sep. 9, 2015, 22 pgs.

Office Action in related application for U.S. Appl. No. 13/827,351 mailed Jun. 2, 2015, 39 pgs.

Office Action for co-pending U.S. Appl. No. 13/827,038 mailed Jun. 29, 2016.

Notice of Allowance for U.S. Appl. No. 13/826,738 mailed Jan. 8, 2016.

European Search Report for counterpart European Application No. EP 16 17 6480 dated Apr. 26, 2017, 9 pages.

* cited by examiner

| Host LBA (die-pages) | Star ID | Star_Offset (FBA) |
|---|---|---|
| 0 | 0 | 0 |
| 1 | 1 | 0 |
| 2 | 2 | 0 |
| 3 | 3 | 0 |
| 4 | 0 | 1 |
| 5 | 1 | 1 |
| 6 | 2 | 1 |
| 7 | 3 | 1 |
| 8 | 0 | 2 |
| 9 | 1 | 2 |
| 10 | 2 | 2 |
| 11 | 3 | 2 |
| 12 | 0 | 3 |
| 13 | 1 | 3 |
| 14 | 2 | 3 |
| 15 | 3 | 3 |
| 16 | 0 | 4 |
| 17 | 0 | 5 |
| 18 | 1 | 4 |
| 19 | 2 | 4 |
| 20 | 3 | 4 |
| 21 | 0 | 6 |
| 22 | 1 | 5 |
| 23 | 2 | 5 |
| 24 | 3 | 5 |
| 25 | 0 | 7 |
| 26 | 1 | 6 |
| 27 | 2 | 6 |
| 28 | 3 | 6 |
| 29 | 0 | 8 |
| 30 | 1 | 7 |
| 31 | 2 | 7 |
| 32 | 3 | 7 |
| 33 | 0 | 9 |

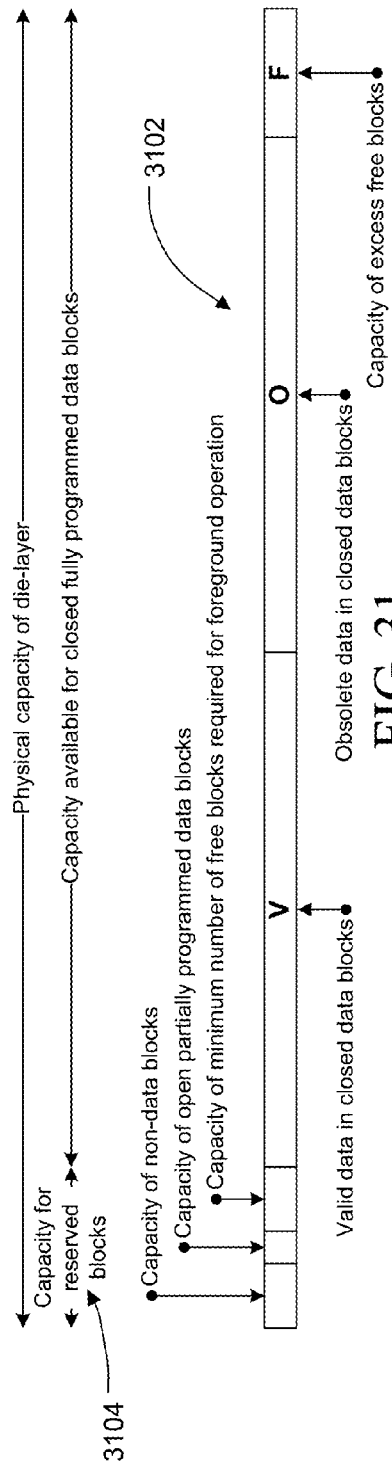
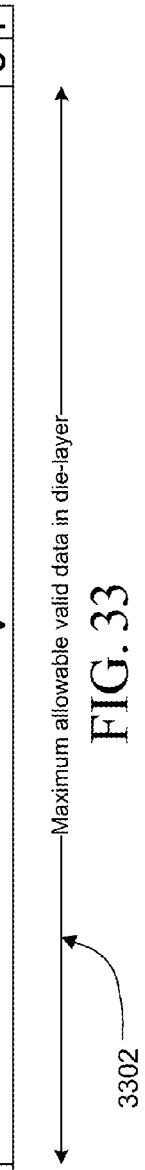
FIG. 31
FIG. 32
FIG. 33

METHOD AND SYSTEM FOR ASYNCHRONOUS DIE OPERATIONS IN A NON-VOLATILE MEMORY

CROSS-REFERENCE TO RELATED APPLICATIONS

This application claims the benefit of U.S. Provisional Patent Appl. No. 61/747,646, filed Dec. 31, 2012, the entirety of which is hereby incorporated herein by reference.

BACKGROUND

Non-volatile memory systems, such as flash memory, have been widely adopted for use in consumer products. Flash memory may be found in different forms, for example in the form of a portable memory card that can be carried between host devices or as a solid state disk (SSD) embedded in a host device. Two general memory cell architectures found in flash memory include NOR and NAND. In a typical NOR architecture, memory cells are connected between adjacent bit line source and drain diffusions that extend in a column direction with control gates connected to word lines extending along rows of cells. A memory cell includes at least one storage element positioned over at least a portion of the cell channel region between the source and drain. A programmed level of charge on the storage elements thus controls an operating characteristic of the cells, which can then be read by applying appropriate voltages to the addressed memory cells.

A typical NAND architecture utilizes strings of more than two series-connected memory cells, such as 16 or 32, connected along with one or more select transistors between individual bit lines and a reference potential to form columns of cells. Word lines extend across cells within many of these columns. An individual cell within a column is read and verified during programming by causing the remaining cells in the string to be turned on so that the current flowing through a string is dependent upon the level of charge stored in the addressed cell.

Flash memory generally provides highest performance when the number of data bits per cell is lowest, such as binary flash, also known as single level cell (SLC) flash, that stores 1 bit per cell. Flash memory that is configured to store more than one bit per cell, known as multi-level cell (MLC) flash, can store 2 or more bits of information per cell. While SLC flash memory is generally known for having better read and write performance (e.g., speed and endurance) than MLC flash, MLC flash provides more storage capacity and is generally less expensive to produce. The endurance and performance of MLC flash tends to decrease as the number of bits per cell of a given MLC configuration increases. There are continuing challenges in obtaining a desired balance of performance, capacity and cost in the design of flash memory devices using these types of flash memory cells.

SUMMARY

In order to address the challenges noted above and provide storage flexibility in a SSD, a memory and methods of memory management are provided.

According to one aspect, a mass storage memory system includes an interface adapted to receive data from a host system, a plurality of flash memory die and a controller in communication with the interface and the plurality of flash memory die. The controller is configured to, in response to receiving a first request from the host system, read or write data fully in parallel in the plurality of flash memory die. The controller is further configured to, in response to a second request from the host, read or write data independently and asynchronously from concurrent operations in each of the plurality of flash memory die. In different implementations, the controller may be configured to manage data in an amount equal to a maximum unit of programming for an individual one of the plurality of flash memory die. In other implementations, the controller may be a plurality of controllers, where the plurality of die are connected in groups to a respective one of a plurality of controller channels and each of the plurality of controllers is only in communication with a group of the plurality of die on a respective single one of the plurality of control channels.

The system may include flash memory die having a plurality of layers, where each of a plurality of layers has a different bit-per-cell data capacity and a plurality of memory blocks. In one implementation, each of the plurality of flash memory layers comprises a plurality of partitions, and each programmed block of the plurality of memory blocks in a layer is exclusively classified as being in a respective one of the plurality of partitions in the flash memory layer. In alternative implementations, where each of a plurality of controllers exclusively manages a portion of the flash memory die associated with a respective one of a plurality of different control channels, the controllers may independently select a die connected to its respective control channel within which to write received data based on a criteria independent of a host LBA address of the received data. The die selection criteria may be a die having a shortest pending data write queue where, for die having multiple layers and multiple partitions per layer, the selection may be of the die having the shortest queue for a type of data associated with a particular partition in a particular layer.

BRIEF DESCRIPTION OF THE DRAWINGS

FIG. 31 is a diagram of example data capacity distribution in a die layer of a multi-layer memory.

FIG. 32 is a diagram of capacity distribution after sustained background maintenance operations in the die layer of FIG. 31.

FIG. 33 is a diagram of a die layer at maximum allowable data capacity according to one embodiment.

DETAILED DESCRIPTION

Figure 1:
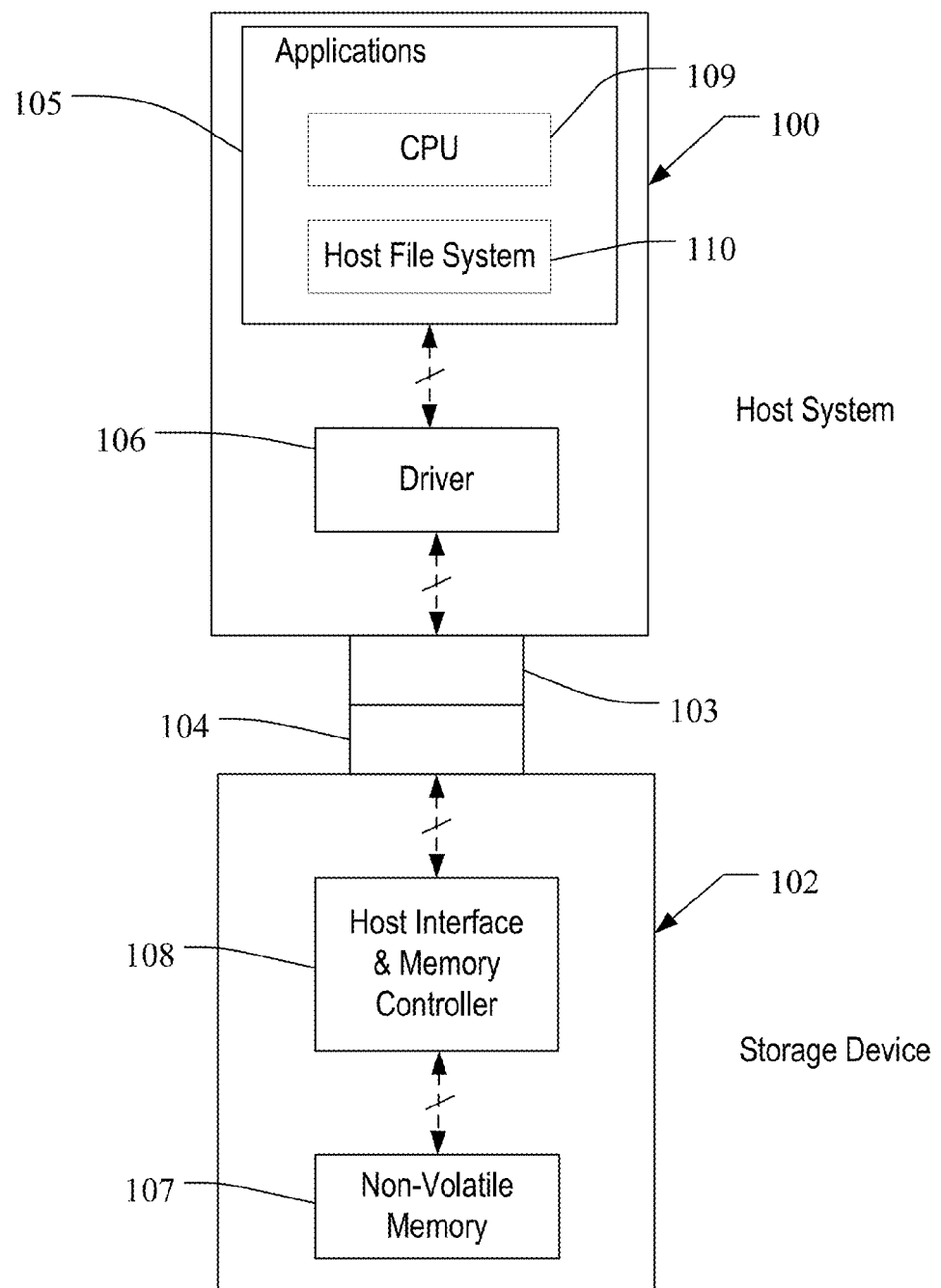
FIG. 1 is a block diagram of a system including a host and a storage device that may implement aspects of the invention.

A system suitable for use in implementing aspects of the invention is shown in FIG. 1. A host system 100 controls data stored into and retrieved from a physical storage device 102. The storage device 102 may be a flash device that is embedded in the host, such as a solid state disk (SSD) drive, an external storage device separate from the host, or a memory card or other removable flash drive that is removably connected to the host 100, and may communicate through a mechanical and electrical connector such as connectors 103, 104, or wirelessly, using any of a number of available wired or wireless interfaces. The host 100 may be a data handling device, such as a tablet computer, mobile phone, personal digital assistant, home network router, a personal computer (PC) or any other type of data handling device.

The host system 100 may be viewed as having two major parts, insofar as the storage device 102 is concerned, made up of a combination of circuitry and software. They are an applications portion 105 and a driver portion 106 that interfaces with the storage device 102. In a PC, for example, the applications portion 105 can include a processor (also referred to as a CPU or central processing unit) 109 running word processing, graphics, control or other popular application software, as well as the host file system 110 for managing data on the host 100. In a camera, cellular telephone or other host system that is primarily dedicated to performing a single set of functions, the applications portion 105 includes the software that operates the camera to take and store pictures, the cellular telephone to make and receive calls, and the like.

The storage device 102 contains non-volatile memory 107. The non-volatile memory 107 may be configured as single level cell (SLC) type of flash memory and/or a multi-level cell (MLC) type flash memory. The storage device 102 also includes a host interface and memory controller 108 that may include a processor, instructions for operating the processor and a logical block to physical block translation tables.

Figure 2:
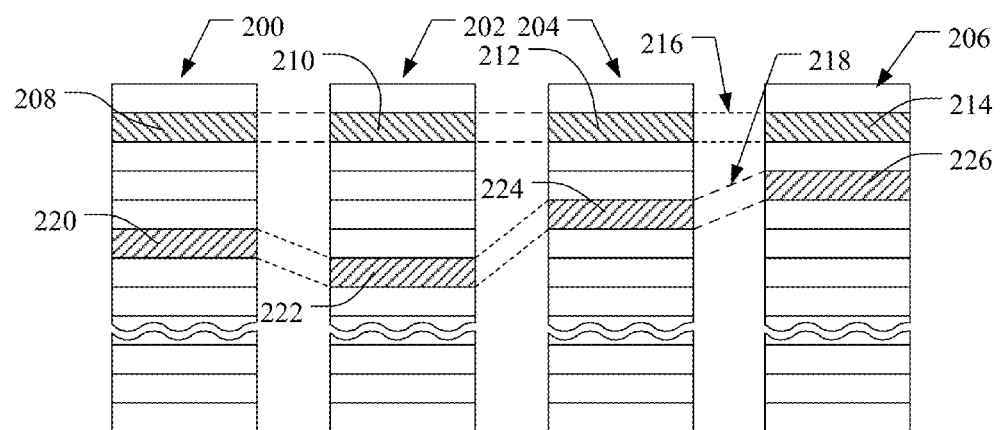
FIG. 2 illustrates an example physical memory organization of the storage device in the system of FIG. 1.

The non-volatile flash memory may be arranged in blocks of memory cells. A block of memory cells is the unit of erase, i.e., the smallest number of memory cells that are physically erasable together. For increased parallelism, however, the blocks may be operated in larger metablock units. One block from each of at least two planes of memory cells may be logically linked together to form a metablock. Referring to FIG. 2, a conceptual illustration of a representative flash memory cell array is shown. Four planes or sub-arrays 200, 202, 204 and 206 of memory cells may be on a single integrated memory cell chip, on two chips (two of the planes on each chip) or on four separate chips. The specific arrangement is not important to the discussion below and other numbers of planes may exist in a system. The planes are individually divided into blocks of memory cells shown in FIG. 2 by rectangles, such as blocks 208, 210, 212 and 214, located in respective planes 200, 202, 204 and 206. There may be dozens or hundreds of blocks in each plane. Blocks may be logically linked together to form a metablock that may be erased as a single unit. For example, blocks 208, 210, 212 and 214 may form a first metablock 216. The blocks used to form a metablock need not be restricted to the same relative locations within their respective planes, as is shown in the second metablock 218 made up of blocks 220, 222, 224 and 226.

Figure 3:
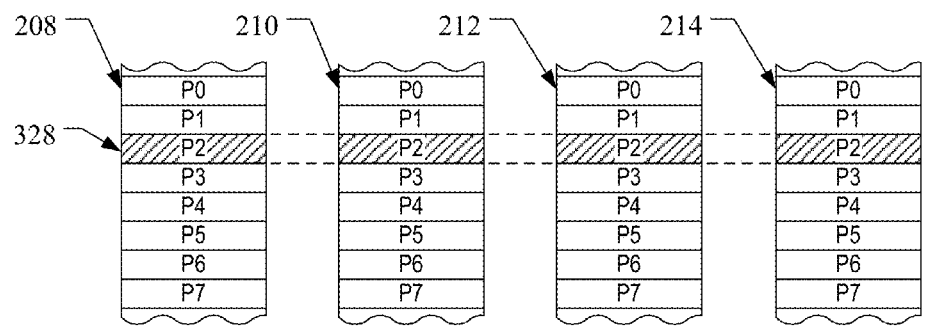
FIG. 3 shows an expanded view of a portion of the physical memory of FIG. 2.

The individual blocks are in turn divided for operational purposes into pages of memory cells, as illustrated in FIG. 3. The memory cells of each of blocks 208, 210, 212, and 214, for example, are each divided into eight pages P0-P7. Alternately, there may be 16, 32 or more pages of memory cells within each block. A page is the unit of data programming within a block, containing the minimum amount of data that are programmed at one time. The minimum unit of data that can be read at one time may be less than a page. A metapage 328 is illustrated in FIG. 3 as formed of one physical page for each of the four blocks 208, 210, 212 and 214. The metapage 328 includes the page P2 in each of the four blocks but the pages of a metapage need not necessarily have the same relative position within each of the blocks. A metapage is the maximum unit of programming. The blocks disclosed in FIGS. 2-3 are referred to herein as physical blocks because they relate to groups of physical memory cells as discussed above. As used herein, a logical block is a virtual unit of address space defined to have the same size as a physical block. Each logical block includes a range of logical block addresses (LBAs) that are associated with data received from a host 100. The LBAs are then mapped to one or more physical blocks in the storage device 102 where the data is physically stored.

Figure 4A:
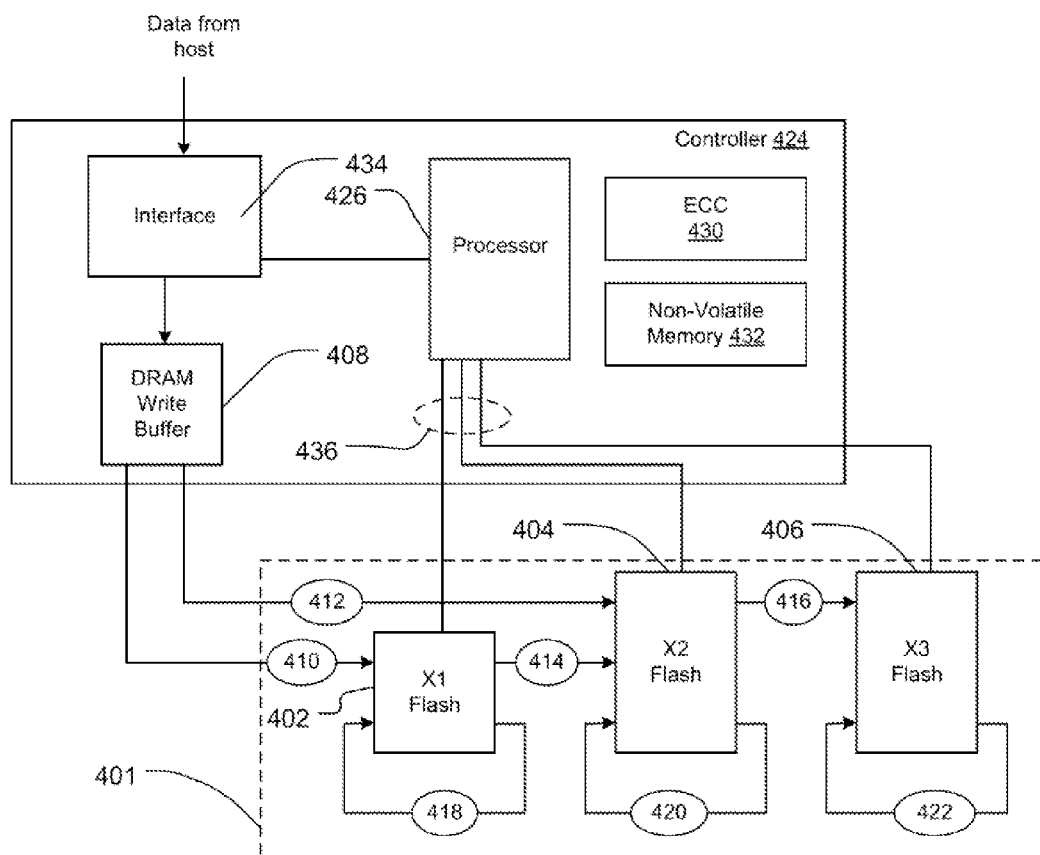
FIG. 4A illustrates a multi-layer memory organization of the storage device of FIG. 1 according to one embodiment.

Referring now to FIG. 4A, one embodiment of the storage device 102 of FIG. 1 is shown having a non-volatile memory 401 that may include three layers of flash memory cells 402, 404, 406, each layer having a different bit per cell capacity. As shown, a first flash memory layer 402 may be configured as binary flash having a single bit per cell capacity. The first flash memory layer is also referred to herein as X1 flash. A second flash memory layer 404 may be configured as MLC flash, for example with a two bit per cell capacity, also referred to herein as X2 flash. A third flash memory layer 406 may also be configured as MLC flash, but having a greater bit per cell capacity than the second flash memory layer 404. In this example the third flash memory layer is illustrated as three bit per cell MLC flash, also referred to herein as X3 flash.

Figure 4B:
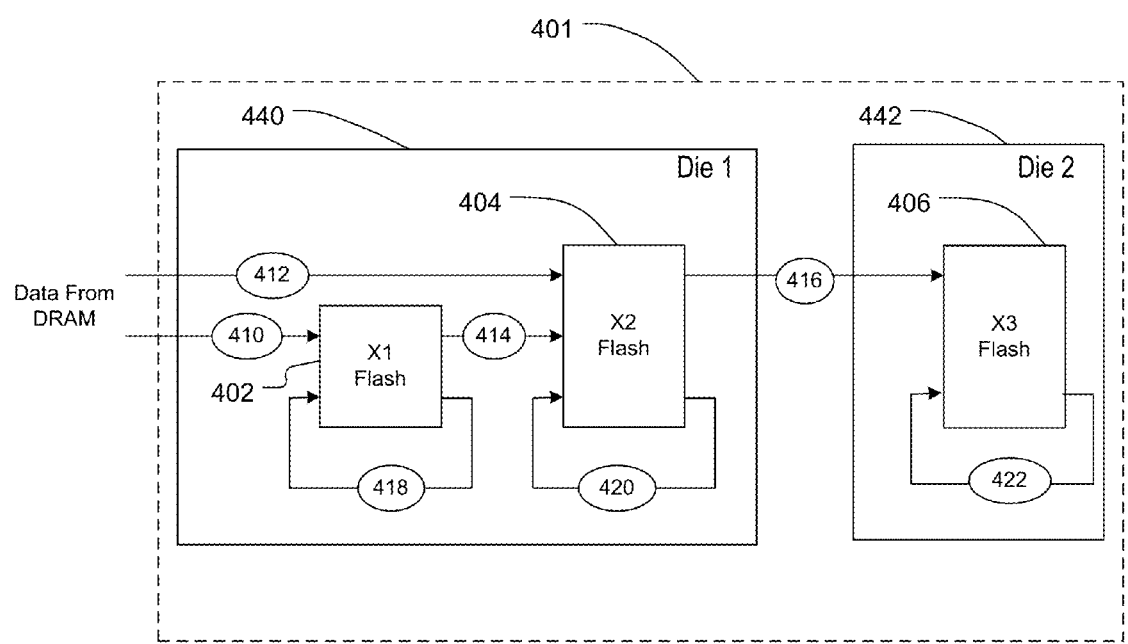
FIG. 4B illustrates an alternative physical arrangement of the multi-layer memory of FIG. 4A.

The different flash layers 402, 404, 406 may all be disposed on the same physical die, each layer may be fabricated on respective separate die, or the layers may be fabricated on a combination of single flash layer die and combined flash layer die. Although specific bit per cell configurations of one, two and three bits are illustrated, other combinations are contemplated where the first flash memory layer has a lower bit per cell configuration than the second flash memory layer and the second flash memory layer, in turn, has a lower bit per cell configuration than the third flash memory layer. FIG. 4B illustrates the non-volatile memory 401 of FIG. 4A where the first and second flash memory layers 402, 404 are located on one die 440 and the third flash memory layer 406 is located on a separate die 442. Also, although three layers are illustrated in FIGS. 4A and 4B, a greater number of layers may be implemented in other embodiments.

Referring again to FIG. 4A, a dynamic random access memory (DRAM) write buffer 408 of the controller 424 receives data from the host 100 over an interface 434, such as a Serial Advanced Technology Attachment (also known as a Serial ATA or SATA) interface. The DRAM write buffer 408, under direction from the processor 426 of the controller, directs data received from the host at the interface 434 to the multi-layer non-volatile memory 401 in the storage device. The DRAM write buffer 408 in the storage device is in communication with the first and second flash memory layers 402, 404. Also, the first flash memory layer 402 is in communication with the second flash memory layer 404 and the second flash memory layer 404 is in communication with the third flash memory layer 406.

The controller 424 may be implemented in a single integrated circuit chip and may communicate with the different layers 402, 404, 406 in the non-volatile memory 401 over one or more command channels 436. The controller may have its own internal bus that links non-volatile memory 432 in the controller 424 containing code to initialize ("boot") the system, DRAM write buffer 408, interface 434, and circuits 430 that calculate and check an error correction code (ECC) for data passing through the controller between the multi-layer flash memory 401 and the host. Controller executable code for implementing memory management instructions such as described herein may be stored in the multi-layer flash memory 401, for example in the first flash memory layer 402. Additional details on versions of a multi-layer memory device may be found in U.S. patent application Ser. No. 13/077,487, filed Mar. 31, 2011, and published as U.S. Patent Appl. Pub. No. 2012/0254574, now U.S. Pat. No. 8,537,613, wherein the entirety of the aforementioned application is incorporated herein by reference.

Figure 5:
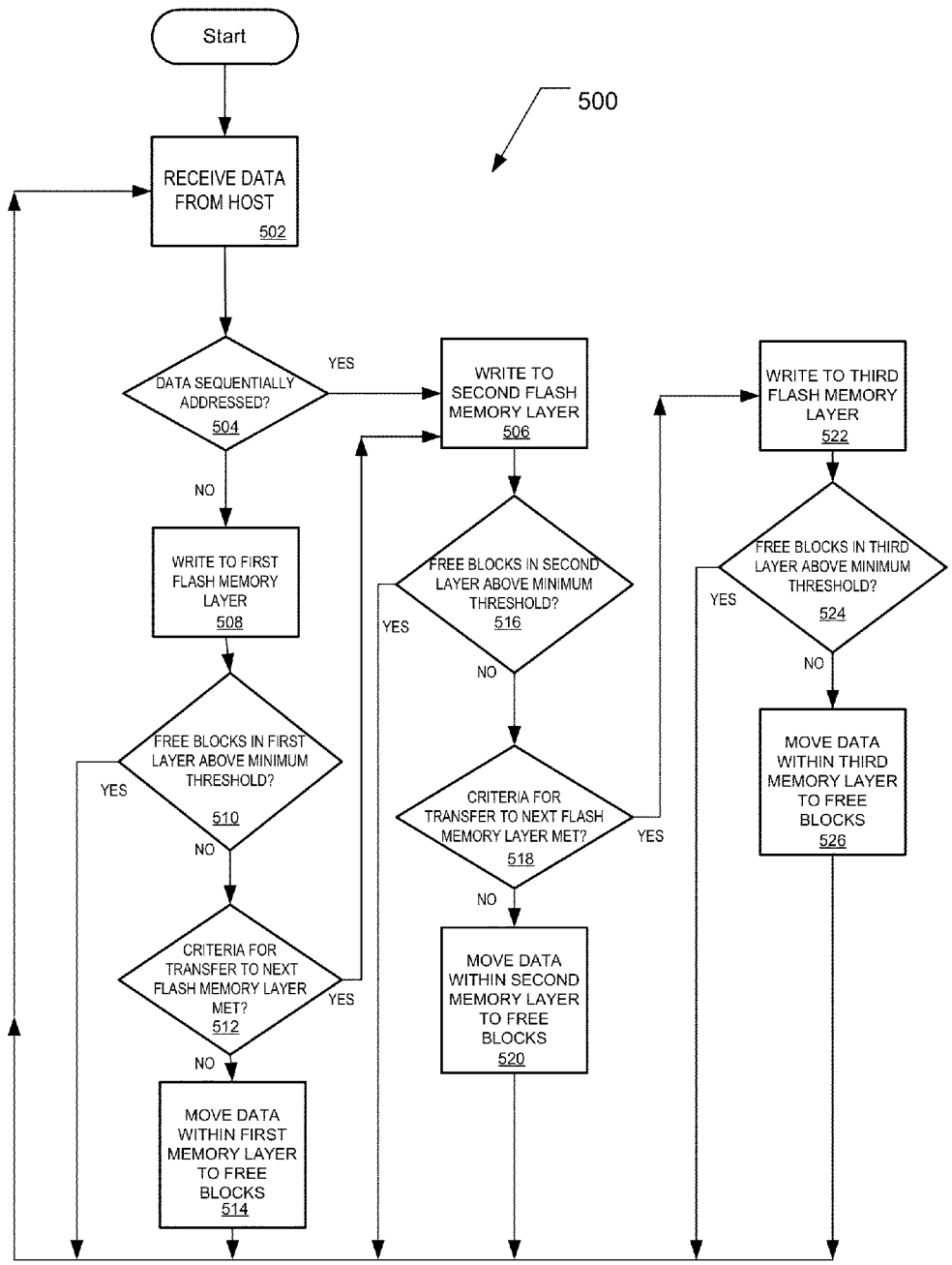
FIG. 5 is a flow diagram illustrating a method for moving data into and/or between layers of a multi-layer memory.

Referring to FIG. 5, an exemplary method 500 implemented by the controller of the storage device for moving data into and/or between the flash layers is disclosed. In one implementation, when data is received from a host write (at 502), the controller selects a memory layer to receive data from the host. The selection may be based on whether the data from the host that is received at the DRAM write buffer from the interface, such as a SATA interface, is sequential or non-sequential (at 504). For example, if the data received is sequentially addressed with host LBA addresses, the controller may direct the data from the DRAM write buffer directly to the second flash memory layer to be written (at 506). In contrast, if the data is random or non-sequentially addressed data, that data may be directed from the DRAM write buffer straight to the first flash memory layer to be written (at 508). In one implementation, data received at any one time from the host is considered to be sequential if the host LBA addresses of the data received are sequential for an amount of data sufficient to fill a complete metapage of a metablock in the multi-layer memory.

In each of the flash memory layers, the controller of the storage device monitors flash memory layer transfer criteria. For example, the flash memory layer transfer criteria may be whether there are enough free blocks left in the flash memory layer and a total amount of valid data contained in the flash memory layer. Once the controller determines that the number of free blocks is less than a minimum threshold for the flash memory layer, the controller next determines whether the amount of valid data in the flash memory layer is above a transfer threshold. When the number of free blocks in a flash memory layer is below the minimum threshold, and the total amount of valid data in that flash memory layer reaches a threshold amount, the controller may cause data from that flash memory layer to be transferred to the next flash memory layer. Thus, if a criteria for transfer to a next flash memory layer is satisfied in the first flash memory layer, a block of previously programmed data is selected by the controller from which to copy data into the second flash memory layer in order to free up the space in the first flash memory layer (at 510, 512, 506). Similarly, blocks in the second flash memory layer may have data transferred into the third flash memory layer to free up blocks in the second flash memory layer upon the second flash memory layer meeting its criteria for transfer to the next flash layer (at 516, 518, 522).

The criteria for determining when to transfer data from a source memory layer to a destination layer, which may include having less than a minimum number of free blocks and a threshold amount of valid data, may be the same or different for each layer. The last layer, in this example the third flash memory layer, would not have a next higher capacity MLC layer to send data to and would therefore not have an assigned transfer criteria.

In one example, the transfer criteria threshold for the first and second flash memory layers may be identifying that the layer currently contains at least a predetermined percentage of valid data, such as 90%. In another embodiment, the transfer criteria may be both that there is currently only a threshold number of free blocks in the layer and that the layer contain at least a predetermined percentage of valid data before a block in that layer may be selected for having its data transferred to the next memory layer. The threshold number of free blocks may be a minimum number such as one or more free blocks. The data selected for relocation from the source to the next flash memory layer is preferably from the block having the least recently programmed, or "coldest" host data. The controller may select this block based on order of programming information maintained for each previously programmed block in the layer in question.

Illustrated in one implementation, all received host data may be initially sent to the first flash memory layer before being moved within the first flash memory layer, or to a subsequent layer, as set forth in greater detail below. In another implementation, data received from the host is directed from the DRAM write buffer 408 to the first flash memory layer 402 when the received data is in random LBA order (at line 410)(FIGS. 4A and 4B), or from the DRAM write buffer 408 directly to the second flash memory layer, bypassing the first flash memory layer, when the received data is in sequential LBA order (at line 412). The controller may progressively move data from the first flash memory layer 402 to the second flash memory layer 404 (at line 414) and from the second flash memory layer to the third flash memory layer (at 416) at appropriate times. Also, garbage collection to create new free blocks within each flash memory layer is preferably performed such that data is recycled within the flash memory layer (at lines 418, 420 and 422).

In order to implement the above method and structure described, the controller may maintain a linked list of data blocks within each flash memory layer to record the order in which blocks were programmed in that layer. Additionally, the controller may implement an address translation algorithm referred to as storage address re-mapping (STAR) within each of the layers to further enhance the efficiency of data transfer and memory usage.

Although any of a number of known memory management techniques may be used to implement the multi-layer memory system described herein, a controller configured to utilize STAR techniques is described herein. One advantage of STAR is the ability to increase performance of memory systems in random write applications, which are characterized by the need to write short bursts of data to unrelated areas in the logical block address (LBA) address space of a device, that may be experienced in solid state disk (SSD) applications in personal computers. In one implementation of the STAR technique, host data is mapped from a first logical address assigned by the host to blocks of contiguous logical addresses in a second logical address space. As data associated with fully programmed blocks of addresses is made obsolete, a data relocation procedure is initiated where the controller selects a previously fully programmed block in a layer having the least amount of valid data, or having less than a threshold amount of valid data, and relocates the valid data in those blocks to free up those blocks for use in writing more data. The relocated data is contiguously written to a relocation block in the same memory layer in the order it occurred in the source block needing data relocation regardless of the logical address assigned by the host. In this manner, overhead may be reduced by not purposely consolidating logical address runs assigned by the host (as in typical garbage collection). A storage address table (SAT) is used to track the mapping between the logical address assigned by the host and the second logical address and subsequent changes in the mapping due to subsequent relocation in the memory layer.

Concurrently with accepting data from the host, or transferring data from a first layer to a next higher bit per cell capacity layer, the controller reclaims blocks by copying valid data from previously programmed blocks having both valid and obsolete data and then recycling the blocks from which all the valid data was copied. This block reclaiming procedure may be in the form of a standard garbage collection technique where groups of data are kept together and consolidated as new data in the same address run is received, or may be a relocation procedure, as further discussed below, where data is not consolidated into the same address groupings. The garbage collection or relocation procedure is preferably implemented by the controller independently in each of the flash memory layers. The valid data copy process, whether garbage collection or relocation, is implemented within each layer such that data moved in the process is preferably maintained in the same flash memory layer. As shown in FIG. 5, the controller checks to see if a sufficient number of free blocks exist in the first layer and, if not, performs copy operations on blocks of data within the first layer to consolidate valid data and create additional free blocks (at 510, 514). This data copy process is independently executed in the second and third layers as well (at 516, 520, 524, 526).

The above-noted method preferentially relocates data within the same flash memory layer and only moves data to a subsequent layer if the current layer is almost full of valid data. Also, by moving data between layers that comes from the least recently programmed block in a source layer, data tends to be filtered from the first flash memory layer to the third flash memory layer such that "hot" data tends to reside in the first flash memory layer, less actively updated data tends to reside in the second flash memory layer, and the "cold" data mainly resides in the third and final flash memory layer. Data is considered "hot" if it is data that has very recently been updated, as it may be more likely that that data is in active use and will be updated again in a short period of time.

Figure 6:
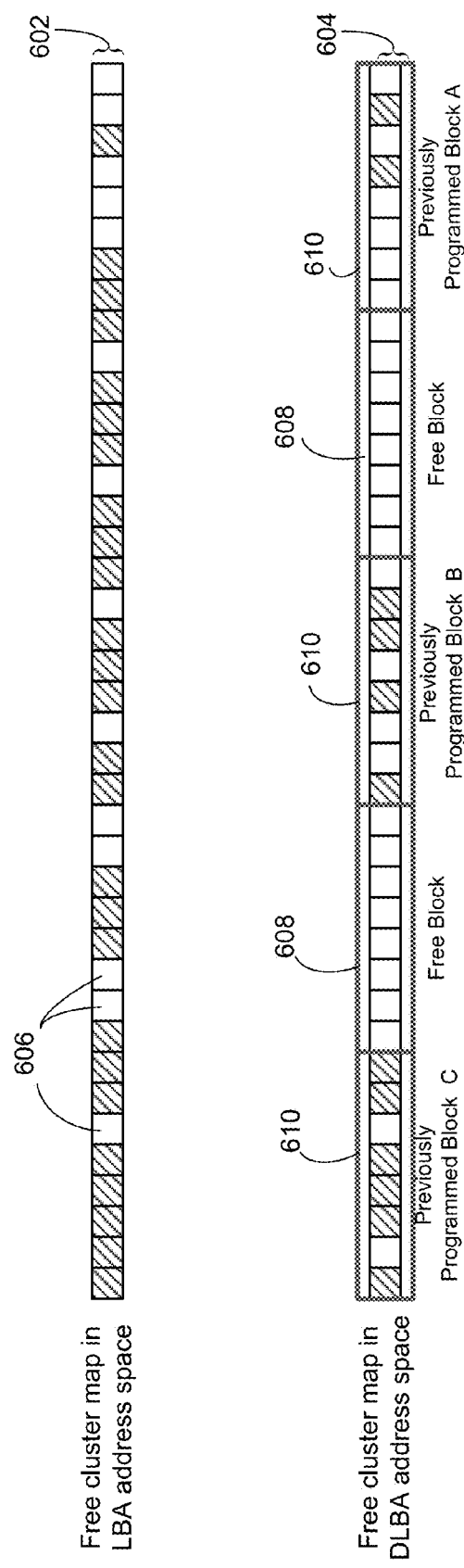
FIG. 6 is an example of LBA address space and an associated DLBA address space that may be utilized in the system of FIG. 1.

Referring to FIGS. 6-9, an example of the storage address remapping (STAR) address translation algorithm is illustrated. A hypothetical section of the host free cluster map in LBA address space 602 and the free cluster map in the second logical address space, referred to herein as device logical address space or DLBA address space 604, at a given time may be represented as shown in FIG. 6. In the LBA address space 602, free clusters 606 are dispersed at essentially random locations. In the DLBA address space 604, two free blocks 608 are available and there are three previously programmed blocks 610 having differing numbers of obsolete (free) clusters 606.

Figure 7:
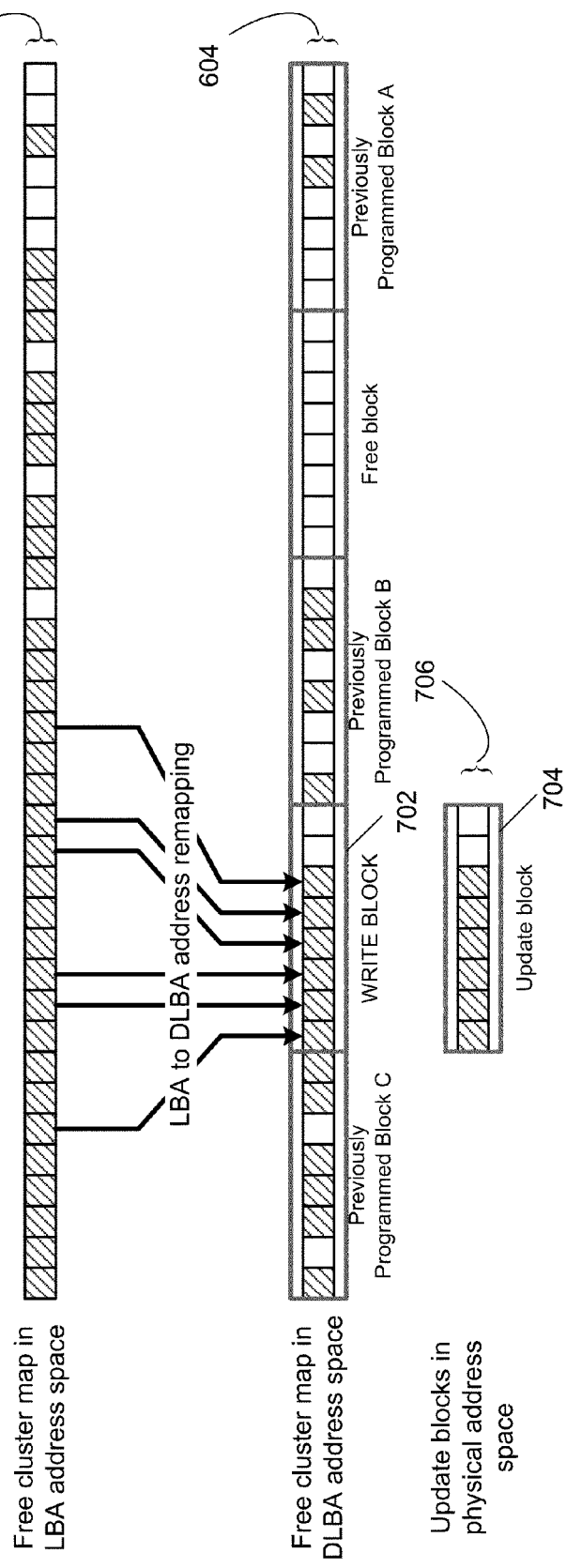
FIG. 7 illustrates an example of LBA to DLBA mapping for data received from a host.

When the host next has data to write to the storage device, it allocates LBA address space 602 wherever it is available. FIG. 7 shows how the storage address re-mapping algorithm allocates one of the available free blocks to be the write block 702, and how each LBA address is mapped to a sequential cluster in the DLBA space available in the write block 702. The write block 702 in DLBA space is written to in the order the LBA addresses are written, regardless of the LBA address position. In this example it is assumed that the time order in which the host used free LBA clusters is the same as the address order for ease of illustration, however the controller implementing the storage address re-mapping algorithm would assign DLBA addresses in the write block 702 in the time order LBA addresses are used, regardless of the LBA address number order. Data is written in a write block in one or more DLBA runs. A DLBA run is a set of contiguous DLBA addresses that are mapped to contiguous LBA addresses in the same LBA run. A DLBA run must be terminated at a block boundary in DLBA address space 604. When a write block 702 becomes filled, a free block 608 is allocated as the next write block 702.

DLBA blocks are aligned with blocks 704 in physical address space 706 of the flash memory, and so the DLBA block size and physical address block size are the same. The arrangement of addresses in the DLBA write block 702 are also then the same as the arrangement of the corresponding update block in physical address space. Due to this correspondence, no separate data consolidation, commonly referred to as garbage collection, is ever needed in the physical update block.

In common garbage collection operations, a block of logical addresses is generally always reassembled to maintain a specific range of LBA addresses in the logical block, which is also reflected in the physical block. More specifically, when a memory system utilizing common garbage collection operations receives an updated sector of information corresponding to a sector in particular physical block, the memory system will allocate an update block in physical memory to receive the updated sector or sectors and then consolidate all of the remaining valid data from the original physical block into the remainder of the update block. In this manner, standard garbage collection will perpetuate blocks of data for a specific LBA address range so that data corresponding to the specific address range will always be consolidated into a common physical block. The relocation operation discussed in more detail below does not require consolidation of data in the same address range. Instead, the relocation operation performs address re-mapping to create new blocks of data that may be a collection of data from various physical blocks, where a particular LBA address range of the data is not intentionally consolidated.

Figure 8:
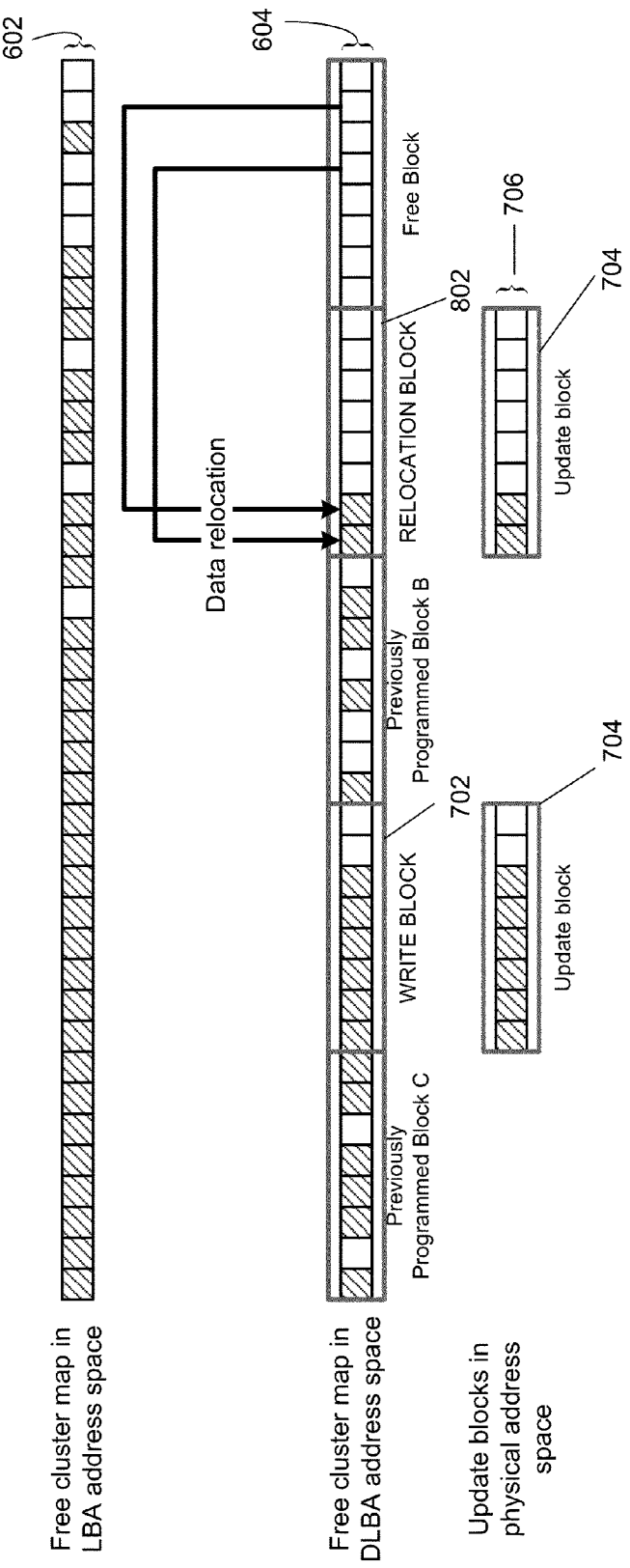
FIG. 8 illustrates a data relocation operation in DLBA address space and corresponding updates bocks in physical address space.

As mentioned previously, the STAR algorithm operates to ensure that a sufficient supply of free blocks is available for the sequential write algorithm to operate. The STAR algorithm manages the creation of free blocks by relocating valid data from previously programmed blocks having a mix of valid and obsolete data to a special write block known as the relocation block 802 (FIG. 8). The previously programmed block currently selected for relocation is referred to as the reclaim block.

Referring now to FIGS. 7-8, an illustration of a data relocation process is shown. The storage address re-mapping algorithm designates a free block as the relocation block 802, to which data is to be relocated from selected previously programmed blocks to create additional free blocks. Valid data in the reclaim block (block A of FIG. 7) is selected in the order that the valid data appears in the reclaim block and relocated to sequential and contiguous addresses in the relocation block 802, to convert the reclaim block to a free block 608. A corresponding update block 704 in the physical address space 706 is also assigned to receive the relocated data. As with the update block 704 used for new data received from the host, the update block 704 for receiving relocated data will never require a garbage collection operation to consolidate valid data because the relocation operation has already accomplished the consolidation in DLBA address space 604.

Figure 9:
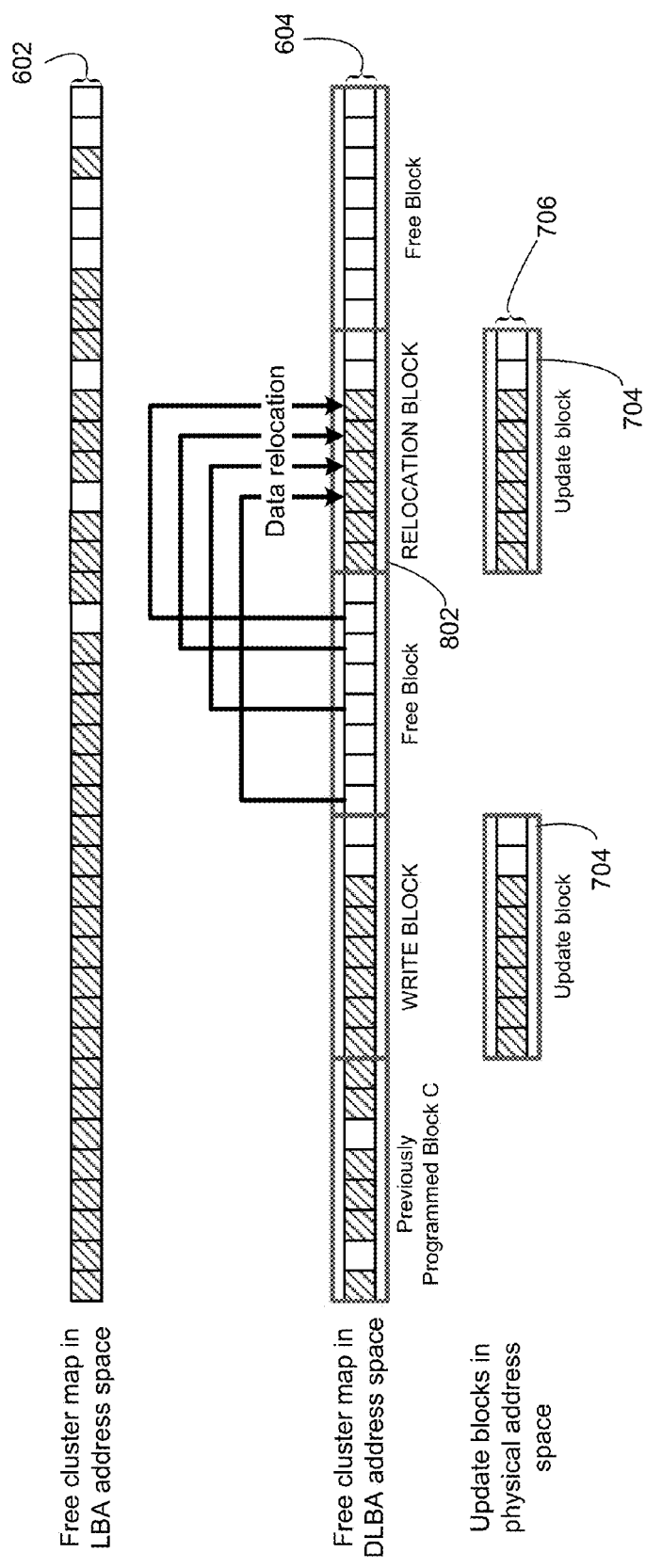
FIG. 9 illustrates a second data relocation operation following the data relocation operation of FIG. 8.

A next reclaim block (previously programmed block B of FIG. 8) is identified from the remaining previously programmed blocks as illustrated in FIG. 9. The previously programmed block with the least valid data is again designated as the reclaim block and the valid data of the reclaim block is transferred to sequential locations in the open relocation block. A parallel assignment of physical addresses in the update block 704 is also made. Again, no data consolidation is required in the physical update block 704 mapped to the relocation block 802. Relocation operations on previously programmed blocks are performed as background operations to create free blocks at a rate sufficient to compensate for the consumption of free blocks that are designated as write blocks. The example of FIGS. 6-9 illustrate how a write block and a relocation block may be separately maintained, along with respective separate update blocks in physical address space, for new data from the host and for relocated data from previously programmed blocks. Allocation of a new write block for associating new data received from a host is only performed when a current write block is fully programmed. Similarly, a new relocation block is preferably only allocated after the prior relocation block has been fully programmed. The new relocation block preferably only contains unwritten capacity, i.e. is only associated with obsolete data ready to erase, or is already erased and contains no valid data, upon allocation.

In the implementation noted above, new data from a host is associated with write blocks that will only receive other new data from the host, and valid data relocated from previously programmed blocks in a relocation operation is moved into relocation blocks that will only contain valid data from one or more previously programmed blocks. In other implementations, the new data and the relocated data may be transferred to a single write block without the need for separate write and relocation blocks.

The selection by the controller of a previously programmed block as a reclaim block may be accomplished by selecting any previously programmed block on a list of previously programmed blocks that is associated with an amount of valid data that is below a threshold (which may be a fixed threshold or a variable such as an average amount of valid data for the current previously programmed blocks), or may be accomplished by selecting based on a specific ranking (based on the amount of valid data associated with the previously programmed block) of the available previously programmed blocks. Additional details on versions of the STAR technique usable with the system and methods disclosed herein may be found in U.S. patent application Ser. No. 12/036,014, filed Feb. 22, 2008 and published as U.S. Patent Appl. Pub. No. 2008/0307192, now U.S. Pat. No. 9,396,103, wherein the entirety of the aforementioned application is incorporated herein by reference.

The relocation operation described in FIGS. 6-9 relocates relatively "cold" data from a block from which "hot" data has been made obsolete to a relocation block containing similar relatively cold data. This has the effect of creating separate populations of relatively hot and relatively cold blocks. The block to be reclaimed is always selected as a hot block containing the least amount of valid data. Creation of a hot block population reduces the memory stress factor, by reducing the amount of data that need be relocated.

In an embodiment of the multi-layer memory and method, the host interface and controller 108 implements the STAR technique illustrated in FIGS. 6-9 in each of the respective flash memory layers. In an alternative embodiment of the storage device of FIG. 4A, a STAR-enabled version of the multi-layer memory system is illustrated, where the first flash memory layer has a lesser bit per cell capacity than the second flash memory layer, and the second flash memory layer has a lesser bit per cell capacity than the third flash memory layer. In the example of FIG. 4A, 1-bit, 2-bit and 3-bit per cell flash memory layers have been illustrated, although other increasing series of bit per cell memory layers may be used, and in other increase increments.

Partitions in Memory Layers

Figure 10:
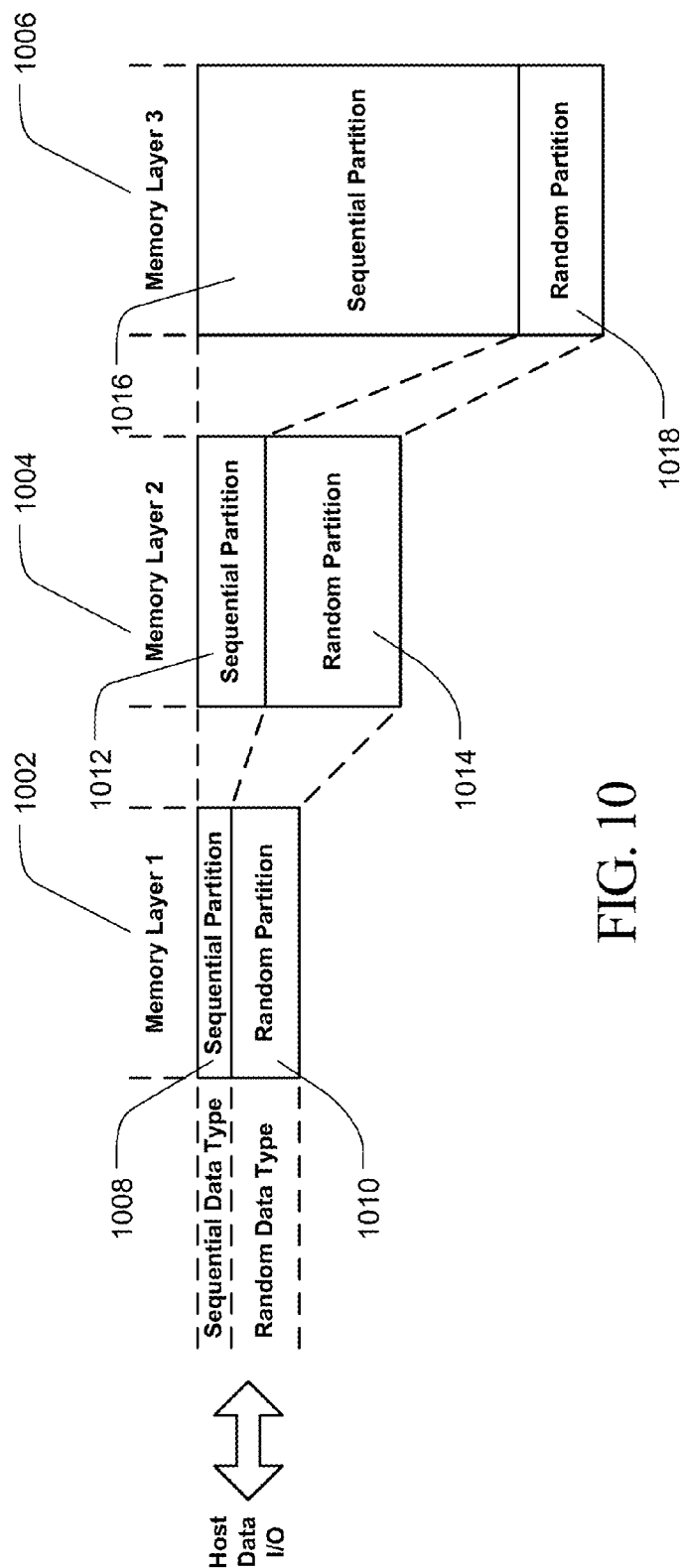
FIG. 10 illustrates an embodiment of the storage device with multi-layer memory organization where each layer includes multiple partitions.

In one embodiment, as illustrated in FIG. 10, each of the layers 1002, 1004 and 1006 of the flash memory may include a plurality of partitions, where each partition is assigned to a specific type of data. In the example of FIG. 10, there are two partitions per layer, a sequential partition (1008, 1012, 1016) assigned to sequential data and a random partition (1010, 1014, 1018) assigned to random data. A NAND block in each memory layer is permanently allocated to a layer, but may be dynamically allocated to either partition for each cycle of operation. Operation cycles will be described separately in greater detail herein. Although two partitions per layer are shown in FIG. 10, more than two partitions per layer may be implemented in other embodiments, where each partition in a layer is associated with a different data type. Not all partitions need be present in all layers and the size of a partition in a layer may vary dynamically each operation cycle based on the amount of data for the particular data type.

In the following example, sequential data is data having sequential host logical block addresses (LBAs) for at least a metapage worth of data as handled by the flash management algorithm for the storage device. For example, if the metapage size managed by the flash management algorithm of the storage device is 128 k, then sequentially addressed runs of at least 128 k would be considered sequential data and be routed to the sequential partition (1008, 1012, 1016) of a desired layer while data having less than 128 k of sequential LBAs would be handled by the random partition of the desired memory layer. The 128 k threshold is provided simply by way of example as the metapage size may be different for different flash management systems.

In other embodiments, rather than analyzing the LBAs of incoming data for runs that qualify incoming data as sequential or random, the flash management algorithm in the controller may receive information from the host on other data type characteristics for the data that would then permit other, or additional, partitions to be supported in the different memory layers. This information on other data type characteristics may be for data types such as temporary data, long-term data, read/write latency, data that is required during a boot process, and so on. The information on these data types may be determined by the controller or may be provided via "host hints" where the host can pass along a specific attribute to the storage device with the data using protocols that define these other data types.

A flash memory device with layers and partitions creates a storage matrix with two dimensions. The physical memory of the storage device has physical memory subdivided into multiple layers 1002, 1004, 1006 according to memory type (e.g., single bit per cell (X1), two bits per cell (X2) and three bits per cell (X3)), while stored data in each layer is divided into partitions by data type that is determined by the controller or provided by the host.

Figure 11:
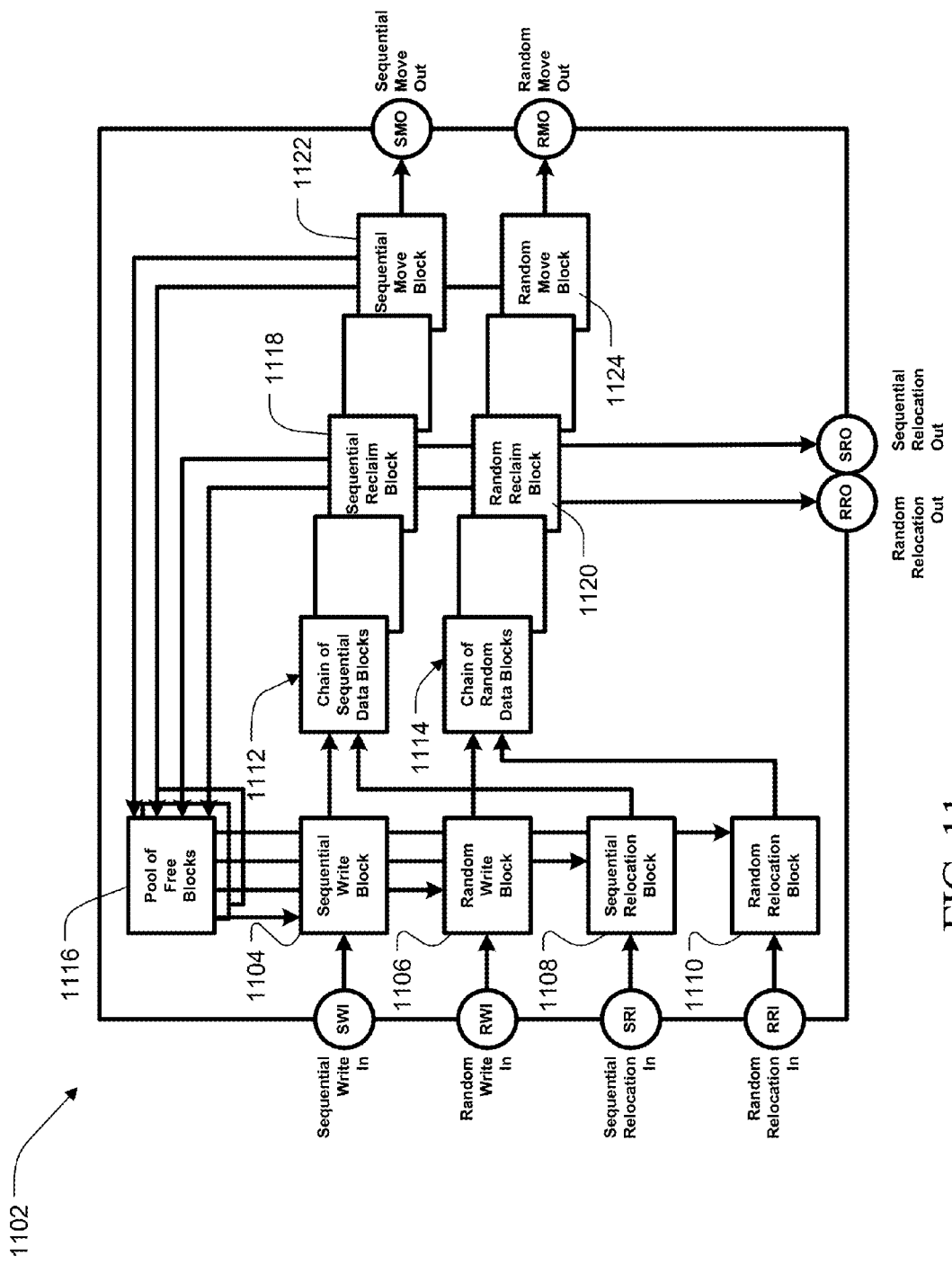
FIG. 11 illustrates a data flow pattern in a layer of a multi-layer memory having multiple partitions.

Referring to FIG. 11, a generic structure of one layer 1102 of the 3 layer memory with random and sequential partitions of FIG. 10 is shown. The layer 1102 comprises two available write blocks, a sequential write block 1104 and a random write block 1106, for data being written from outside the layer. Data designated as sequential and random is directed to different write blocks. Instances of both write blocks need not be open concurrently, or may not be allowed to be open concurrently. For example, only one block at a time may be allowed to be open for programming in an X3 layer. Similarly, two available relocation blocks, one for sequential data 1108 and another for random data 1110, may exist for data being relocated from within the same layer. Data designated as sequential and random when first written to the layer is directed to respective different relocation blocks. Only one relocation block will be open at a time, and in one implementation, a relocation block 1108, 1110 may not be open at the same time as a write block in an X3 layer.

The identities of blocks written as sequential and random blocks are separately maintained. Two chains 1112, 1114 of blocks for sequential and random data record the order in which their blocks were programmed. These chains 1112, 1114 are designated as the sequential and random partitions for the layer as discussed with respect to FIG. 10. A single pool of free blocks 1116 provides blocks for allocation in the sequential or random partitions as write or relocation blocks.

When the number of blocks in the free block pool reaches a minimum threshold level, or the volume of valid data in the layer exceeds a threshold amount, such as the LBA capacity of the layer, a maintenance operation must be performed in the layer.

A maintenance operation may require data to be relocated within a layer from a selected reclaim block 1118, 1120 to the corresponding relocation block 1108, 1110. In one embodiment, relocation of data in a layer is managed such that data remains in the same partition in the layer. Thus, data is normally routed from the random relocation out (RRO) port to the random relocation in (RRI) port, or from the sequential relocation out (SRO) port to the sequential relocation in (SRI) port, depending on the partition in which the operation is being performed. However, it is permitted to configure the data routing to combine relocated data from both partitions into a single relocation block, in some embodiments.

Alternatively, a maintenance operation may require data to be moved from the least recently programmed block, designated a sequential move block 1122 or a random move block 1124, in the selected partition to the corresponding write block in the following layer (e.g. from X1 to X2). Data is normally routed from the random move out (RMO) port to the random write in (RWI) port of the next layer, or from the sequential move out (SMO) port to the sequential write in (SWI) port of the next layer, depending on the partition in which the operation is being performed. Although data in one partition is preferably only relocated to another block in the same layer and partition, or moved to a block in the same partition in a different layer, it is contemplated that data from different partitions may be combined into a single write block in the next layer, in some embodiments.

Figure 12:
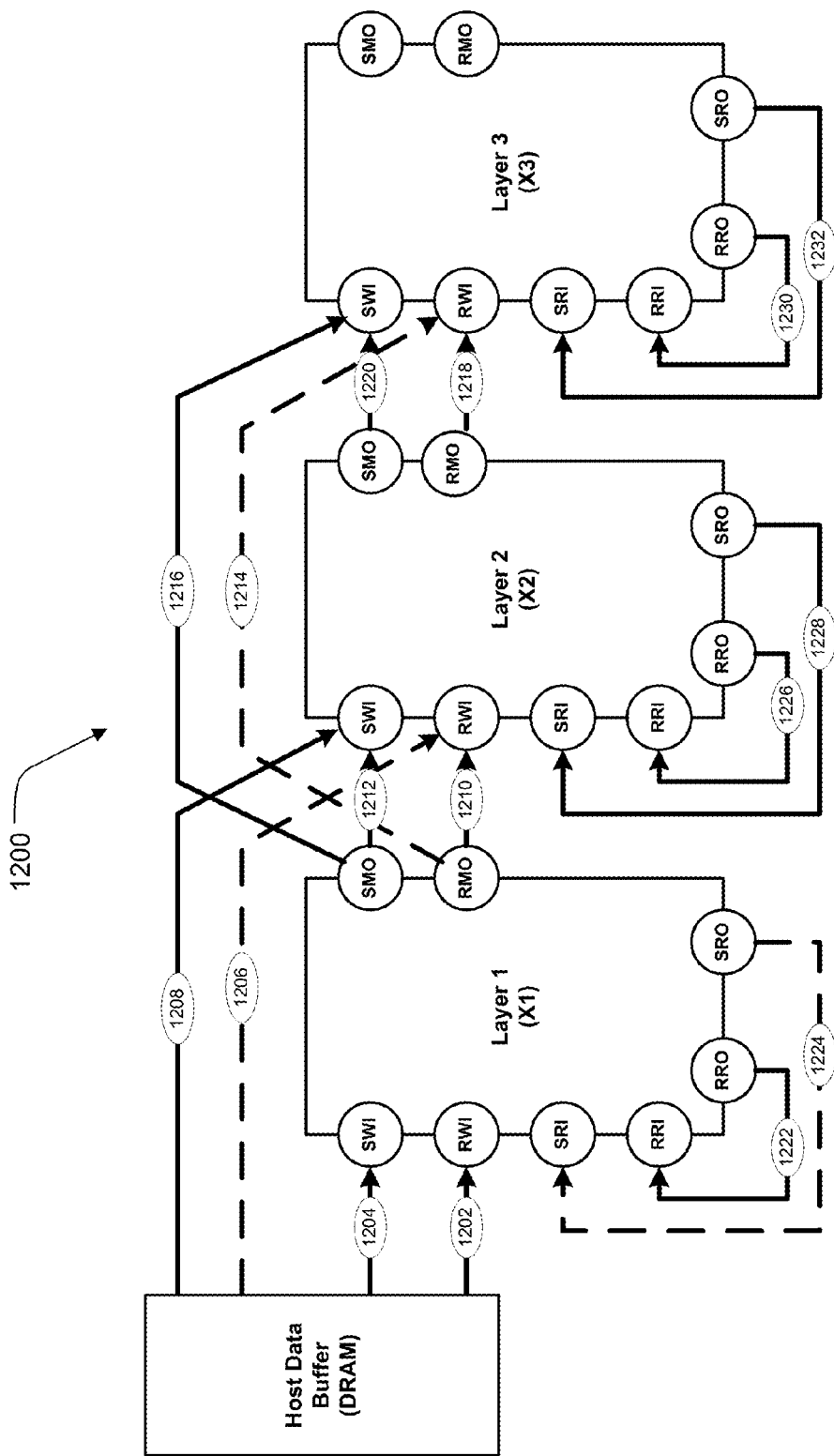
FIG. 12 illustrates data paths for a three layer memory having two partitions.

Referring to FIG. 12, one embodiment of data flow for the three layer memory having two partitions (referred to herein as a Trio die 1200) of FIG. 10, is illustrated. The controller may support a data transfer algorithm between layers, herein referred to as a Trio algorithm in a three layer implementation, that would permit use of paths 1202-1232 as shown, but paths 1206, 1214 and 1224 are not used in a Trio die 1200 implementation in one embodiment.

Layer 1 (X1) may be used for execution of random write transactions and continuation sequential write transactions from the host, although standard sequential write transactions from the host are executed directly on layer 2 (X2). Layer 1 therefore maintains both sequential and random partitions of data blocks. Each maintenance operation to move data to layer 2 or layer 3 therefore comprises a single type of data, either sequential or random. Random data may be relocated within layer 1, but there is no relocation of sequential data in layer 1 in the embodiment of FIG. 12.

Layer 2 maintains both sequential and random partitions, and each maintenance operation to move data to layer 3 (X3) or to relocate data within layer 2 therefore comprises a single type of data, either sequential or random. Layer 3 maintains both sequential and random partitions, and each maintenance operation to relocate data within layer 3 therefore comprises a single type of data, either sequential or random. Data cannot be moved from layer 3 as there is no next higher layer. Also, in one embodiment, only a single block in layer 3 may be open for programming at any time.

Figure 13:
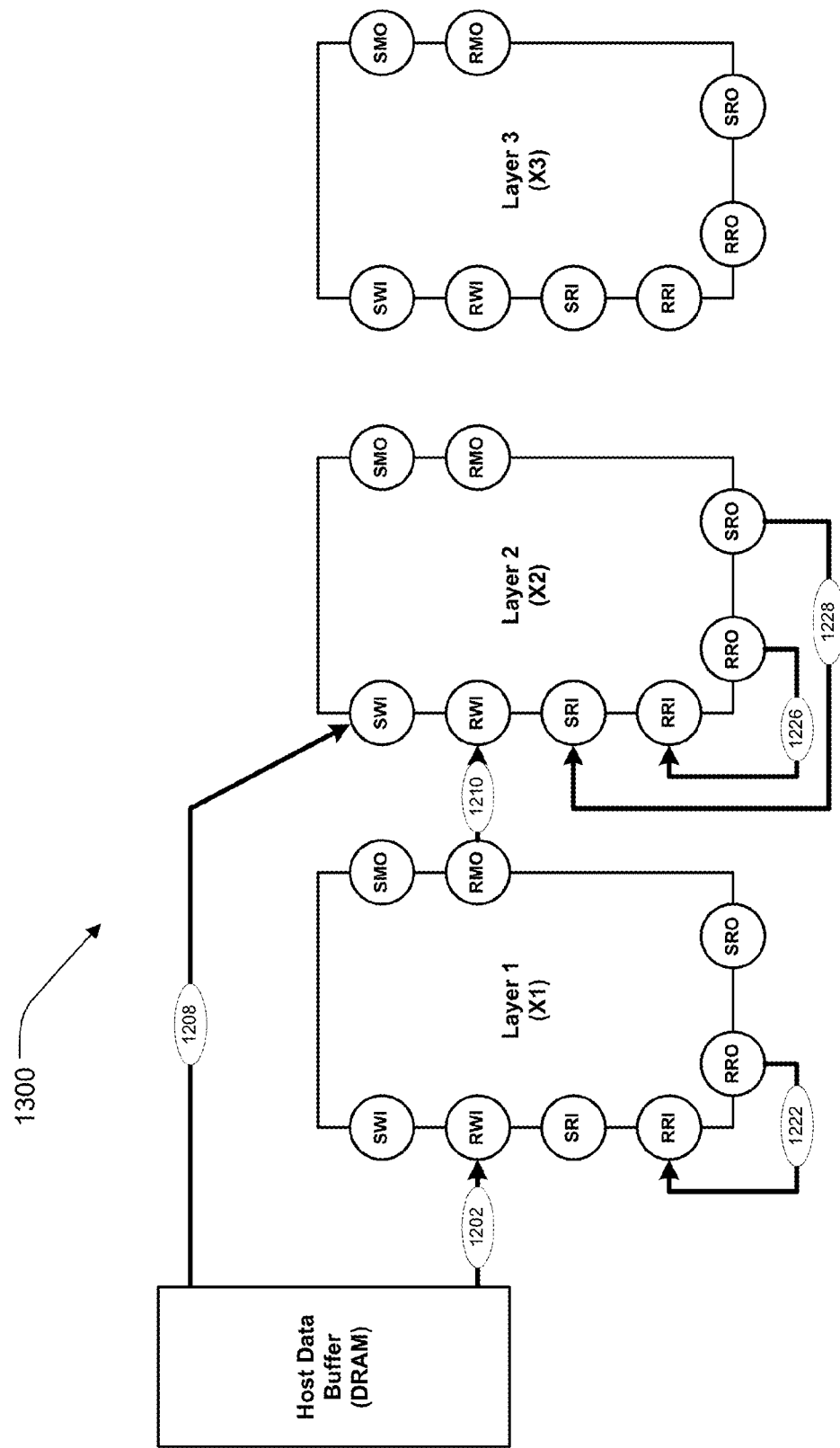
FIG. 13 illustrates data flow paths for a two layer memory having two partitions.
Figure 14:
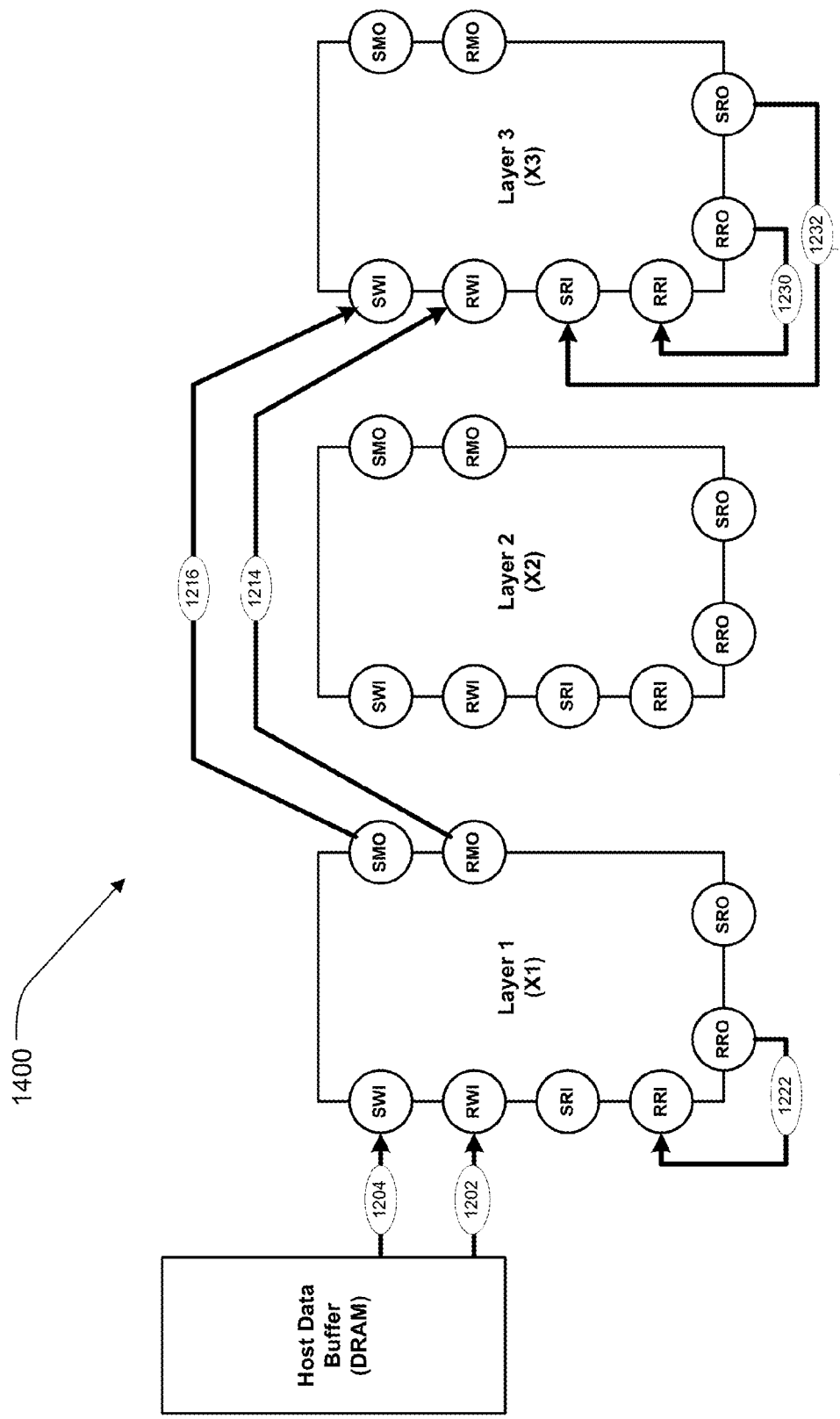
FIG. 14 illustrates data flow paths for an alternative embodiment of the two layer, two partition memory of FIG. 13.

The description above with respect to FIG. 12 assumes Trio die 1200 having X1, X2 and X3 bit per cell densities as described above. In other embodiments, a triple layer arrangement of die may be arranged on separate die, or there may only be a dual layer die. An example of a data flow for a two layer die having only X1 and X2 layers (referred to herein as a Duo2 die 1300) is illustrated in FIG. 13. Similarly, an example of a data flow for a two layer die having only X1 and X3 layers (referred to herein as a Duo3 die 1400) is illustrated in FIG. 14. The data paths in FIGS. 13 and 14 that are the same as those in FIG. 12 are given the same numbers for ease of comparison with FIG. 12. In the Duo3 die 1400, sequential and random write transactions from the host are both executed on layer 1, because data cannot be programmed directly from the host to the X3 layer. Layer 1 therefore comprises two partitions of data blocks. Each maintenance operation to move data to layer 3 therefore comprises a single type of data, either sequential or random. Random data may be relocated within layer 1, but there is no relocation of sequential data in layer 1. Layer 3 of die 1400 is configured exactly as for triple layer memory in a Trio die.

For a flash die having a particular layer and partition arrangement in a multi-layer memory there is a fixed number of types of maintenance operations that may be triggered by a host write operation. The combination of host write and maintenance operations are referred to as programming sets. As illustrated in Tables 1-3, one embodiment of all possible programming sets in the Trio die, Duo2 die and Duo3 die arranged to manage two data partitions is set out. In Tables 1-3, the first letter of the programming set denotes random data (R) or sequential data (S) written by the host. The first digit following the R or S denotes the layer in which the host data is programmed. The 2nd, 3rd and 4th digits, when present, denote layers in which data during successive consequential maintenance operations is programmed. For example, the programming set in Table 1 designated "R1233" refers to random host data directed to the random partition in layer 1 in a Trio die that triggers maintenance operations of moving data from layer 1 to layer 2, moving data from layer 2 to layer 3 and relocating data within layer 3.

TABLE 1

Programming sets in a Trio die

| Programming Set | Host Data Type | Host Data Write Layer | Maintenance Operations 1st Operation | 2nd Operation | 3rd Operation |
|---|---|---|---|---|---|
| R1 | Random | L1 | | | |
| R11 | Random | L1 | L1 to L1 data relocation | | |
| R12 | Random | L1 | L1 to L2 data move | | |
| R122 | Random | L1 | L1 to L2 data move | L2 to L2 data relocation | |
| R123 | Random | L1 | L1 to L2 data move | L2 to L3 data move | |
| R1233 | Random | L1 | L1 to L2 data move | L2 to L3 data move | L3 to L3 data relocation |
| S1 | Sequential | L1 | | | |
| S13 | Sequential | L1 | L1 to L3 data move | | |
| S133 | Sequential | L1 | L1 to L3 data move | L3 to L3 data relocation | |
| S2 | Sequential | L2 | | | |
| S22 | Sequential | L2 | L2 to L2 data relocation | | |
| S23 | Sequential | L2 | L2 to L3 data move | | |
| S233 | Sequential | L2 | L2 to L3 data move | L3 to L3 data relocation | |

TABLE 2

Programming Sets in a Duo2 die

| Programming Set | Host Data Type | Host Data Write Layer | Maintenance Operations 1st Operation | 2nd Operation | 3rd Operation |
|---|---|---|---|---|---|
| R1 | Random | L1 | | | |
| R11 | Random | L1 | L1 to L1 data relocation | | |
| R12 | Random | L1 | L1 to L2 data move | | |
| R122 | Random | L1 | L1 to L2 data move | L2 to L2 data relocation | |
| S2 | Sequential | L2 | | | |
| S22 | Sequential | L2 | L2 to L2 data relocation | | |

TABLE 3

Programming Sets in a Duo3 die

| Program-ming Set | Host Data Type | Host Data Write Layer | Maintenance Operations | | |
|---|---|---|---|---|---|
| | | | 1st Operation | 2nd Operation | 3rd Operation |
| R1 | Random | L1 | | | |
| R11 | Random | L1 | L1 to L1 data relocation | | |
| R13 | Random | L1 | L1 to L3 data move | | |
| R133 | Random | L1 | L1 to L3 data move | L3 to L3 data relocation | |
| S1 | Sequential | L1 | | | |
| S13 | Sequential | L1 | L1 to L3 data move | | |
| S133 | Sequential | L1 | L1 to L3 data move | L3 to L3 data relocation | |

With respect to the features of multiple layers in each die, where each layer has a plurality of partitions associated with data of a certain type or certain attribute, in different embodiments, the partition to which a block belongs may be determined by the controller or by the host providing an attribute associated with LBAs of data stored in the block. Alternatively, the memory system may determine what partition a block belongs to based on an attribute of the state of the memory system during a defined operation. The multi-layer, multi-partition structure and controller may handle routing of blocks of data from a host to respective desired initial layers and partitions, as well as relocation of data within layers and relocation of data between layers. A plurality of blocks in a layer may be written with data from a source outside the layer and each of the plurality of blocks may be written in a different partition in the layer.

Selection of blocks for relocating data or moving data during maintenance operations in a multi-layer, multi-partition die may be accomplished using the same criteria as for multi-layer die described with respect to FIGS. 4A-4B and 5 above. Also, relocation and movement of data may be from different partitions than the partition in which the host data that triggered the one or more maintenance operations is directed. Because the partitions are dynamic and free blocks in a layer are assigned on demand to whatever partition needs an additional free block, the maintenance operation may look only at a die layer as a whole for blocks to move to another layer or relocate within the layer.

In addition to the block selection criteria noted previously, alternative block selection criteria for maintenance operations are contemplated. For selecting a block to move between layers, instead of selecting the least recently programmed block based on the order in which the block was programmed, the move block may be selected based on the age of the data in the previously programmed block. In other words, selecting the previously programmed block having the oldest average data based on age data for each data element (sector, cluster or other sub-block data granularity that is being tracked) in each previously programmed block. The age of data in the previously programmed blocks may be maintained by the controller in a control data structure as part of a storage address table (SAT) or other lists that map logical and/or physical addresses. In one implementation, the age information for the data may be a relative age, where the age for a particular piece of data in a block is recorded as a number representing the order it was first written into the storage device from the host. The controller would, assuming that transfer criteria such as those discussed previously had been met, then select the block having the oldest average age of data. An advantage of this alternative technique for selecting the move block is that it may do a more thorough job of segregating "cold" and "hot" data between the flash memory layers. Using the least recently programmed block as the sole criteria might miss older data that has been relocated within the flash memory layer and thus is now part of a more recent previously programmed block In another alternative embodiment, referring again to FIG. 11, instead of having separate reclaim blocks 1118, 1120 and move blocks 1122, 1124 in a memory layer, the separate reclaim and move blocks may be replaced with only a move block (not shown) in each layer, where a portion of the data in the move block for the layer is dedicated for transfer to the next higher capacity layer and a remaining portion of data is relocated to the respective relocation block 1108, 1110 for the layer. In this alternative embodiment, selection of the combination move/reclaim block (in each of the first and second layers for a Trio die) may be accomplished either by selecting the least recently programmed block, or by selecting the block with the oldest average data. The amount of data to transfer from the selected combination move/reclaim block may be a fixed amount or a percentage, for example fifty percent of the valid data in the block may be designated for transfer to the next layer and the remaining fifty percent may be relocated within the layer. The selection of which fifty percent to transfer from the identified move/reclaim block may be made based on the age of the data as tracked by the controller in the control data structure for the memory system.

In other alternative embodiments, additional considerations regarding whether or not to transfer data to a next layer may be overlayed with the programming order or data age considerations noted above. For example, in one embodiment it may also be beneficial to increase performance by maintaining older (i.e. "colder") data in a lower bit per cell capacity flash memory layer if that data is frequently read. Read counts for data or blocks of data may also be maintained in the multi-layer, multi-partition memory such as in the control data structure for the memory system. The read count information may be used to supplement the data transfer criteria such that data from the least frequently programmed block, or the block with the oldest average age of data, will not be selected for transfer to a next higher bit per cell layer if the number of read operations on that data is above a predetermined threshold.

Asynchronous Die Management

Figure 15:
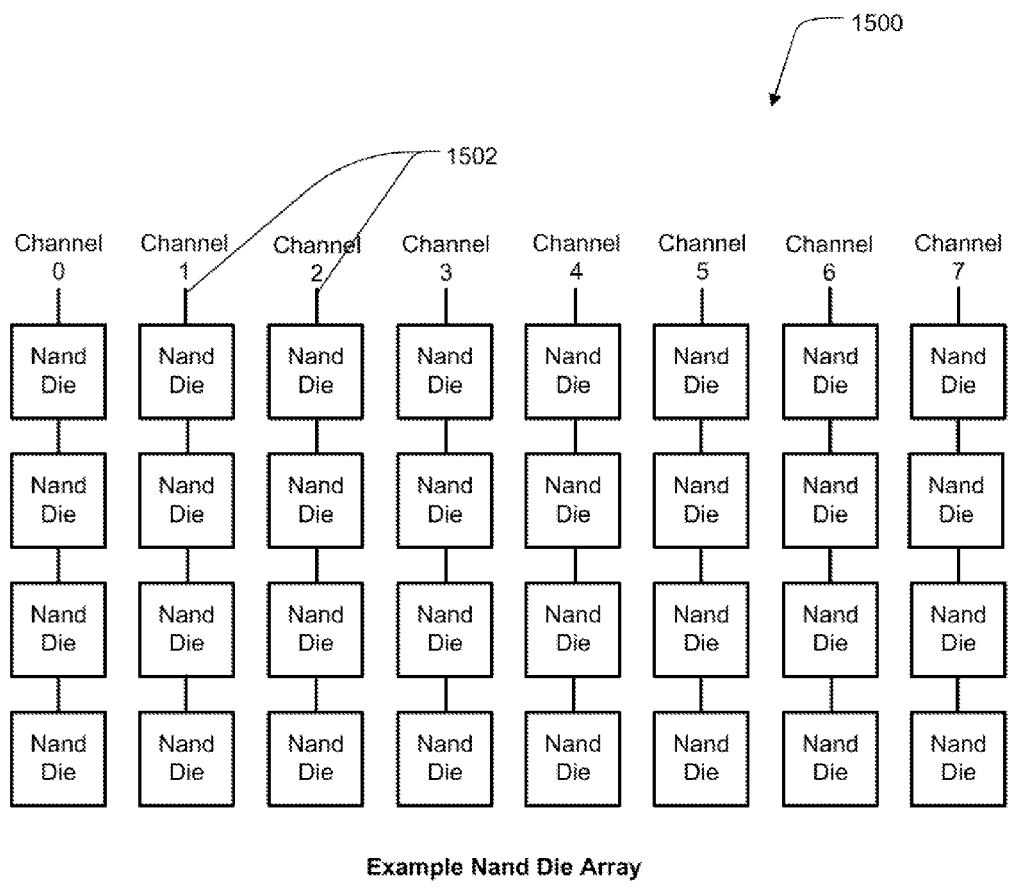
FIG. 15 illustrates a NAND die array with an equal number of die on each of eight different channels.
Figure 16:
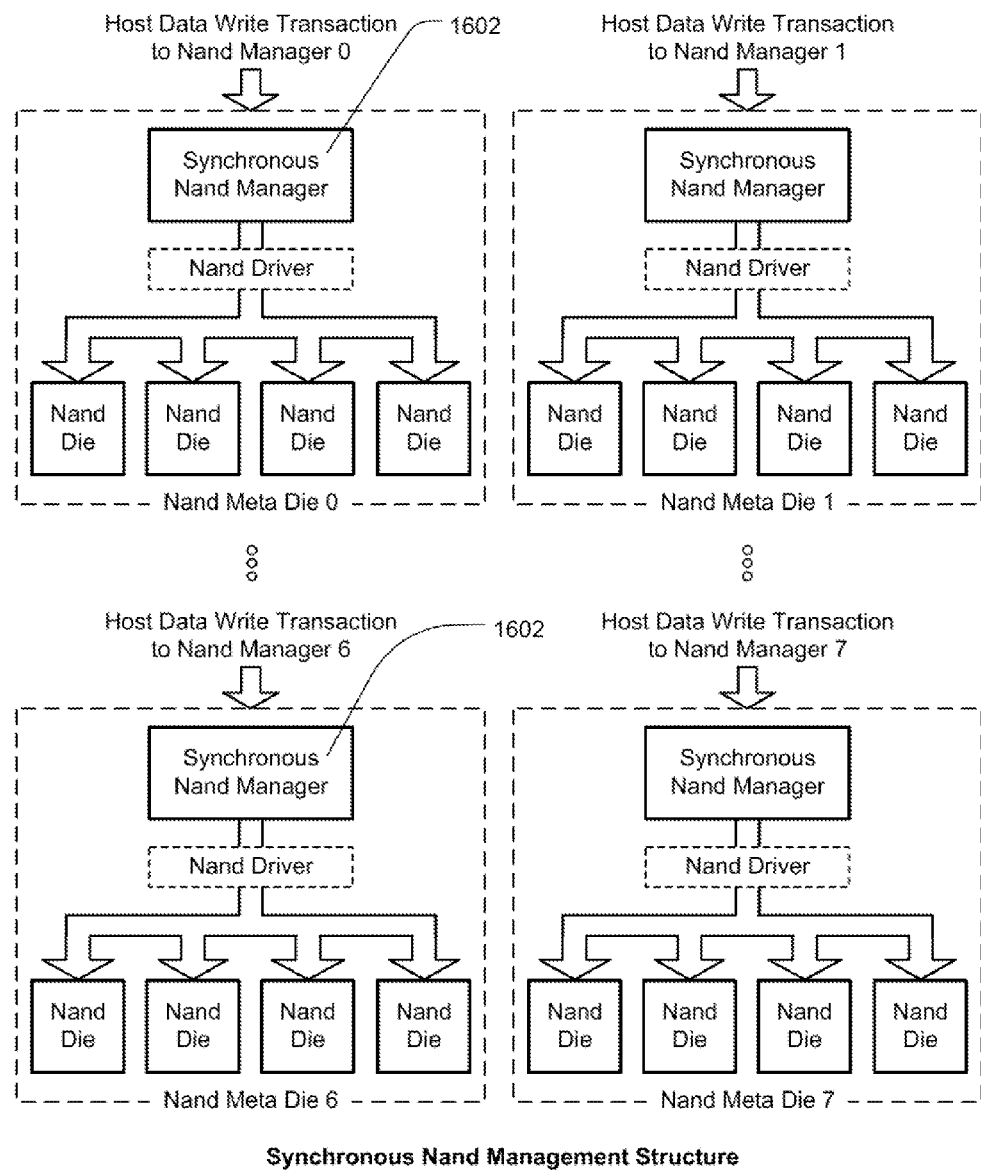
FIG. 16 illustrates a synchronous die management arrangement for managing the NAND die array of FIG. 15 where each of eight controller instances manage 4 die on separate channels.

The multi-layer memory with partitions in each layer has been described above in the context of a single memory with a single controller, however the concept of multi-layer and multi-partition per layer memory is scalable to an array of memory die such as illustrated in FIGS. 15 and 16 where an array 1500 of the memory die are shown. For example, in the 4×8 array 1500 of FIG. 15, 4 NAND die are arranged on each of 8 different channels 1502.

In one implementation, there may be 8 separate controllers in the storage device, each controller assigned 4 die in a row such that the die assigned to the controller are each on a different channel. The controllers may be separate physical controllers each with their own processor, or one or more processors each executing different software instances of the controller software for respective die associated with the controller instance. FIG. 16 illustrates a synchronous die management arrangement where each controller (NAND manager) 1602 controls 4 die in parallel on respective different channels. An arrangement such as shown in FIG. 16 can provide for very efficient processing of sustained sequential writes because a metablock sized to stripe data across each of the die managed by the controller can efficiently program sequentially addressed data in parallel.

In a synchronous die management algorithm, multiple NAND die managed by the same controller perform program and erase operations synchronously. In such an architecture, a single controller handles multiple die, each of the die assigned to a separate channel, where multiple blocks from multiple die are linked into a metablock, which becomes the basic unit of NAND program management. In this example, data is programmed in parallel in units of a metapage of size 128 KB, where 32 KB is written across each of the four die on their separate controller channels. Transactions for writing data at all levels in the system, from front-end to NAND, have the same data length as this NAND metapage, i.e. 128 KB.

In the synchronous architecture, once a write operation begins, all four die are considered "busy" until the slowest one of the die in that 4 die set has finished writing its 32 KB of data. This may block or prevent the host from initiating other operations (programming or read activity) on the remaining die in the set until the slowest die has finished writing. Another issue that may arise from tying 4 separate die together on separate channels under one controller for a 128 KB write is that a complete write requires a metablock made up of a block from each of the 4 die. So, if one die has fewer good blocks than another die in the 4 die group, the controller only has access for write operations up to the capacity of the die in the group with the least number of good blocks. Any extra good blocks in other of the die for that group, more than the number of good blocks in the die with the least good blocks for that group, cannot be used for a write operation because of the 128 KB write size.

In instances where the received write commands are for smaller, random data writes, the efficiency is reduced in a synchronous die management architecture. For example, if there is a sustained random write, the large transaction size may cause blocking of the host interface due to significant differential between the times the individual NAND managers (controller instances) 1602 remain busy with their respective operations. Furthermore, the large metablock size and parallel channel die control of FIG. 16 may also be inefficient for mixed reads and writes with small amounts of data. Each write transaction in FIG. 16 will keep 4 die busy and thus blocks 4 die from any pending read transactions.

Figure 17:
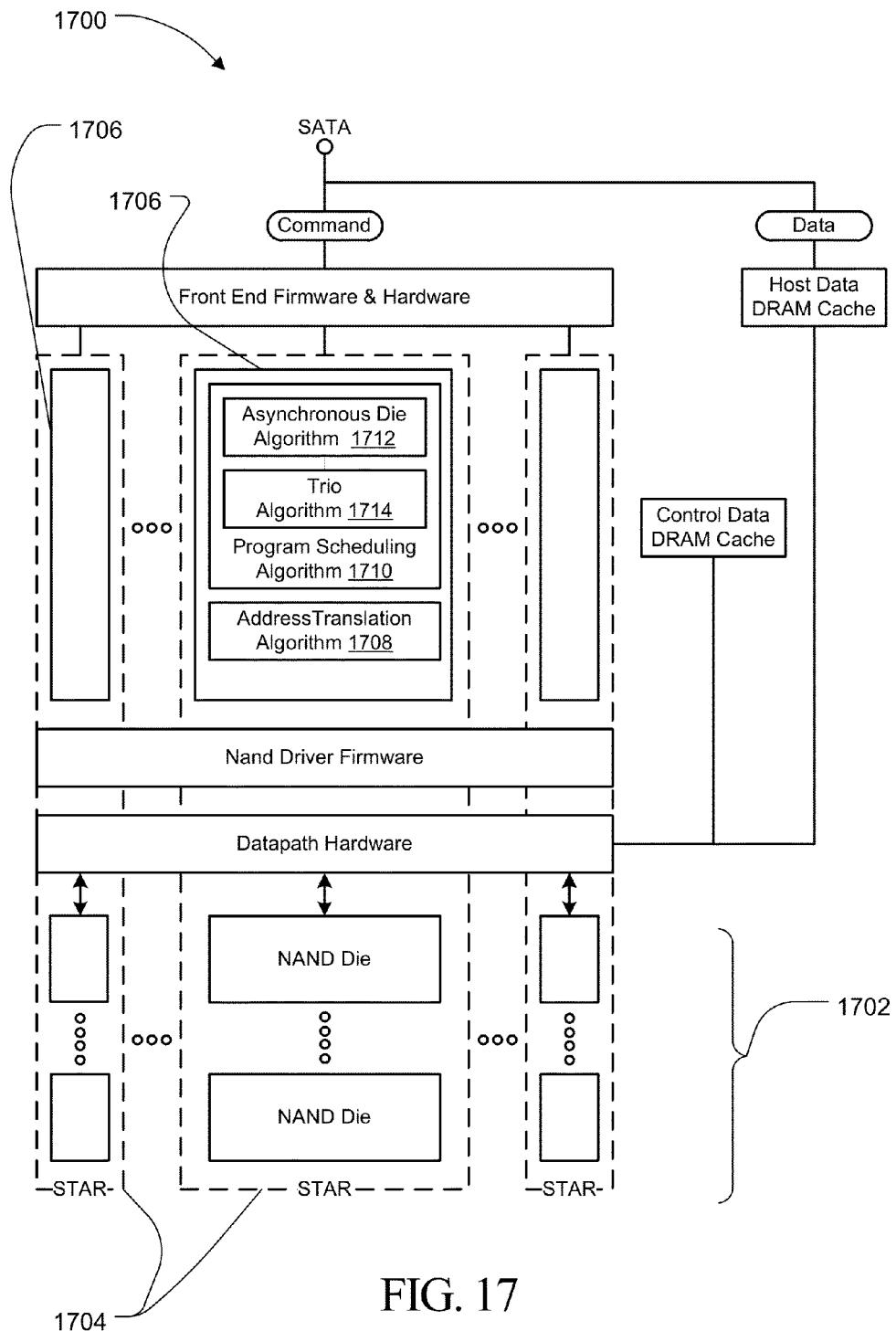
FIG. 17A illustrates an alternative arrangement of the multi-layer memory system of FIG. 4A with a memory array and multiple controller instances.
FIG. 17B illustrates an alternative arrangement of the multi-layer memory system of FIG. 4A with a memory array and a single controller.
Figure 17A:
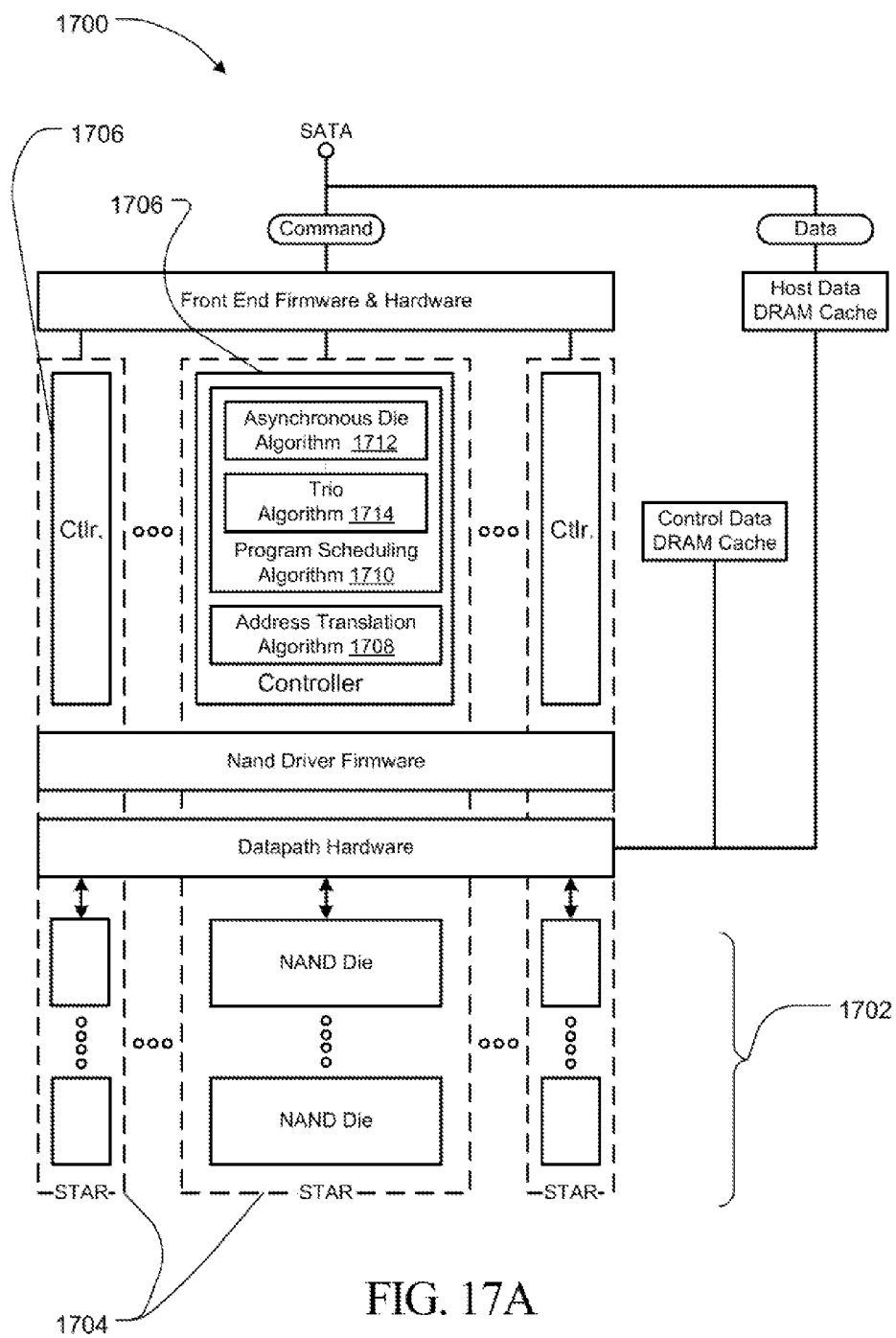
Figure 17B:
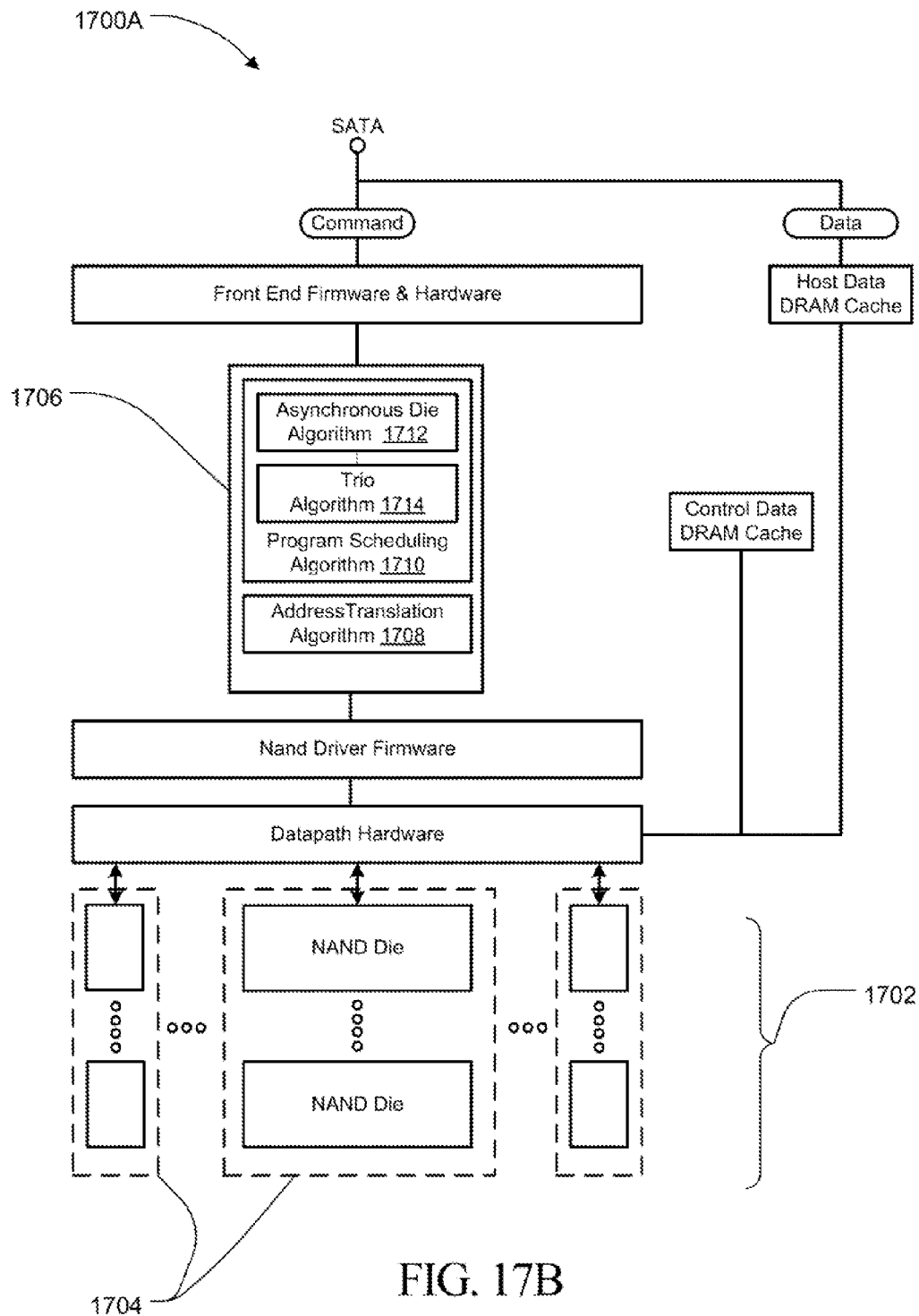
Figure 18:
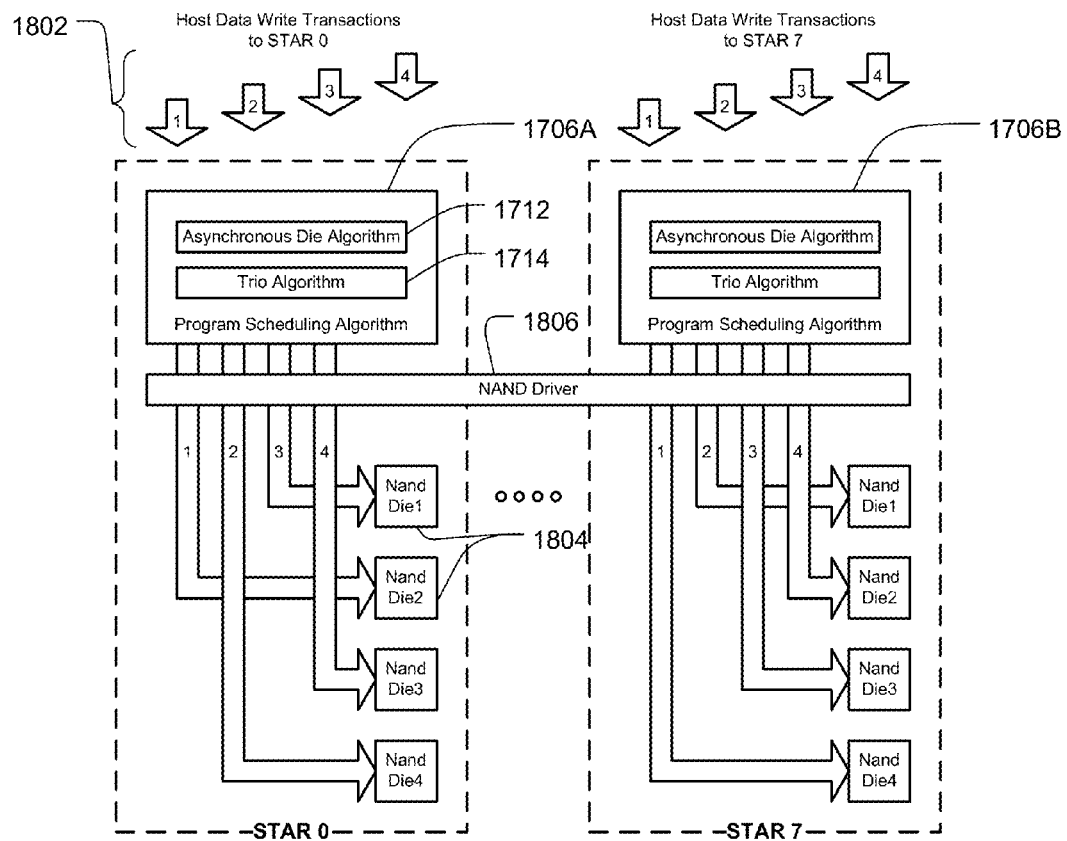
FIG. 18 illustrates an asynchronous die management scheme implemented by STAR controllers of the multi-layer memory system of FIG. 17A.

In one embodiment, instead of the synchronous controller arrangement discussed above, where multiple blocks from multiple die are linked into a metablock that a controller programs or erases synchronously, an asynchronous architecture is contemplated. As shown in FIGS. 17A-17B and 18, in the asynchronous architecture each controller is assigned die on a single channel (FIG. 17A) or a single controller may be assigned to all die on all channels (FIG. 17B). The memory system 1700 in FIG. 17A includes many of the same features of that of FIG. 4A, but illustrates an array 1702 of NAND die where columns of NAND die associated with a single controller channel 1704 are controlled by a separate controller 1706. Each controller instance may handle data programming on a die-by-die level and each instance of the STAR controller can select the best die on the single channel for a particular operation based on its availability.

In the multiple controller embodiment of FIG. 17A, the controllers 1706 may use the STAR address translation algorithm 1708 discussed above with respect to FIGS. 6-9 and utilize a program scheduling algorithm 1710 discussed in greater detail below that incorporates the asynchronous die management algorithm 1712 discussed herein and the Trio algorithm 1714 for managing movement of data to, within and between die memory layers that has been set forth above. In the memory system 1700A with the single controller in the embodiment of FIG. 17B, where a single controller 1706 manages all NAND die on one or many channels 1704, the controller is the same type of controller with the same algorithms (1708, 1710, 1712, 1714) as the multi-controller embodiment of FIG. 17A. The single controller embodiment simply manages the full address mapping for die and channel for all data in the NAND array 1702 rather than receiving data in a specific LBA address range associated with a particular controller/channel as discussed with respect to the multi-controller embodiments having a separate controller per channel. For ease of illustration, and to avoid repetition, the features described below are generally explained in the context of the multiple controller arrangement of FIG. 17A. It should be understood, however, that all of the features disclosed herein are equally applicable to the single controller embodiment of FIG. 17B.

In one embodiment of the present invention, the STAR controller 1706 includes an asynchronous die algorithm 1712, in which data programming parallelism and write transactions throughout the system are managed in units of the maximum programming parallelism achievable within one die, which is typically 32 KB in a 2-plane die. Each STAR controller 1706 is associated with die on only one channel 1704, rather than die on separate channels as in the synchronous architecture. In this manner, multiple die can operate fully in parallel when required, or can operate asynchronously with each performing unrelated operations. Additionally, the asynchronous operation permits the STAR controller for each set of die it manages on the same channel to select the die that is best suited for receiving the data, for example the die having the shortest queue of data to be written. In the embodiment of FIG. 17B, the single controller 1706 manages all die an all channels and can select any die that is best suited for receiving data.

The asynchronous die algorithm may provide reduced latency for execution of host commands and improved performance with workloads having irregular I/O size or mixed read/write characteristics. While there may be timing, accessibility and blocking (i.e. reduced operation blocking) benefits of the asynchronous die algorithm over synchronous die algorithms, independent management of I/O operations in NAND memory increases average die utilization and average performance for both random and sequential workloads. The asynchronous die algorithm may enable better management of the multiple partitions in each layer of a die because of the greater ease in managing partitions in one die at a time over coordinating partitions in multiple die simultaneously (e.g. four die in the synchronous algorithm discussed above). Further, there may be improved availability of die in the memory system to read operations when a combination of read and write operations are being received Asynchronous operation of each die associated with a STAR controller allows all good blocks within each die to be active. The performance of each die is therefore maximized by making use of the full physical overhead available to it, thereby maximizing the performance of the drive. An example of the potential for increased utilization of blocks within a given die may be seen with an asynchronous die management scheme or algorithm, such as illustrated in FIG. 18 where each STAR controller is assigned to 4 different die on the same channel (See also FIG. 17A). For ease of illustration, only two of the plurality of STAR controllers 1706 of FIG. 17A are reproduced in FIG. 18 and several elements omitted.

As data comes in to the memory system, the memory system directs the data to the buffer for the STAR controller associated with the appropriate host LBA range and the STAR controller will select the best die in the group of die it is managing. In FIG. 18, four separate write commands 1802, each with 32 KB of data in this embodiment in the LBA range associated with the particular STAR controller, are directed to the STAR controllers STAR0 1706A and STAR7 1706B. Utilizing the asynchronous die management algorithm 1712, the STAR0 controller 1706A selects any available individual NAND die from the die 1804 it is managing on the same channel for each command and routes data for each write command 1802 to a respective die 1804. The selection of the NAND die 1804 by the STAR0 controller 1706A is independent of the die selection of the separate die managed by the STAR7 controller 1706B or any other controller in the memory system for data directed to those other controllers. As shown in FIG. 18, the order of the die selected by the STAR0 controller 1706A is NAND die 2, 4, 1 and 3 for the data commands 1-4, respectively. The STAR controller 1706B, based on the status information it has for the NAND die it manages, selected a different order of NAND die 1804 (NAND die 4, 1, 3, 2).

The Trio algorithm 1714 in each STAR controller provides status information for each die to the asynchronous die algorithm 1712, indicating whether host data program transactions may be issued for the die. Status information may be based on the number of queued transactions for the die within the NAND driver 1806, and whether the required interleaving of maintenance copy operations with host data program operations has been met. Based on this status information, each instance of a STAR controller may utilize its asynchronous die algorithm 1712 to issue a host data write transaction from its front-end queue to any die managed by that STAR controller that is ready to receive it.

The die selection criteria implemented by the asynchronous die algorithm 1712 may include the STAR controller selecting a die only if the die's status information provided from the Trio algorithm 1714 indicates that the required interleaving of maintenance copy operations with host data program operations of the same class (e.g. data type of random or sequential) as the pending transaction has been met. Other criteria, which may be used alone or in combination, may include selecting a die only if the number of outstanding transactions for the target class (e.g. the queue for random write transactions) does not exceed a specified limit; selecting the available die with the lowest number of outstanding transactions for the target class; preferentially selecting the available die with the lowest program cycle type active for the target class; and/or selecting the available die with the lowest logical fullness.

While a specific STAR controller manages data with LBAs only within a specific subset of host LBA address space, there is no correlation between LBA and NAND die number within a STAR controller instance. Similarly, there is no correlation between the NAND die numbers used by successive STAR controllers to sequentially program successive LBA metapages within a stripe of LBAs spanning the separate die managed by two STAR controllers. Although each STAR controller independently manages its own die on one particular controller channel in one embodiment of an asynchronous architecture, the asynchronous die algorithm can also achieve full parallelism across STAR controllers for data transfer and NAND command execution. A NAND read or program operation on an LBA metapage can be executed in each of the STAR controllers, with fully synchronous data transfer and NAND access operations. This allows fully synchronous execution of read and program operations relating to an LBA address stripe spanning all STAR controllers, such as occur in sequential read and write modes of operation.

Read and program operations relating to two successive LBA stripes spanning an LBA range associated with a STAR controller implementing asynchronous die management can be executed concurrently in two die on the same channel, but not fully in parallel. Data transfers to or from the two die must be serialized, because they are sharing the same channel. The read or program operations in the two die are therefore overlapped, but not fully parallel.

The asynchronous die operation described above is an enabling feature for operation with an unequal number of die per STAR controller. The total physical over provisioning in the design of a multi-layer memory system such as described below can therefore be defined with a granularity of one die, or die-pair, which can minimize the cost of a drive for a specified level of performance.

The type of inputs received by the asynchronous die algorithm 1712 running in each of the STAR controllers may include read, write and trim commands. In embodiments where the asynchronous die algorithm is used in a multilayer drive having multiple partitions per layer, the write commands received may be further divided into write commands for different data types, such as the random and sequential data types described above. In one embodiment, the execution of certain transactions may be ordered such that read transactions are immediately processed, while write and trim commands are processed in the order received. In embodiments where a die metapage is 32 KB, a read transaction may be for any multiple of 2 KB up to a maximum of one die metapage, write transactions are one metapage and a trim transaction has a data payload length of one metapage.

Although the asynchronous die algorithm may be implemented in a memory system having multi-layer and multi-partition memory system, in other embodiments, the asynchronous die management algorithm may also be implemented on simpler memory systems having single layer die with or without partitions.

Unequal Numbers of Die Per Channel

One benefit of a flash memory system that utilizes an asynchronous die management protocol, such as described above, is the ability to expand the memory one die at a time such that a memory system may have unequal number of die per channel. In other words, one instance of a STAR controller may be associated with a different number of die than any other instance of a STAR controller in the memory system such that the number of die per STAR controller may be unequal. As noted previously, in some flash memory systems comprising multiple memory die, high write performance is achieved by linking blocks from multiple die into metablocks to which data is programmed with increased parallelism, such as with synchronous die management architecture. The total number of die in the system is therefore a multiple of the number of die across which metablocks are formed, and it is not possible to precisely control the physical capacity over provisioning, also referred to as physical overhead.

Referring again to FIG. 15, an example of an equal number of die per channel is seen in the NAND array 1500, where each of 8 channels 1502 includes 4 NAND die. In a synchronous die management scheme, for example the synchronous die management algorithm employed in the controllers 1602 such as shown in FIG. 16, an array of 8 controllers 1602 each manages 4 die from the array 1500, one die each on different channels 1502 so that the write operation by each controller 1602 utilizes a metapage that stripes across all 4 NAND die for increased parallelism. Because this type of synchronous die management requires multiple die, it is not able to handle unequal numbers of die per channel.

Using the asynchronous die management algorithm allows the number of die in a flash memory system to be controlled with a precision of one, by allowing operation with unequal numbers of die attached to the memory channels. The die level granularity of control via the asynchronous die management algorithm may help with managing the total physical overhead of a SSD. The total physical overhead of a flash storage device is defined as (Physical_capacity−LBA_capacity)/LBA_capacity.

Some physical overhead is required in a flash storage device for a number of reasons. It allows space for accumulation of obsolete data in the drive to reduce the amount of data relocation during garbage collection. Physical overhead also allows space for storage of control data and system data, as well as provides spare capacity for error management. Additionally, physical overhead can allow use of additional data storage layers using NAND technology with fewer bits per cell than in the primary data storage layer, for example the X1 layer in a Duo drive, such as an SSD consisting of two die layers such as the Duo2 or Duo3 die noted above, or the X1 and X2 layers in a Trio drive having 3 die layers.

The random write capability for a memory system is generally related to the physical overhead available in the memory system. Thus, additional physical overhead can help improve the performance of a memory system. In a maintenance operation such as garbage collection, the controller needs to relocate valid data in a block and the overhead time to do this operation depends on the percentage of blocks that contain valid data. With more over provisioning (e.g. a higher ratio of physical space to logical space), less valid data may need to be relocated from a given block.

Other tasks in a memory system that can benefit from having additional physical capacity (beyond a fixed logical capacity) include tasks such as parity schemes where the error tolerance of the memory system can be improved. If, for each page written an exclusive or (XOR) operation is performed and the result stored, then the system can be tolerant of loss of a complete page (where the error correction code (ECC) storing the data is only capable of correcting for a smaller loss of data). Excess physical capacity may be used for this or other tasks. If additional physical storage is needed for a system for reasons such as parity, the ability to include unequal numbers of die per channel allows an increase in physical capacity tailored to the specific need and without needing to, as in the synchronous algorithm discussed above, add a full set of 4 die that are necessary for the metablock writes in that example. The ability to add only a single die to any one channel may provide cost and space savings.

Figure 19:
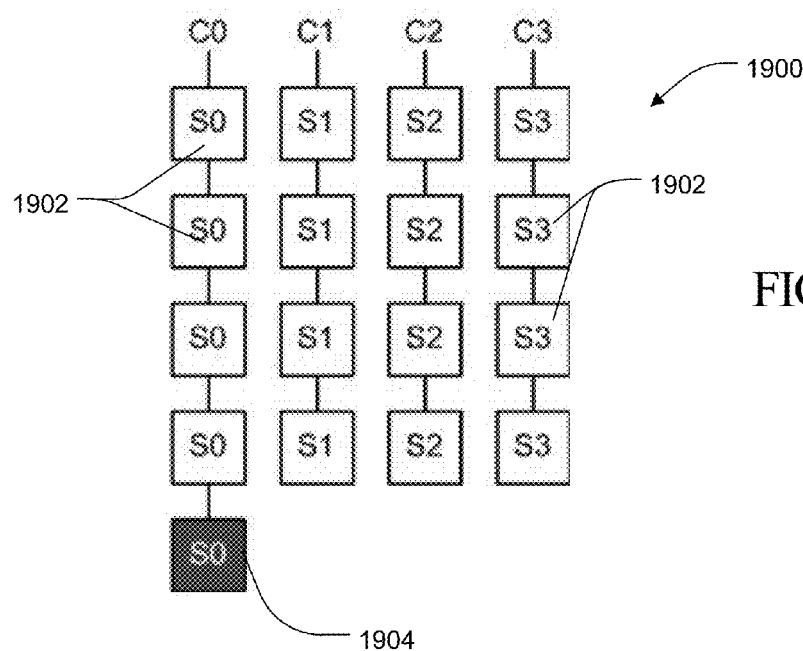
FIG. 19 illustrates a NAND die array with an unequal number of die on each of 4 different channels.

An example of an unequal die per channel arrangement is shown in FIG. 19. In the example of FIG. 19, the memory array 1900 is a four channel array (see channels C0-C3) with 4 NAND die 1902 in channels C1-C3 and 5 NAND die (including 4 NAND die 1902 and additional NAND die 1904) in channel C0. In this example, it is assumed that a separate STAR controller is assigned to each channel and that the STAR controllers incorporate the asynchronous die algorithm capabilities as shown and described with respect to FIGS. 17A-17B and 18. For ease of illustration, each die in FIG. 19 is labeled with the STAR controller number (S0-S3) that manages the particular die 1902.

Figure 20:
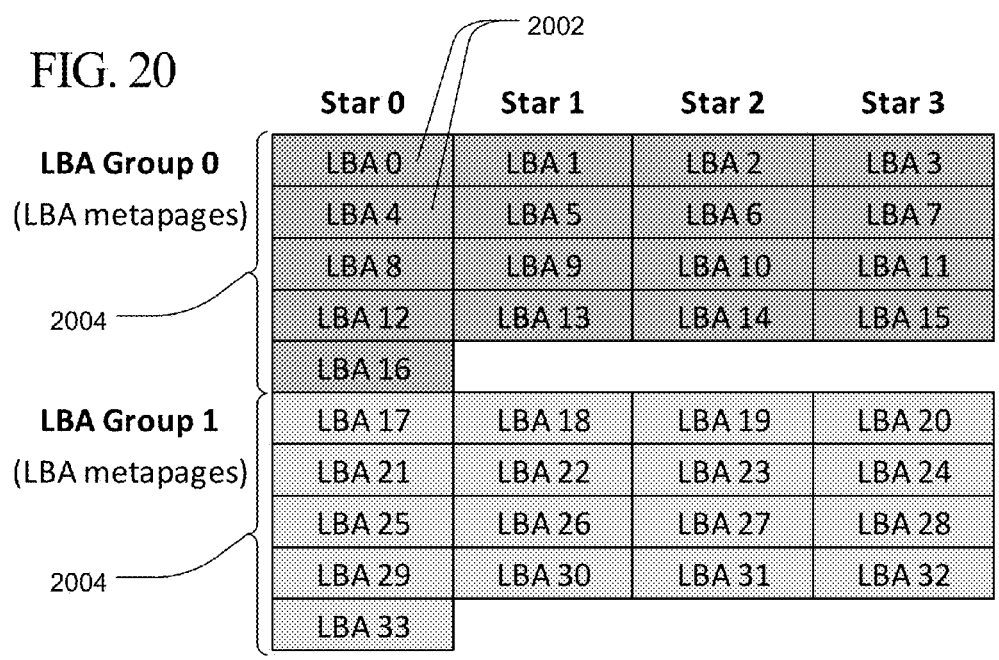
FIG. 20 illustrates an embodiment of LBA grouping to manage an array of NAND die having an unequal die distribution per channel.

Utilizing the asynchronous die management algorithm, multiple die may operate asynchronously on one channel managed by one STAR controller. Because different STAR controllers in a particular memory system need not have same logical capacity, die count can be increased asymmetrically in STAR controllers and physical overhead can be tuned in multiples of one die as shown in FIG. 20. In order to handle the allocation of logical block addresses (LBA) among the STAR controllers and adjust the physical overhead for the whole memory system when physical capacity is being increased in one, or fewer than all, STAR controllers, a scheme for LBA allocation to the STAR controllers is contemplated.

Figures 21, 22:
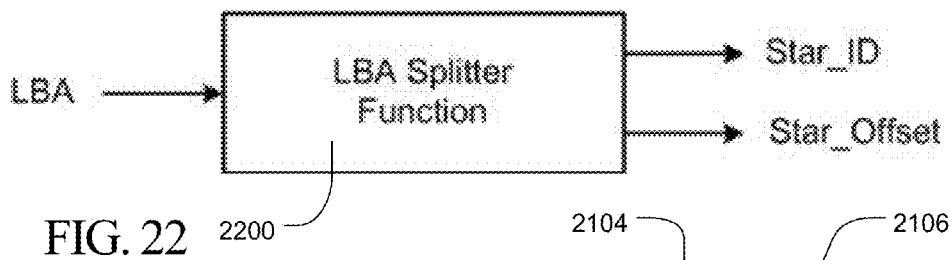
FIG. 21 illustrates a table of one embodiment of allocating LBA groups to provide an even distribution of excess capacity in the unequal die arrangement of FIG. 19.
FIG. 22 is a block diagram of an LBA splitter for implementing the LBA allocation of FIGS. 20-21.

Referring to FIGS. 20 and 21 one such LBA allocation scheme for use in the NAND array 1900 with unequal die allocation shown in FIG. 19 is illustrated. In order to manage the LBA allocation, LBA metapages 2002 are striped across successive STAR controllers in sets called LBA groups 2004. Even though the extra physical capacity in FIG. 19 is from a die 1904 only added to the first channel C0, the entire memory array 1900 benefits from the over provisioning by reallocating the fixed amount of logical address space equally over each of the die.

The structure of an LBA group in FIG. 20 mirrors the asymmetry in die allocation to STAR controllers (i.e. to each channel) in FIG. 19. As illustrated, a discontinuity in LBA allocation to successive STAR controllers occurs at the boundary between LBA groups 2004. In this manner, the fixed number of LBA addresses is assigned at the front end to each of the STAR controllers such that the physical overhead percentage is the same for each STAR controller. The allocation of LBA addresses for the example of FIGS. 19-20 is also illustrated in FIGS. 21-22 in the form of host LBA (in die metapages) number 2102, the associated STAR controller ID 2104 (in this example S0-S3) and the offset 2106 of the LBA metapage in the respective STAR controller. The management of the LBA allocation to the various STAR controllers in this unequal die per channel arrangement may be implemented by an LBA splitter function 2200 (FIG. 22) executed by a processor in the memory device that outputs the STAR ID and the STAR offset for data associated with a received LBA (for each die metapage).

Program Cycle Scheme

A program cycle is a burst of predetermined program operations within one die in which a single full programming set, as described above in Tables 1-3, is performed. It causes a defined amount of host data to be programmed in write blocks in one die-layer and predetermined consequential maintenance programming operations to be performed if necessary in each of the other die layers.

Maintenance operations required in each of the layers of a multi-layer memory need to be known in advance to allow optimum scheduling of host data write and maintenance operations. Existing schemes for maintenance operation control are reactive to host behavior, not proactive.

In one embodiment, the program cycle method described herein is a scheme for scheduling program operations in each of the memory layers to reduce the maximum latency experienced when programming data from a host. Program scheduling is managed in programming bursts called program cycles, which may span all memory layers. Maintenance operations are predetermined to create free blocks to replace those consumed in writing new data to a layer during a program cycle and each program cycle interleaves the writing of new host data with the predetermined maintenance operations. During a program cycle, a fixed amount of host data may be programmed, interspersed equally among maintenance operations. This is done to prevent a host command from experiencing an unacceptably long response time from the memory system under any rare combination of circumstances. In one implementation, during a program cycle, bursts of host data and data for maintenance operations are interleaved at a steady rate, according to the current operating state of the drive.

A die, such as the Trio die described above with two partitions per layer, normally has two program cycles concurrently active, of which one must be for each different partition. Here one cycle may be active for random host data and the other for sequential host data. As a die is generally only able to execute a single operation at a time due to physical limitations, the interleaving of the two program cycles in a die is also explicitly controlled.

In one embodiment, to implement the program cycle method, where host data operations and maintenance operations are arranged in predetermined combinations to account for various possible scenarios, a common programming unit is used. A program unit of a single metablock for the particular die layer would be acceptable if a programming operation only affected one layer of a die, or if the amount of data in a metablock was constant between all layers of a die. However, because a programming operation may lead to cascading operations on different layers, where there are differing bit per cell densities in the different layers, a metablock of data in one layer is less than a metablock of data in a higher bit-per-cell density layer in the same die. Thus the unit of data a program cycle may handle can either be a metablock of host data if the host data write operation will not result in maintenance operations outside the layer in which the host data is received, or can be a program unit sized to work efficiently with all of the layers of the die.

As used herein a program unit (PU) is constant amount of data for each type of die, i.e. Trio, Duo2 and Duo3. A PU comprises the fixed number of metapages which is the lowest common multiple of the number of metapages in the individual metablock types in the die layers (X1, X2 & X3). This allows data that is written to a layer or is moved between layers during a program cycle to always be a multiple of the metablock size within the layer in which it is programmed. An example of the PU size for specific die types is illustrated in Tables 4-6 for Trio, Duo2, and Duo3 die.

TABLE 4

Definition of PU in a Trio die

| | Nand | | Program Unit (PU) | |
|---|---|---|---|---|
| Die Type | Wordlines/Block | | Metablocks | Metapages |
| X1 layer | eX3 | 86 | 6 | 516 |
| X2 layer | eX3 | 86 | 3 | 516 |
| X3 layer | eX3 | 86 | 2 | 516 |

TABLE 5

Definition of PU in a Duo2 die

| | Nand | | Program Unit (PU) | |
|---|---|---|---|---|
| Die Type | Wordlines/Block | | Metablocks | Metapages |
| X1 layer | eX3 | 86 | 6 | 516 |
| X2 layer | eX3 | 86 | 3 | 516 |

TABLE 6

Definition of PU in a Duo3 die

| | Nand | | Program Unit (PU) | |
|---|---|---|---|---|
| Die Type | Wordlines/Block | | Metablocks | Metapages |
| X1 layer | eX3 | 86 | 3 | 258 |
| X3 layer | eX3 | 86 | 1 | 258 |

The lowest common number of metapages that consist of a whole number of metablocks in each of the layers of a Trio die and a Duo2 die is 516 metapages, while the lowest common number in the Duo3 die is 258 metapages. Thus the PU for the Trio and Duo2 is 516 metapages and 258 metapages for Duo3.

Figure 23:
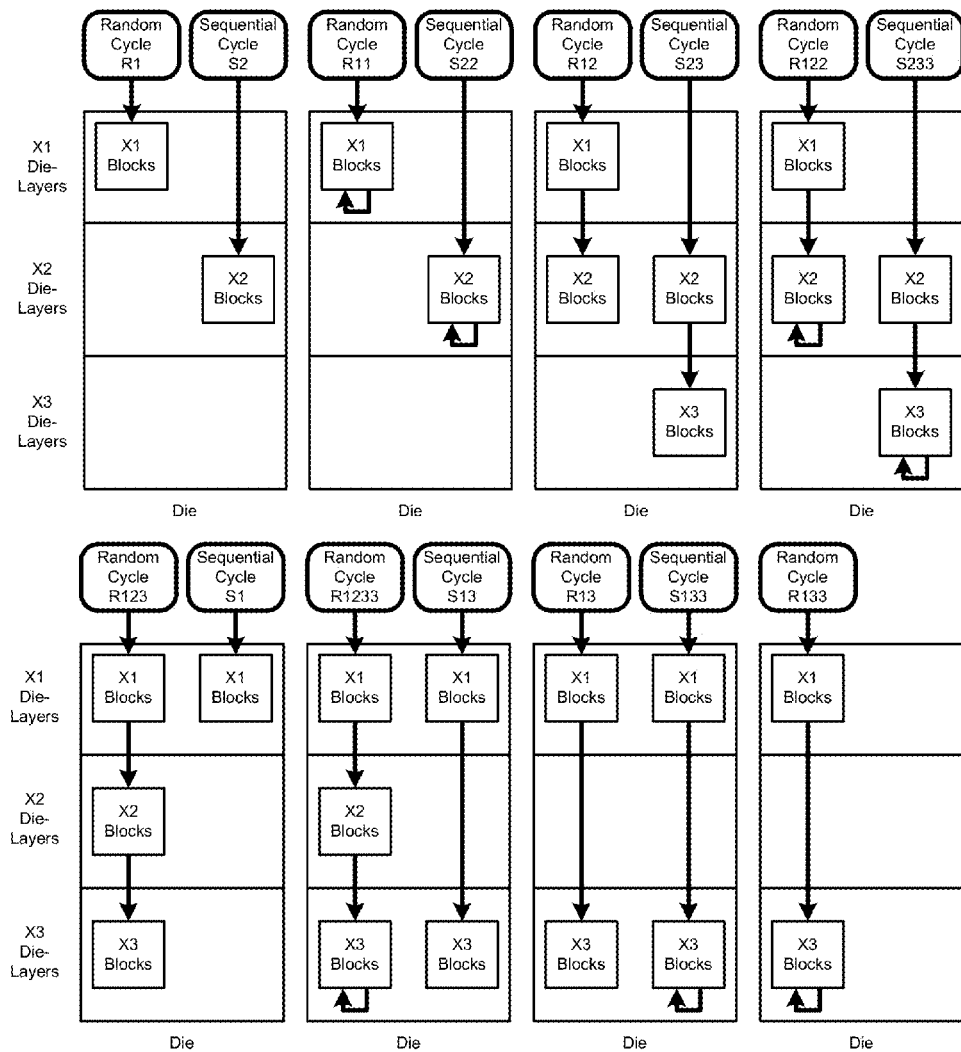
FIG. 23 is a diagram of possible combinations of concurrent random and sequential program cycles in a multi-layer die.

Utilizing the PU appropriate to the particular die, the STAR controller for the particular die can determine which of a predetermined number of program cycle types should be executed to handle the next host write of one PU's worth of data to the memory device. Referring to FIG. 23, the full set of possible program cycle types within an embodiment of the Trio algorithm for 3-layer and 2-layer memory die is illustrated. These program cycle types correspond to the programming sets defined in Tables 1-3 above. Because a die can execute a random program cycle and a sequential program cycle concurrently in one embodiment, cycles of opposite class have been arbitrarily paired in each die in FIG. 23. The particular cycles paired up at any given time in a die of an operating memory will depend on the type of host data writes that are pending and the state of the various layers of the die (e.g. the number of free blocks and ratio of valid data to LBA capacity and so on).

Figure 24:
FIG. 24 is an embodiment of a program cycle chart illustrating the decision process for moving data between layers or relocating data within layers of a multi-layer memory die.

Referring now to FIG. 24, a chart 2400 of the decision process for a STAR controller implementing the Trio algorithm, based on the die layer status (for example the number of free blocks and amount of valid data in relation to LBA capacity in each layer), is illustrated. The program cycle types listed in FIG. 24 correspond to the programming sets defined in Table 1. The STAR controller preferably selects the program cycle type that incorporates the fewest number of die layers possible, within the constraints of the die layer status as shown in FIG. 24. As noted previously, the decision criteria for whether to move or relocate data in any given layer may differ or be the same. Also, the threshold value of the particular criteria (e.g. the minimum number of free blocks) may be the same or differ in each layer. The term "N" in N blocks or N PU's of FIG. 24 refers to the number of relocation blocks that must be completely filled in a reclaim cycle to achieve a net gain of one free block. The data paths which can be used to link die-layers in a selected program cycle are described in FIG. 12. As noted previously, the STAR controller may have two program cycles active in a die, one for each partition, at a time, with each of the two program cycles being interleaved with the other.

Program Scheduling Scheme

As noted above, the program cycle needed for the next host data write is determined prior to the next host data write. When a program cycle has been defined according to the available program cycle types in FIG. 24, the precise numbers of metapages to be programmed in each of the die-layers in the course of the program cycle are known in advance. However, in one embodiment, a die normally has only two concurrently active program cycles (one for each partition), which have been initiated completely asynchronously. The interleave ratio between maintenance programming operations and host data programming operations for a program cycle which is being initiated therefore has to take account of outstanding program operations in the program cycle which is already active. No change is made to the interleave ratio for the active program cycle.

A program interleave scheme according to the following principles is adopted for interleaving operations for two program cycles in a die to create a flow of host data and maintenance program operations. A program cycle in a die may be initiated only after a previous cycle of the same class (random or sequential) has completed. A program cycle may be initiated in a die when a program cycle of the opposite class (random or sequential) is already active in the die, and the two cycles may overlap.

When overlapping program cycles have maintenance operations in the same die-layer, the maintenance operations in the first cycle must complete before maintenance operations in the second cycle can be started. When overlapping program cycles have maintenance operations in different die-layers, the maintenance operations in the die layers may be performed concurrently. Host data write operations in a program cycle being initiated must be interleaved with both maintenance operations in the same cycle and outstanding maintenance operations in the active cycle that is being overlapped.

When a program cycle is initiated, separate interleave ratios are defined for the minimum number of maintenance operations in each die-layer that must be performed per host data write operation in the cycle. During execution of a program cycle, a host data write operation is permitted only if the number of maintenance operations already performed in each die-layer per previous host write operation is greater than or equal to the required interleave ratio for each die layer.

Also, if a program cycle is initiated while a background cycle is active in the other partition, the interleave ratio established for the new program cycle must include all maintenance operations in that cycle together with all outstanding maintenance operations in the background cycle, as discussed in greater detail below in the section regarding background cycles.

An object of the program scheduling algorithm executed by a STAR controller for each die it is managing is to schedule together the writing of host data and maintenance operations during each program cycle in a manner that provides as uniform a rate of writing host data as possible. This is accomplished by essentially reducing the rate that host data is written so that host writes and maintenance writes are evenly distributed. The program scheduling algorithm in the controller will permit the controller to balance the multiple PU's that are being written (host or maintenance writes) in a die during a program cycle or overlapping program cycles. The program scheduling algorithm can compensate for unknown rates at which host data may be received at the particular die and for concurrently running program cycles on the particular die. As part of the program scheduling method, the controller will permit maintenance operations to proceed in a program cycle if host data is delayed so that the maintenance operations may sometime get ahead of the required maintenance operation to host write ratio for a given program cycle, but will limit host write operations to be within the required ratio of maintenance operations to host write operations so that there should not be a need to catch up on maintenance operations in a die.

Figure 25:
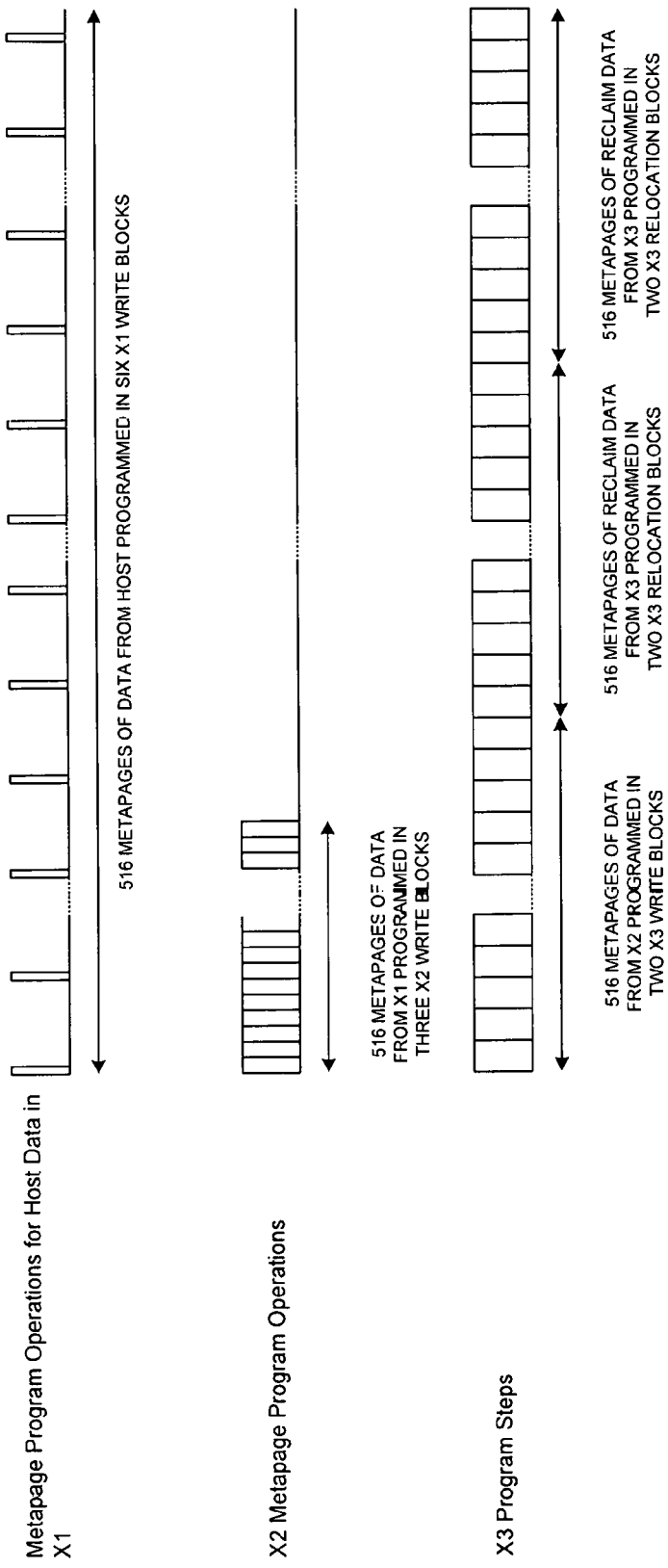
FIG. 25 illustrates an example of interleaving between host write and maintenance operations in each layer of a multi-layer memory die during one program cycle.
Figure 26:
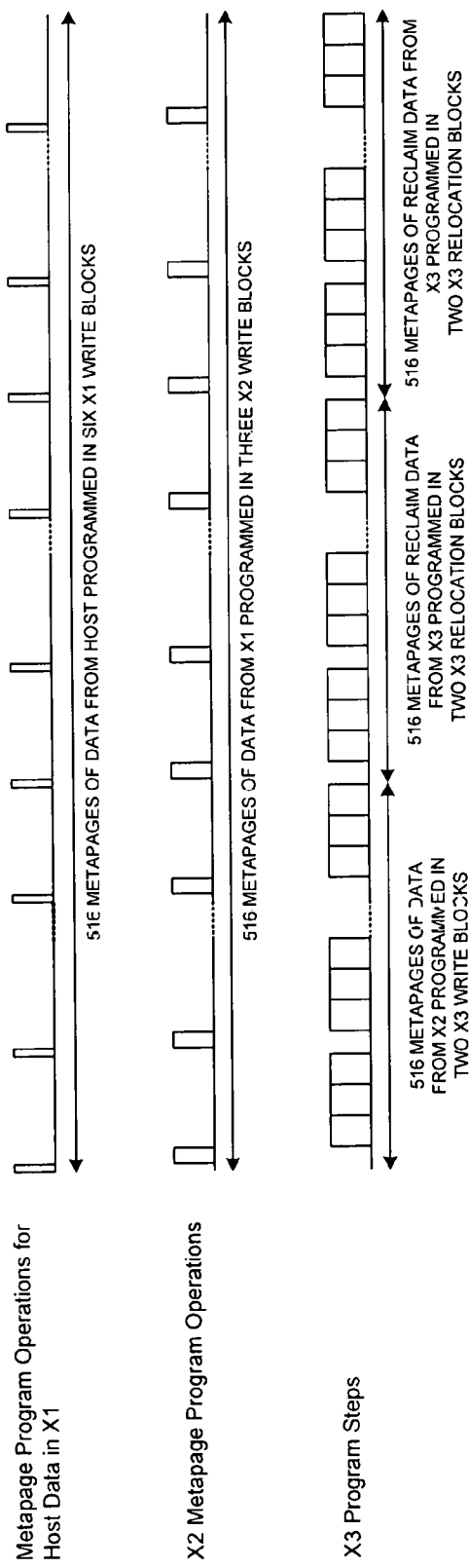
FIG. 26 is an alternative interleaving pattern of host data writes and maintenance writes to the example of FIG. 25.

An example of interleaving between host write and maintenance operations in each layer during one program cycle (in this example a R1233 cycle as set out in FIGS. 23 and 24) is shown in FIGS. 25 and 26. In FIG. 25, it is assumed that each of the X1, X2 and X3 layers are on separate die and the PU for the transaction is 516 metapages. Thus, the programming in all of the layers in FIG. 25 can happen simultaneously. The amount of host data written into the X1 layer, however, is interleaved with the simultaneous maintenance activities in the X2 and X3 layers of the different die so as to spread out the X1 host data write over the time that the slower maintenance process in the X3 layer requires. Thus, the one PU of host data is not written all at once, but is instead spaced out in time in FIG. 25 and interleaved with the X2 and X3 maintenance operations required for the program cycle so that the interleave ratio for each layer (X1, X2, X3) of page writes of host data to page writes of maintenance data during the specific program cycle is maintained and not exceeded. The program scheduling algorithm in the controller will allow the controller to reduce the rate of host page writes (here to X1) within the PU such that the interleave ratios for each layer never exceed the number host write operations to maintenance operations within a program cycle. If all three layers are on the same die, as illustrated in FIG. 26, then the writes to each layer are interleaved, but in a staggered manner because of the general physical limitation that only one operation can execute at a time on a single die.

Figure 27:
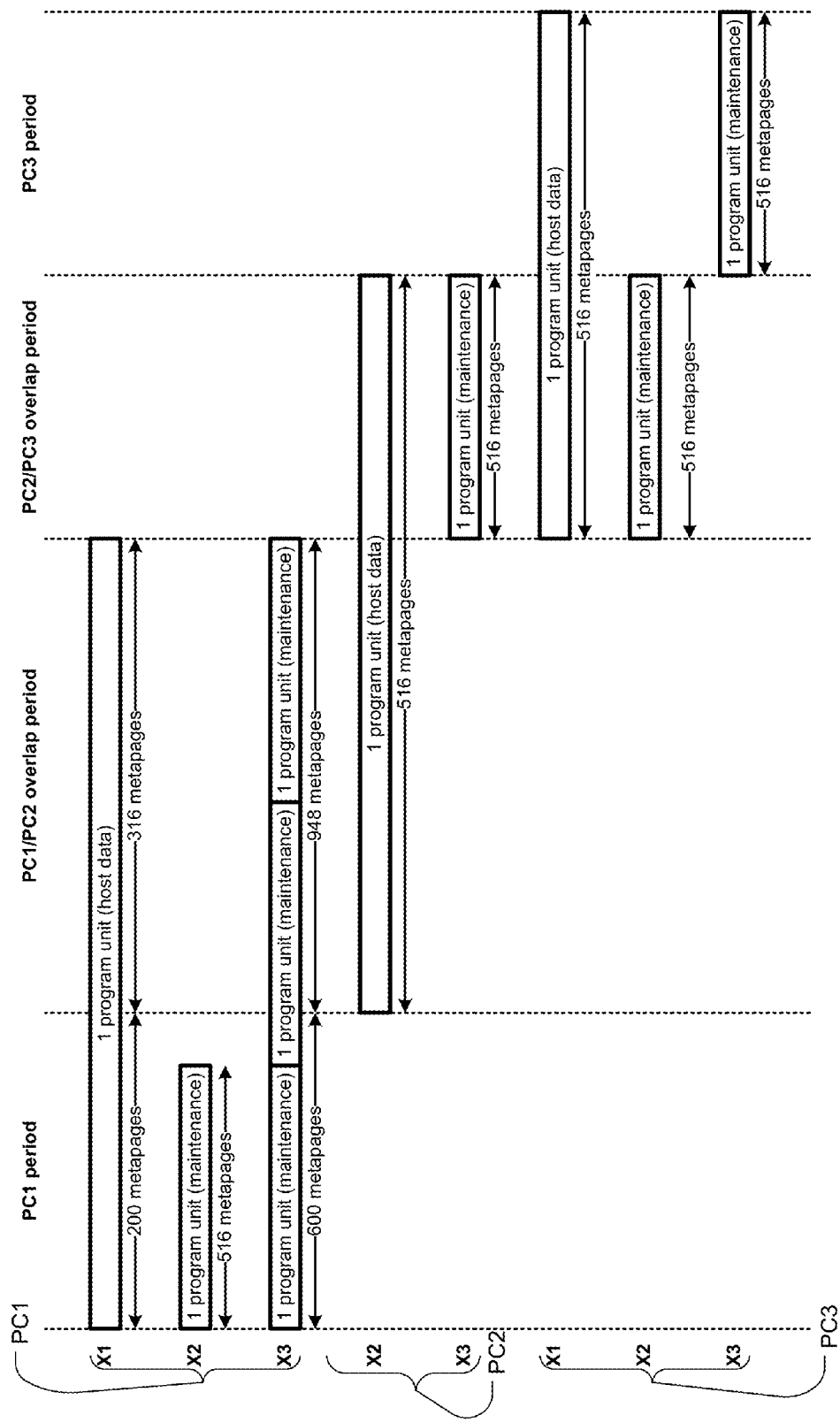
FIG. 27 is an example of overlapping program cycles in a die.

An example of the overlapping of program cycles in a particular die is shown in FIG. 27. In FIG. 27, it is assumed that the die is a Trio die (3 layers) and the decision process used by the controller managing the particular die for selecting which program cycle to implement is that of FIG. 24. The serial programming cycles shown in FIG. 27 are a R1233 programming cycle PC1, an S23 programming cycle PC2 and an R123 programming cycle PC3. For purposes of this example, PC1 is initiated when no other program cycle is active in the die, and therefore operates with interleave ratios relating only to itself. In this case 1 PU of data is written to the X2 layer and 3 PU's of data are written to the X3 layer. Thus the X2:host interleave ratio is 1 and the X3:host interleave ratio is 3.

Program cycle PC2 of type S23 is initiated (arbitrarily) after 200 metapages of host data have been programmed in PC1, and overlaps PC1. The number of maintenance operations in X3 that must be interleaved with host data program operations in PC2 is 1464 metapages, comprising 948 metapages outstanding in PC1 and 516 metapages in PC2. Thus the X3:host interleave ratio is 2.84 (=remaining maintenance metapages into X3/host data into X2=1464/516=2.84)

Program cycle PC3 of type R123 is initiated when PC1 completes, but its maintenance operations in X3 cannot be started until those for PC2 have completed. However, maintenance operations in X2 can start immediately, as no overlapping program cycle is performing maintenance in X2. At this point, the X2:host interleave ratio is 1 and the X3:host interleave ratio is 2.

If the arrival rate of host data matches or exceeds the rate of performing maintenance operations required by the interleave ratios for a program cycle, the cycle proceeds with uniform interleaving of host data metapages and bursts of maintenance metapages. In this case, the program cycle is complete when the last metapage of maintenance data has been programmed.

However, if the cumulative arrival rate of host data is lower than can be accommodated by the program cycle in accordance with its required interleave ratios, all required host data will not have been programmed when the last metapage of maintenance data has been programmed. The program cycle is therefore not complete. The program cycle remains open with its host data write block open, but with maintenance inactive. Further host data can be written to the program cycle without need for interleaved maintenance operations. The program cycle is only complete when all required host data has been programmed, that is, a full metablock or full PU has been programmed, depending on program cycle type.

An advantage of the program cycle scheme discussed above is that it permits advanced determination of the necessary maintenance operations to free up a programming unit's worth of space in advance of a subsequent host write. As part of the program schedule scheme, a set of linked layers within the plurality of die in which one program cycle will be performed are identified. The linked layers may be in one die or, in a plurality of die. The process may allow a layer within a die to be incorporated in only one program cycle for a specific type of data (e.g. random or sequential) and may allow a layer within a die to be incorporated in two program cycles for different types of data.

As noted above, it is advantageous to know in advance what maintenance operations are required in each of the layers of a multi-layer memory to allow optimum scheduling of host data write and maintenance operations. Existing schemes for maintenance control are generally reactive to host behavior, not proactive. In one embodiment, host data programming operations and maintenance programming operations to relocate data to a different block are determined in advance for a sequence of operations about to be started. Each programming sequence incorporates a fixed length of host data (e.g., one program unit) and variable lengths of maintenance data (multiple program units). Required interleave ratios for all types of maintenance programming relative to host data programming are determined in advance and host data programming is permitted only when sufficient maintenance programming has been completed to satisfy all interleave ratio requirements. This mechanism allows host data program operations to be uniformly scheduled among maintenance program operations. Thus, a minimum level of responsiveness to host data is maintained on a program cycle by program cycle basis.

A method of interleaving the programming of host data into a memory system and the relocation of data between blocks in the memory system may include predetermining the amount of host data and the amount of relocated data to be programmed during an operating sequence. For each type of block to be programmed with relocated data, its required program interleave ratio is predetermined relative to host data. During a program cycle, the controller may determine the current cumulative program interleave ratio relative to host data for each layer being programmed allowing host data to be programmed if the current cumulative program interleave ratio for each layer exceeds its required program interleave ratio.

This cumulative program interleave ratio is the ratio of page writes for the host data to maintenance operation writes during a particular program cycle. The controller will permit the number of maintenance operation writes to exceed the interleave ratio if there is a delay in receiving host data for a program cycle, but will not allow host data writes to exceed the interleave ratio. When there are concurrent overlapping program cycles happening in a layer, the particular required interleave ratio may be a modified interleave ratio, such as that calculated in FIG. 27 for the program cycle PC2 (ratio=2.84) which overlapped an ongoing program cycle in the second partition for the die layer. In those instances, the program scheduling algorithm executed by the controller will compare the cumulative interleave ratio during a cycle to the modified interleave ratio to make sure write operations in a cycle do not exceed that modified interleave ratio.

Figure 28:
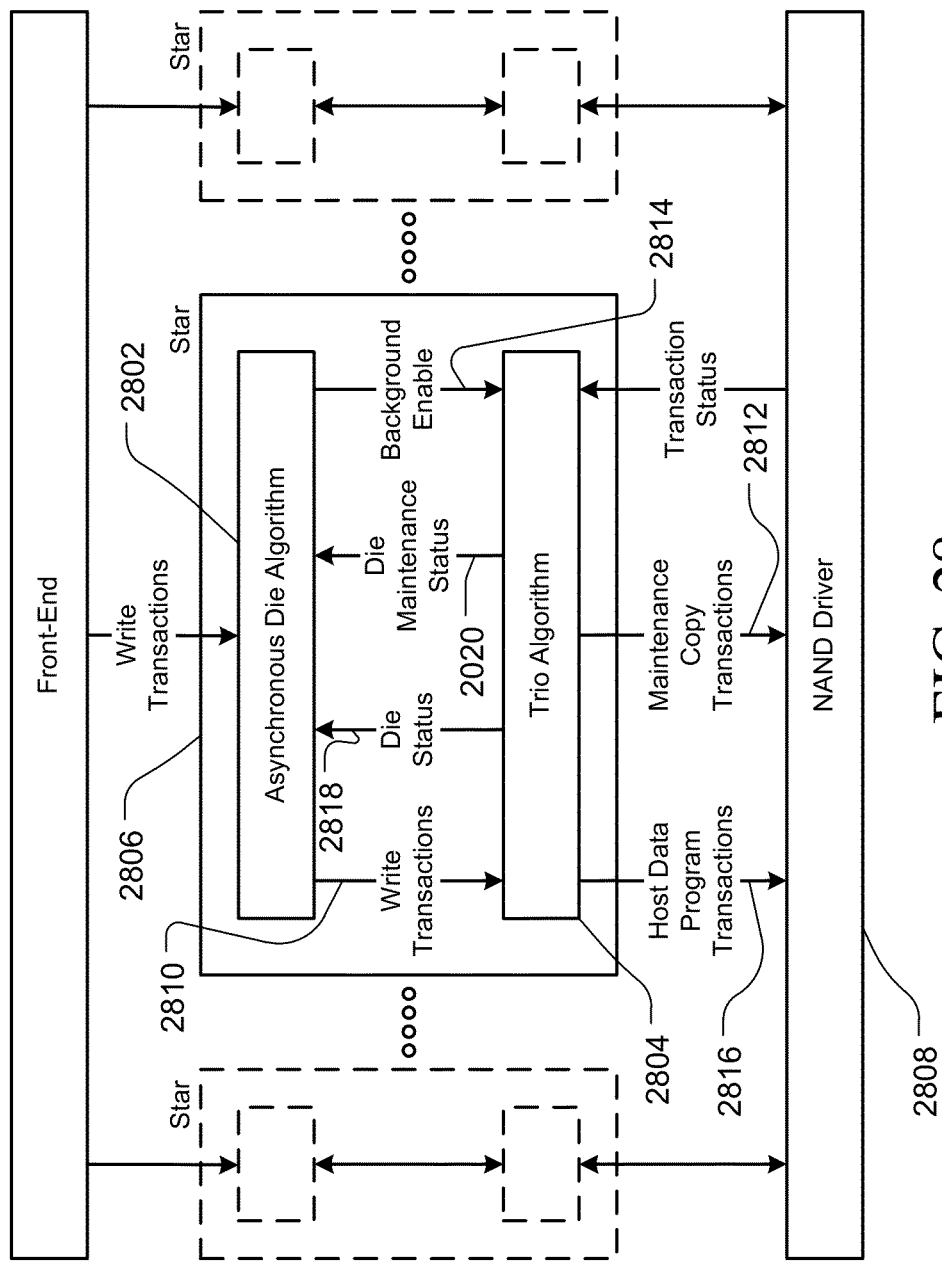
FIG. 28 shows a portion of the memory system of FIG. 17A illustrating how algorithms operate within a controller to schedule program and maintenance copy operations.

Referring to FIG. 28, a portion of the memory system of FIG. 17A is shown illustrating how the asynchronous die algorithm 2802 and Trio algorithm 2804 operate together within each STAR controller 2806 to schedule program and maintenance copy transactions which are to be executed by the NAND Driver 2808. The Trio algorithm 2804 defines and initiates program cycles and manages maintenance operations within them. Program operations in NAND die are triggered by both host data program transactions (write transactions 2810) issued by the asynchronous die algorithm 2802 and copy transactions 2812 issued by the Trio algorithm for maintenance operations. These are converted by the NAND Driver 2808 into descriptors to control the datapath and NAND components.

The Trio algorithm predetermines any maintenance operations which have to be performed together with the host data program operations, and the program scheduling algorithm manages the interleaving of host data program transactions 2816 and maintenance copy transactions 2812 for execution by the NAND Driver 2808.

An enable signal from the Trio algorithm 2804 signals when the asynchronous die algorithm 2802 can interleave host data program transactions with the maintenance copy transactions 2812 being created by the Trio algorithm 2804. Host data program transactions 2816 are enabled when the ratio of the number of maintenance metapage copy transactions issued by the Trio algorithm 2804 divided by the number of host data program transactions 2816 within the current program cycle are greater than or equal to the required interleave ratio for each layer.

Program transactions may have higher priority than copy transactions within the NAND Driver 2808, and therefore take precedence for execution over queued copy transactions. This means that host data program transactions 2816 issued by the asynchronous die algorithm 2802 when enabled by the Trio algorithm 2804 will be executed as the next transaction, ahead of pipelined maintenance copy transactions 2812 already present in the NAND Driver 2808. The Trio algorithm also provides die status 2818 and maintenance status 2020 information to allow the asynchronous die algorithm 2802 to generate a background enable 2814 to enable background operations in a Trio die.

With respect to scheduling operations within a STAR controller 2806, the following transactions are passed to the NAND Driver by the STAR controller 2806: read, program, erase and copy. The execution priorities for these transactions in the NAND driver may be as follows: an outstanding read transaction for a die has absolute priority over any other transaction type for that die. Outstanding program, erase & copy transactions for a die are executed with the following preferred priority: program, erase, copy.

The NAND driver 2808 may over-ride this preferred priority order when constructing a set of descriptors for parallel operation in one track. Transactions of the same type for a die-layer must complete in the order they are issued to the NAND driver. Transactions of different types for a die-layer may complete in a different order from that in which they are issued to the NAND driver. Execution of program steps for transactions of the same type for different die-layers should cycle equally between the die-layers.

In one embodiment, while NAND operations initiated by a sequencer descriptor cannot be interrupted, transactions sent to the NAND driver may be interrupted in some cases. Transactions in X1 or X2 die-layers cannot be interrupted, however a copy transaction for an X3 die-layer that is in progress may be interrupted by any outstanding read or program command for the same die. The outstanding read or program command may be executed at the end of the program step currently in progress.

With respect to responses from NAND driver 2808, the following responses may be provided by the NAND Driver to transactions sent to it by a STAR controller 2806. For a read transaction, a single response is sent when all data is in DRAM. For an erase transaction, a single response is sent when the block erase is complete. For a program transaction in X1 or X2, the following responses may be sent: a first response is sent when all descriptors relating to execution of the transaction have been loaded to the datapath hardware; and a final response is sent when the program operation is complete. For a copy transaction in X1 or X2, the following responses may be sent: a first response is sent when the data has been read and transferred to DRAM and all descriptors relating to execution of the transaction have been loaded to the datapath hardware; and a final response is sent when the program operation is complete. For a copy transaction in X3, the following responses may be sent: a first response is sent when the data has been read and transferred to DRAM and all descriptors relating to execution of the first program step for the transaction have been loaded to the datapath hardware; a second response is sent when the first program operation is complete; a third response is sent when the second program operation is complete; and a final response is sent when the third program operation is complete. In different embodiments, a maximum number of transactions of each type per die that may be outstanding may be set before a final response to the transaction has been issued by the NAND driver.

As noted above, an instance of the STAR controller has no knowledge of the existence or state of any other instances of STAR controllers. However, the NAND Driver schedules issuance of descriptors to the sequencer hardware with the objective of maximizing data throughput in NAND memory and minimizing idle time in individual NAND die. Operations grouped in a track should have similar expected duration. In one implementation, the following rules should be observed. Cached program and read commands should be used wherever possible, to allow concurrent data transfer and NAND program or read operations in a die. Descriptors in a track should relate to operations of a single type, i.e. read, program or erase. Descriptors in a track relating to program operations should be for a single NAND type, i.e., X1, X2 or X3. Descriptors in a track relating to program operations should be for the same page type (lower or upper) in X2, or same program step type (LM, foggy or fine) in X3.

Reclaim Cycle Scheme

As noted above, a program cycle causes a defined amount of host data to be programmed in write blocks in one die-layer and predetermined consequential maintenance programming operations to be performed if necessary in various die layers for each die. Two types of maintenance operations, moving valid data between die layers and reclaiming blocks by relocating valid data within a layer from select closed blocks (previously programmed blocks with obsolete data) designated reclaim blocks have been described in particular.

Referring again to FIGS. 8-9, the general movement of data in a reclaim operation in a STAR controller is shown, where valid data from various selected reclaim blocks is moved contiguously into a relocation block 802. In embodiments where each die layer in a multi-layer die includes multiple partitions, the reclaim operation relocates data from blocks associated with data from a particular partition into one or more relocation blocks assigned exclusively to data from that partition in the same layer. The reclaim blocks that are emptied of valid data may then be erased and available in the free block pool for the die layer and later used for either partition depending on current demand for space for a particular data type.

In some types of NAND memory, there may be a requirement that no blocks in a layer of the memory are left partially programmed at the end of an operation to reclaim capacity occupied by obsolete data in blocks in that layer. Also, it is desirable to obtain a net gain of at least one free block for every group of reclaim operations for use in achieving the efficiencies of the program cycles described above.

A reclaim cycle scheme is defined herein as a variable duration reclaim operation having a duration sufficient to satisfy both the criteria of leaving no relocation block partially programmed at the end of a reclaim operation and obtaining a net gain of at least one free block. In one embodiment, a reclaim cycle is a set of maintenance operations within a program cycle, which causes data to be relocated from one or more reclaim blocks within a die-layer to one or more relocation blocks within the same die-layer. The number of reclaim blocks erased must be at least one greater than the number of relocation blocks allocated and filled, that is, a reclaim cycle must show a net gain of at least one free block.

Figure 29:
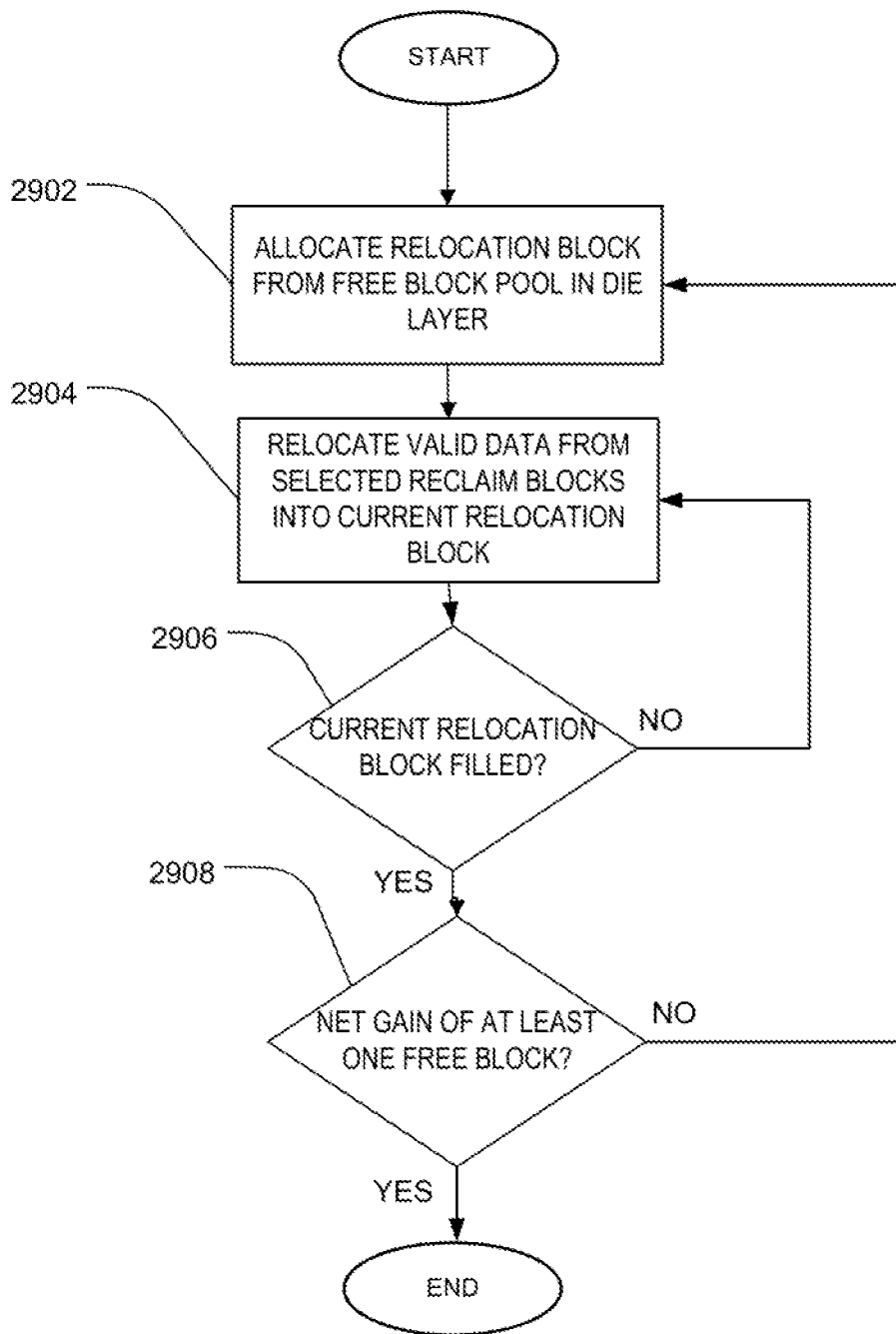
FIG. 29 is a flow diagram of a block reclaim cycle.

Referring to FIG. 29, a reclaim cycle may include the controller for the particular die allocating a block from the free block pool for the appropriate die layer as a relocation block (at 2902). All valid data from a string of selected reclaim blocks is relocated to the current relocation block (at 2904). When the current relocation block becomes filled (at 2906), if the number of blocks in the free block pool is one or more higher than the number at the start of the reclaim cycle, such that there is a net gain of at least one free block (at 2908), the reclaim cycle is complete. If either the current relocation block has not been filled (at 2906), or there has not been a net gain of at least one free block (at 2908), then the relocation of data from reclaim blocks to relocation blocks continues.

Thus, for relocation within a layer, the controller preferably performs data relocation operations from a plurality of source blocks in a memory layer to fill an integral number of destination blocks in the same memory layer, which creates at least one free block in the memory layer. This is in contrast to a maintenance operation for moving data between layers of a die. In that instance, a data move operation from a plurality of blocks in a source memory layer to fill one block in a destination memory layer creates at least one free block in the source memory layer.

Figure 30:
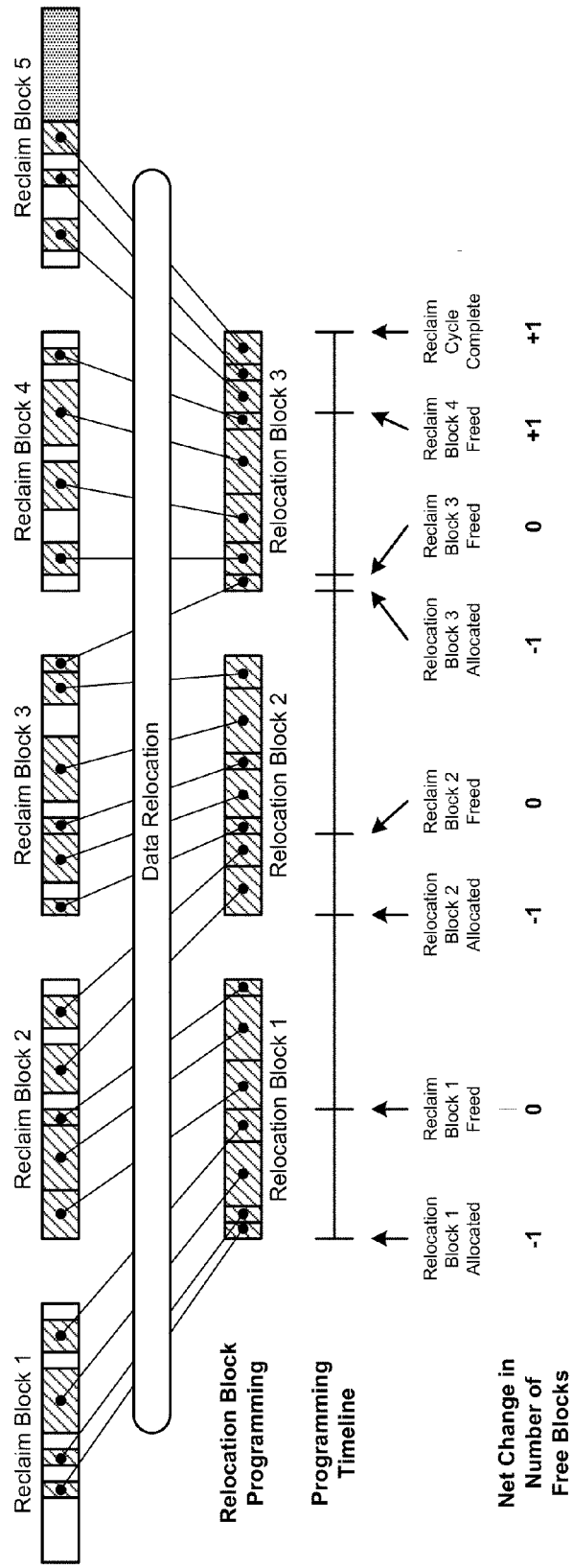
FIG. 30 is a block diagram of an example reclaim cycle according to the flow diagram of FIG. 29.

In the reclaim cycle, an integral number of relocation blocks must be filled, but data may be relocated from a non-integral number of reclaim blocks. An example of a reclaim cycle performed according to the method described in FIG. 29 is illustrated in FIG. 30. Referring to the programming timeline, a first relocation block (Relocation Block 1) is allocated from the free block pool and valid data from Reclaim Block 1 is relocated into Relocation Block 1. When Reclaim Block 1 is then freed up after all its valid data has been moved, the net gain of free blocks is 0 because one free block was used for Relocation Block 1 and freeing up Reclaim Block 1 merely maintains the status quo. Accordingly, the reclaim cycle in FIG. 30 continues with allocation of Relocation Block 2 and Relocation Block 3, and the contiguous remapping of valid data from other designated reclaim blocks fills Relocation Block 3 while freeing up four Reclaim Blocks (Reclaim Blocks 1-4) for a net gain of 1 free block. It should be noted that to completely fill Relocation Block 3, some, but not all, valid data from Reclaim Block 5 was necessary. Once the criteria of completely filling an integer number of relocation blocks and achieving a net gain of one free block has been accomplished part way through relocation of the valid data from Reclaim Block 5, the reclaim cycle stops. The remaining valid data in Reclaim Block 5 may be relocated in a subsequent reclaim cycle. While the example of FIG. 30 shows a situation where 5 reclaim blocks are needed to fill up 3 complete relocation blocks and achieve a net gain of one free block, the reclaim cycle scheme will adapt to different ratios of reclaim and relocation blocks to achieve the two criteria. Differing amounts of valid data that need to be moved from different reclaim blocks will change the number of reclaim and relocation blocks necessary to complete a reclaim cycle.

Reclaim cycles are used within both program cycles and background cycles. In a background cycle, as described below, only one relocation block is filled and there is no requirement for a net gain of one free block.

Background Cycle Scheme

In addition to the maintenance operations (e.g. block reclaim in a given die layer or movement of data from one layer to a next layer) that take place during a program cycle while write commands are pending, a modified background cycle scheme is contemplated in one embodiment. The purpose of background operations in a die is to increase the numbers of free blocks in its die-layers to be greater than the minimum numbers required to support foreground operations in the die. This allows subsequent foreground operations to be executed with fewer maintenance operations, with consequently higher performance for the memory system.

Background operations can only be executed in an idle die. A die is idle if no host data write transactions are queued for execution in the die and no maintenance operations are active in the die. Background cycles may be concurrently active in any number of idle die, however only one background cycle at a time may be active in any given die. In a memory system architecture arranged with an asynchronous die management algorithm, for example one of the STAR controllers illustrated in FIG. 17A and discussed in detail above, the STAR controller can initiate and manage background cycles in multiple idle die concurrently.

A background cycle operates within a single die-layer. It creates free space in the die-layer by performing reclaim operations as described above. One background cycle causes one relocation block (e.g. a metablock) within the selected die layer to be filled with valid data relocated from two or more reclaim blocks. Note that a single background cycle in a layer of a die may not result in the net gain of a free block, but that sustained execution of background cycles in a die-layer produces a progressive increase in the number of free blocks. A background cycle performs relocation of data within a single die-layer. Data can only be moved between die-layers within program cycles in one embodiment, which are foreground operations.

A background cycle in a die may be initiated when the die idle condition is signaled from the asynchronous die algorithm and no background cycle is currently active in the die. Background cycles preferably will not be initiated in a die layer where the total amount of valid data for the die layer exceeds a maximum amount, or where the fraction of unused data capacity in the die layer that exists as free blocks (a "reclaimed ratio") is above a predetermined threshold.

The reclaimed ratio may be calculated according to the formula: reclaimed ratio=F/(F+O) where F is the amount of free space in free blocks for a layer and O is the amount of obsolete data in all closed (fully programmed) blocks in the layer. As shown in FIG. 31, the total data capacity in a die-layer 3102 is the capacity available for data blocks that have been closed after being fully programmed. It is the total physical capacity of the die-layer minus capacity occupied by reserved blocks 3104. These reserved blocks comprise blocks for information other than host data (e.g. control data), data blocks that have been partially programmed and are still open, and the minimum number of free blocks necessary for foreground operation.

This total data capacity may comprise capacity occupied by valid data in closed data blocks (V), obsolete data in closed data blocks (O), and capacity in excess free blocks (F). Excess free blocks are free blocks in excess of the minimum number of free blocks that are required for foreground operation. Background operations convert obsolete data capacity in closed data blocks into capacity in excess free blocks by performing reclaim operations.

As noted above, the ratio F/(F+O) in a die-layer is known as the reclaimed ratio for the die-layer, and is the fraction of the unused data capacity that has been converted to free blocks. A maximum value exists for the reclaimed ratio, which is applied whatever the volume of valid data in the die-layer. A background cycle cannot be initiated if the maximum reclaimed ratio has been reached, and background operations in the die-layer must stop until further obsolete data is created by overwrite or trim operations, or free blocks are consumed by further valid data writes. The reclaimed ratio may be a static number designed into the memory device. Use of a reclaimed ratio as a criterion in initiating a background cycle makes the background operation more efficient by avoiding operations in layers where there is hardly any obsolete data, preventing lengthy operations with minimal gain. The reclaimed ratio threshold may be the same or different for each layer type in a die.

FIG. 32 shows the capacity distribution in the same die-layer as FIG. 31 after a subsequent period of sustained background reclaim operations. Here, some obsolete data capacity (O) has been converted into free block capacity (F) as compared to the distribution in FIG. 31. In one embodiment, background operations also cannot be initiated in a die-layer if the amount of valid data in the die-layer exceeds a maximum limit 3302, such as shown in FIG. 33. Thus, FIG. 33 illustrates the same die-layer as in FIG. 32 at a point where the amount of valid data has reached a predetermined maximum allowable limit 3302. The physical capacity of a memory device must exceed the logical capacity.

Figure 34:
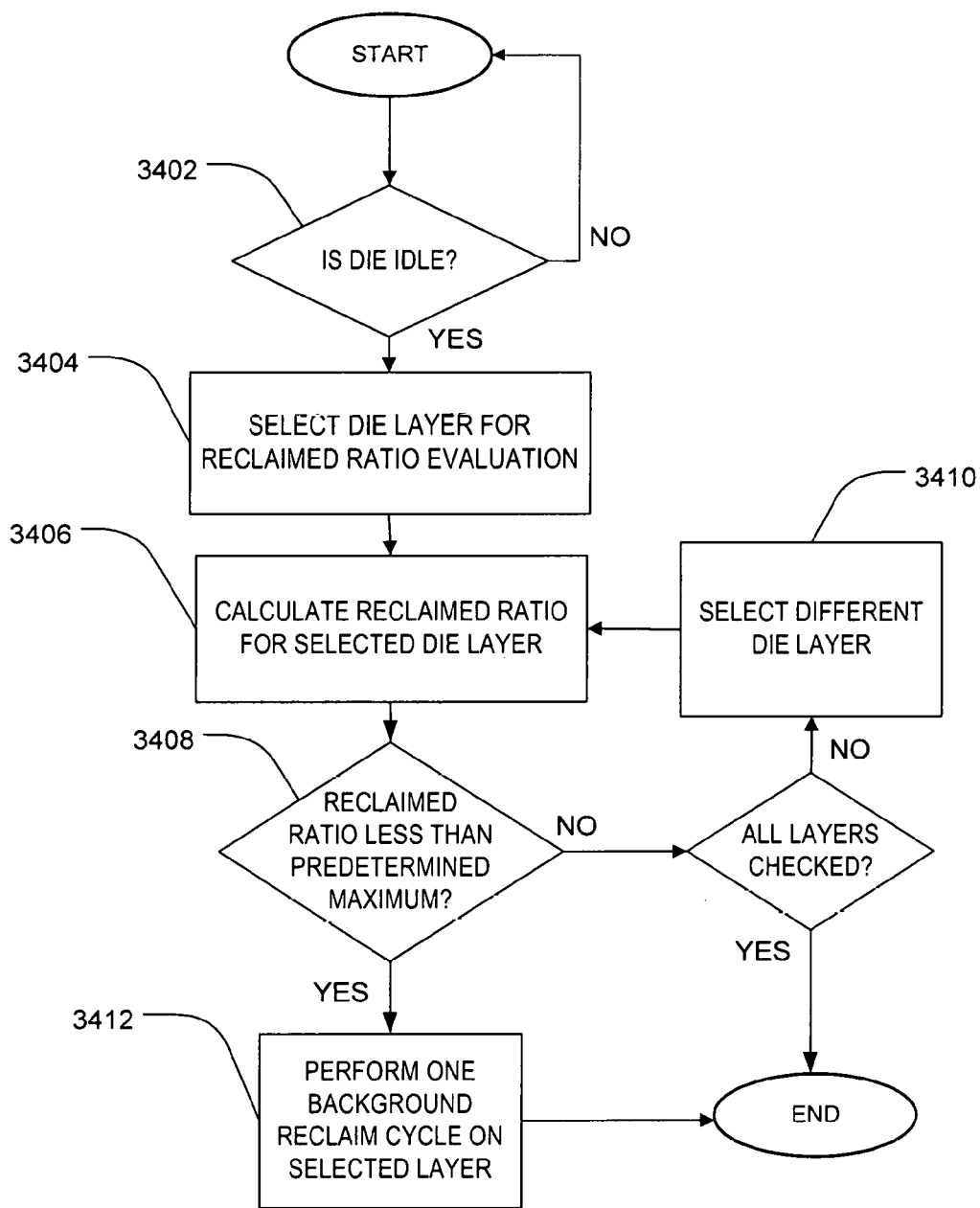
FIG. 34 is a flow diagram of a background maintenance process in die.

FIG. 34 illustrates one method of implementing a background cycle in a multi-layer die. The process of FIG. 34 may be performed for each die managed by a STAR controller such that multiple background processes may be concurrently active for a STAR controller. If the controller determines, for example from the asynchronous die algorithm, that a die is idle (at 3402), then the controller will evaluate die-layers within the idle die to see if the reclaimed ratio for a die layer is less than a predetermined threshold for its layer type. The controller selects a die layer, in one implementation, on a round robin basis such that if, in a Trio die, the X1 layer of a particular die was selected for a background cycle in the last round, then the controller will first evaluate the X2 die layer the next time the die is idle and the controller will select a die layer to evaluate (at 3404). The controller will calculate the reclaimed ratio as noted above for the selected layer (at 3406) and compare the result to the predetermined maximum threshold for the die layer (at 3408). If the reclaimed ratio exceeds the predetermined maximum threshold, the next die layer is selected (at 3410) if there are any layers in the die that have not been checked in this cycle. If the reclaimed ratio is less than the predetermined maximum threshold (at 3408), then the controller will perform one background reclaim cycle in the selected layer (at 3412). Thus, a die-layer being evaluated should only be selected if its reclaimed ratio is less than a defined maximum reclaimed ratio for its layer type and background cycles are terminated if no die layer can be selected.

Also, the selection of a partition within a die layer may be made using the same principles discussed above with respect to selection of a partition for movement and relocation in foreground maintenance operations in program cycles. For example, if there are no closed blocks in the partition, or if the partition contains less obsolete data capacity in its closed blocks, then that partition is not selected in that die layer. Generally, for a selected die layer the controller may select the partition with the lowest average valid data count per closed block. Within the selected partition of the selected die layer, the reclaim block selected (i.e. the closed block with obsolete data) may be the one with the least amount of valid data.

If a host data program transaction is issued to a die while a background cycle is active on the die, host data program operations have higher priority in the NAND Driver than the data copy operations used in the background cycle. Host data programming therefore has priority, and further relocation of background cycle data takes place only when no host data program transactions are pending.

If a full PU of host data has been written and a program cycle completed before a background cycle in the same die has completed, a new program cycle is initiated in the die. If the program cycle does not incorporate maintenance operations in the die-layer in which the background cycle is active, the outstanding operations in the background cycle are interleaved by the NAND Driver alternately with maintenance operations in the same die. Background operations are therefore automatically interleaved with host data program operations without being explicitly included in the interleave ratio of the program cycle. However, if the program cycle does incorporate maintenance operations in the die-layer in which the background cycle is active, the outstanding operations in the background cycle should be completed before maintenance operations in the layer are started, and the background operations may be included in the calculation of interleave ratio for the die-layer in the program cycle.

Die Package Configurations

Figure 35:
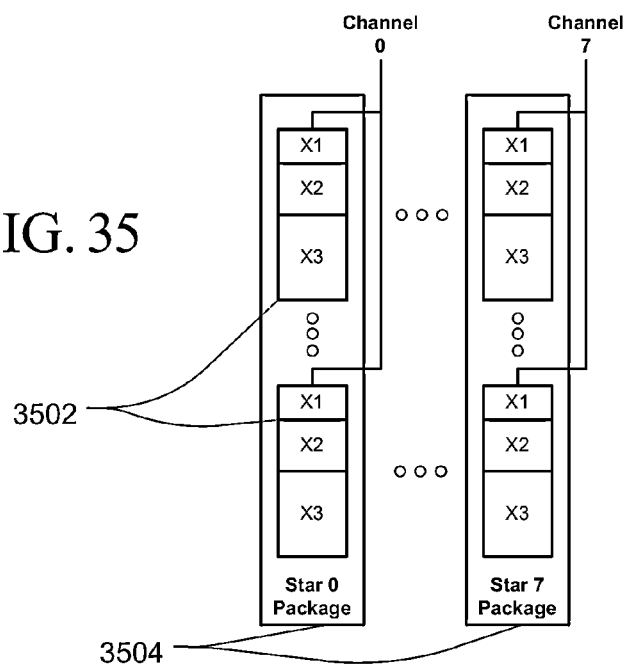
FIG. 35 is a block diagram showing an organization of triple-layer die in a multi-layer memory according one embodiment.

In a three layer solid state drive (SSD), also referred to as a Trio drive, there are multiple options for the physical organization of the three layers of storage into separate units managed by the Trio algorithm, and the organization of units into separate packages. As discussed above, a Trio die is a single eX3 die, which is managed as an independent region of physical storage by an instance of a STAR controller, and in which three fixed sets of blocks are configured for use as X1, X2 and X3 blocks. FIG. 35 shows flash memory configuration for a Trio drive with 8 STAR controller instances, with three layers of storage blocks in each Trio die 3502 and multiple Trio die in each of 8 packages 3504.

All Trio die 3502 in one package 3504 are connected to the same controller channel, and are managed by the same STAR controller, such as illustrated in FIG. 17A, in one embodiment. If a second bank of 8 packages 3504 is required in a higher capacity drive, they may be similarly connected to channels 0 to 7. The second bank of packages can be a capacity extension for STARs 0 to 7, or can be a set of independent STAR controller instances 8 to 15 (not shown).

Figure 36:
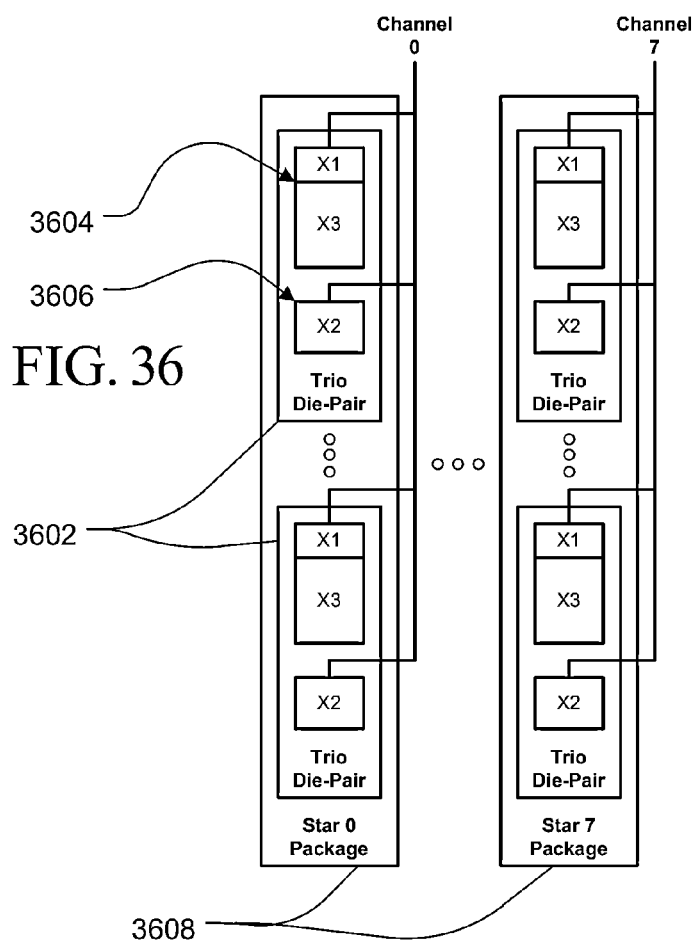
FIG. 36 is a block diagram showing an organization of jointly packaged die pairs in a multi-layer memory.

As illustrated in FIG. 36, the three layer structure may also be achieved using jointly packaged Trio die-pairs. A Trio die-pair 3602 is one eX2 die 3606 and one eX3 die 3604 forming a unit, which is managed as an independent region of physical storage by the STAR controller for the respective channel, and in which three fixed sets of blocks are configured for use as X1, X2 and X3 blocks. A drive with 8 STAR controller instances, with three layers of storage blocks in each Trio die-pair and multiple Trio die-pairs in each of 8 packages 3608 is illustrated in FIG. 36. Both die 3604, 3606 forming a Trio die-pair 3602 are within the same package 3608. All Trio die-pairs 3602 in one package 3608 are connected to the same controller channel, and are managed by the same STAR controller instance. If a second bank of 8 packages is required in a higher capacity drive, they should be similarly connected to channels 0 to 7. The second bank of packages can be a capacity extension for STAR controllers 0 to 7, or can be a set of independent STAR controllers 8 to 15.

Figure 37:
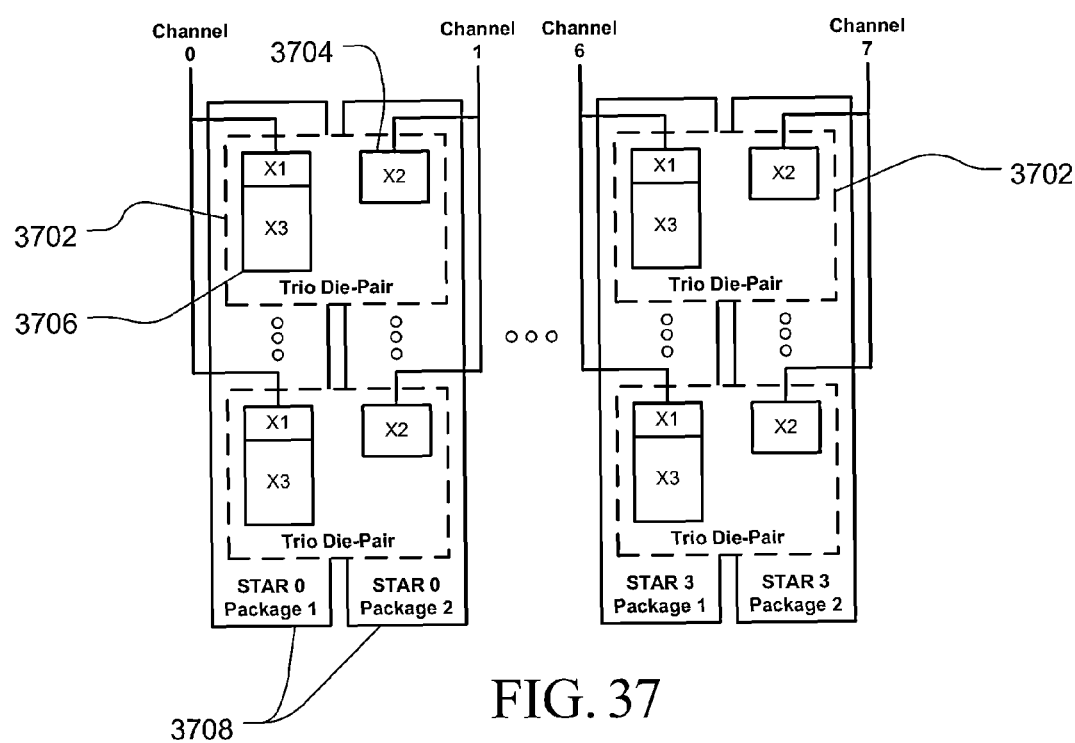
FIG. 37 is a block diagram showing an organization of separately packaged die pairs in a multi-layer memory.

As illustrated in FIG. 37, the three layer structure may also be achieved using separately packaged die-pairs. A Trio die-pair 3702 is one eX2 die 3704 and one eX3 die 3706 forming a unit, which is managed as an independent region of physical storage by the STAR controller, and in which three fixed sets of blocks are configured for use as X1, X2 and X3 blocks. The system in FIG. 37 shows a drive with 4 STARS, rather than the 8 assumed for the arrangements of FIGS. 35 and 36 above, with three layers of storage blocks in each Trio die-pair 3702 and each Trio die-pair spread over 2 packages 3708. The two die forming a Trio die-pair are in different packages 3708, and each package comprises only eX2 die or only eX3 die. All die in one package are connected to the same controller channel, and are managed by the same STAR controller. Each adjacent pair of packages is managed by the same STAR. If a second bank of 4 packages is required in a higher capacity drive, they should be similarly connected to channels 0 to 7. The second bank of packages can be a capacity extension for STAR controllers 0 to 3, or can be a set of independent STAR controllers 4 to 7.

A system and method have been disclosed for a multi-layer, multi-partition memory system. In one embodiment, a modified version of a STAR controller (which may be separate hardware controllers or multiple instances of software running on each of one or more hardware controllers) is designed to operate with three layers of storage in each die or die-pair having X1, X2 and X3 NAND flash blocks. A subset of the disclosed algorithms may also be used in a two layer drive. The overall three layer STAR algorithm described above, for example with respect to FIG. 17A, is used to manage a dedicated set of flash die in a solid state disk drive, such as die on a particular controller channel. Multiple instances of the three layer STAR algorithm will exist within an SSD system, each managing a separate set (channel) of flash memory die.

As disclosed above, the operations of the three layer STAR algorithm may be made up of four algorithms: 1) an asynchronous die algorithm; 2) a Trio algorithm; 3) a program scheduling algorithm; and 4) an address translation algorithm:

Asynchronous Die Algorithm

Data programming parallelism and write transactions throughout the system are managed in units of the maximum programming parallelism achievable within one die, which is typically 32 KB in a 2-plane die. Multiple die can operate fully in parallel when required, or can operate asynchronously with each performing unrelated operations.

The asynchronous die algorithm is designed to provide reduced latency for execution of host commands and improved performance with workloads having irregular I/O size or mixed read/write characteristics.

Based on status information received from the Trio algorithm, the asynchronous die algorithm may issue a host data write transaction from its front-end queue to any die that is ready to receive it. Availability is indicated by the depth of queues of host data write transactions issued to the NAND Driver. Transactions should be issued preferentially to those die with the shortest queues.

Trio Algorithm

The memory space in a Trio die is divided into three memory layers according to NAND block type (X1, X2 and X3), and also into two partitions according to data type (random and sequential).

Within the layer and partition structure of a Trio die, data from the host is written to layers 1 and 2. Maintenance programming operations may also be required in one or two of the memory layers in the die as a consequence of data being written from the host.

A sequence of predetermined program operations known as a program cycle causes a defined amount of host data to be programmed in write blocks in one layer of a die and predetermined consequential maintenance programming operations to be performed if necessary in one or two layers of the same die. During a program cycle, programming of host data and data for maintenance operations is interleaved at a steady rate, to create best uniformity of host response times and ensure that no host command can experience an unacceptably long response time under any rare combination of circumstances.

Maintenance operations create free blocks in a layer for reuse in writing new data to the layer, and may comprise moving a fixed amount of data from one layer to another or relocating data from one block to another within a layer. Maintenance is performed as foreground operations or background operations when the die is idle.

Program Scheduling Algorithm

The asynchronous die algorithm and Trio algorithm operate together within each STAR according to the program scheduling algorithm, to schedule program and copy transactions which are to be executed by the NAND Driver.

The Trio algorithm provides information to the asynchronous die algorithm to define when host data program transactions can be interleaved with the maintenance copy transactions being created by Trio. Host data program transactions are enabled when the ratio between the number of maintenance metapage copy transactions issued by the Trio algorithm and the number of host data program transactions issued within the current program cycle exceeds the required interleave ratios predetermined for the program cycle.

An outstanding read transaction for a die has absolute priority in the NAND Driver over any other transaction type for that die. Other outstanding transactions for a die are executed in the NAND Driver with relative priority of 1) program; 2) erase; and 3) copy.

Host data program transactions will be executed ahead of queued maintenance copy transactions already present in the NAND Driver.

Address Translation Algorithm

The address translation scheme used in the three layer STAR is as described above where host logical address space may be mapped contiguously to a separate storage device logical address space regardless of the host LBA associated with incoming data.

We claim:

1. A mass storage memory system, comprising:
an interface adapted to receive data from a host system;
a plurality of memory die, wherein the plurality of memory die are arranged in respective groups and each respective group is connected to a respective one of a plurality of control channels; and
a controller in communication with the interface and the plurality of memory die over the plurality of control channels, the controller configured to:
in response to receiving a first request from the host system, read or write data fully in parallel in a portion of the plurality of memory die connected to different ones of the plurality of control channels; and
in response to receiving a second request from the host system, read or write data independently and asynchronously with concurrent operations in different memory die in a same one of the plurality of control channels.

2. The mass storage memory system of claim 1, wherein the controller is configured to manage data writes in an amount equal to a maximum unit of programming for an individual one of the plurality of memory die.

3. The mass storage memory system of claim 2, wherein the controller is configured to select a memory die within which to write received data based on criteria independent of a host logical block address (LBA) of the received data.

4. The mass storage memory system of claim 3, wherein the criteria comprises a memory die having a shortest pending data write queue.

5. The mass storage memory system of claim 3, wherein at least one of the plurality of memory die comprises:
a plurality of layers, each layer having a plurality of memory blocks, wherein a first layer comprises a first bit-per-cell data capacity and a second layer comprises a second bit-per-cell capacity that is greater than the first bit-per-cell capacity; and
a plurality of partitions in each of the plurality of layers, wherein each programmed memory block in the plurality of memory blocks in a layer is exclusively classified as being in a respective one of the plurality of partitions.

6. The mass storage memory system of claim 5, wherein the controller is configured to identify a data type associated with received data from the host system and to select a memory die based on a number of outstanding transactions for the identified data type.

7. The mass storage memory system of claim 5, wherein the controller is configured to select a memory die which has a lowest logical fullness within which to write received data.

8. The mass storage memory system of claim 2, wherein the controller comprises a plurality of controllers and each of the plurality of controllers is only in communication with a respective different one of the plurality of control channels.

9. The mass storage memory system of claim 8, wherein each of the plurality of controllers is configured to manage data associated with a respective predetermined unique host logical block address (LBA) range.

10. The mass storage memory system of claim 9, wherein each of the plurality of controllers is configured to independently select a memory die connected to its respective control channel for writing received data independently of each other of the plurality of controllers.

11. A method of managing data comprising:
in a mass storage memory system having an interface adapted to receive data from a host system, a plurality of memory die arranged in respective groups where each respective group is connected to a respective one of a plurality of control channels, and a controller in communication with the interface and the plurality of memory die, the controller:
in response to receiving a first request from the host system, reading or writing data fully in parallel in a portion of the plurality of memory die over multiple control channels of the plurality of control channels; and
in response to receiving a second request from the host system, reading or writing data independently and asynchronously with concurrent operations in different memory die in a same one of the plurality of control channels.

12. The method of claim 11, further comprising the controller managing data writes in an amount equal to a maximum unit of programming for an individual one of the plurality of memory die.

13. The method of claim 11, further comprising the controller selecting a memory die within which to write received data based on criteria independent of a host logical block address (LBA) of the received data.

14. The method of claim 13, wherein the criteria comprises a memory die having a shortest pending data write queue.

15. The method of claim 13, wherein at least one of the plurality of memory die comprises:
a plurality of layers, each layer having a plurality of memory blocks, wherein a first layer comprises a first bit-per-cell data capacity and a second layer comprises a second bit-per-cell capacity that is greater than the first bit-per-cell capacity; and
a plurality of partitions in each of the plurality of layers, wherein each programmed memory block in the plurality of memory blocks in a layer is exclusively classified as being in a respective one of the plurality of partitions; and
wherein the controller interleaves copying of previously stored data between layers with writing of received host data.

16. The method claim 15, further comprising the controller:
identifying a data type associated with received data from the host system; and
selecting a memory die based on a number of outstanding transactions for the identified data type.

17. The method of claim 15, further comprising the controller selecting a die within which to write received data based on a lowest logical fullness in the plurality of memory die.

18. The method of claim 12, wherein the controller comprises a plurality of controllers, and each of the plurality of controllers is only in communication with a respective single one of the plurality of control channels, wherein the method further comprises:
receiving at each of the plurality of controllers only data associated with a respective predetermined unique host logical block address (LBA) range.

19. The method of claim 18, further comprising each of the plurality of controllers independently selecting a die connected to its respective control channel for writing received data independently of each other of the plurality of controllers.

20. A mass storage memory system, comprising:
an interface adapted to receive data from a host system;
a plurality of control channels;
a plurality of flash memory die, the plurality of flash memory die being divided into groups, wherein each group is connected to only a respective one of the plurality of control channels; and
a plurality of controllers, each of the plurality of controllers connected to a respective one of the plurality of control channels and in communication with the interface, wherein each respective controller is configured to:
write data independently and asynchronously with concurrent operations in each of the plurality of flash memory die on the respective one of the plurality of control channels connected to the respective controller; and
select, for a write operation, a die connected to its respective control channel independently of each other of the plurality of controllers.

* * * * *

UNITED STATES PATENT AND TRADEMARK OFFICE
CERTIFICATE OF CORRECTION

Page 1 of 1

PATENT NO. : 9,734,911 B2
APPLICATION NO. : 13/826848
DATED : August 15, 2017
INVENTOR(S) : Sinclair et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 434 days.

Signed and Sealed this
Sixth Day of February, 2018

Joseph Matal
*Performing the Functions and Duties of the*
*Under Secretary of Commerce for Intellectual Property and*
*Director of the United States Patent and Trademark Office*